United States Patent
Yahagi et al.

(10) Patent No.: US 10,606,174 B2
(45) Date of Patent: Mar. 31, 2020

(54) RESIST COMPOSITION AND METHOD OF FORMING RESIST PATTERN

(71) Applicant: TOKYO OHKA KOGYO CO., LTD., Kawasaki-shi (JP)

(72) Inventors: Masahito Yahagi, Kawasaki (JP); Hiroto Yamazaki, Kawasaki (JP); Kenta Suzuki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 16 days.

(21) Appl. No.: 15/877,764

(22) Filed: Jan. 23, 2018

(65) Prior Publication Data

US 2018/0210338 A1 Jul. 26, 2018

(30) Foreign Application Priority Data

Jan. 25, 2017 (JP) .................................. 2017-011707
Jan. 25, 2017 (JP) .................................. 2017-011712

(51) Int. Cl.
| | | |
|---|---|---|
| *G03F 7/038* | (2006.01) | |
| *G03F 7/32* | (2006.01) | |
| *G03F 7/004* | (2006.01) | |
| *G03F 7/039* | (2006.01) | |
| *G03F 7/30* | (2006.01) | |

(52) U.S. Cl.
CPC .......... *G03F 7/0381* (2013.01); *G03F 7/0045* (2013.01); *G03F 7/0382* (2013.01); *G03F 7/0397* (2013.01); *G03F 7/30* (2013.01); *G03F 7/32* (2013.01)

(58) Field of Classification Search
CPC .... G03F 7/0381; G03F 7/0382; G03F 7/0392; G03F 7/30; G03F 7/32
USPC .............................................. 430/270.1, 905
See application file for complete search history.

(56) References Cited

U.S. PATENT DOCUMENTS

| | | | | |
|---|---|---|---|---|
| 5,932,392 | A * | 8/1999 | Hirai ..................... | B41C 1/1008 430/270.1 |
| 6,106,993 | A * | 8/2000 | Watanabe ............... | G03F 7/039 430/270.1 |
| 6,136,502 | A * | 10/2000 | Satoshi ................... | G03F 7/039 430/270.1 |
| 6,485,883 | B2 * | 11/2002 | Kodama ............... | G03F 7/0045 430/170 |
| 2004/0110085 | A1 | 6/2004 | Iwai et al. | |
| 2013/0341304 | A1* | 12/2013 | Minegishi ............. | C08F 220/18 216/47 |
| 2015/0362836 | A1* | 12/2015 | Tsuchimura ......... | C07D 277/64 430/270.1 |
| 2016/0091790 | A1* | 3/2016 | Hori ......................... | G03F 7/40 430/326 |

FOREIGN PATENT DOCUMENTS

| | | |
|---|---|---|
| JP | A-2003-241385 | 8/2003 |
| JP | A-2007-084502 | 4/2007 |

* cited by examiner

*Primary Examiner* — John S Chu
(74) *Attorney, Agent, or Firm* — Knobbe, Martens, Olson & Bear LLP

(57) ABSTRACT

A resist composition including a polymeric compound having a structural unit derived from a compound represented by general formula (a0-1), an onium salt having an anion moiety with a specific structure, and a photodecomposable base which is decomposed upon exposure and then loses the ability of controlling of acid diffusion. In formula (a0-1), $Ra^{x0}$ represents a polymerizable group-containing group; $Wa^{x0}$ represents an aromatic hydrocarbon group having a valency of $(n_{ax0}+1)$, provided that $Ra^{x0}$ and $Wa^{x0}$ may together form a condensed ring structure; $n_{ax0}$ represents an integer of 1 to 3; $Ya^{x01}$ represents a carbonyl group or a single bond; $Ra^{x01}$ represents a hydrogen atom or a hydrocarbon group which may have a substituent.

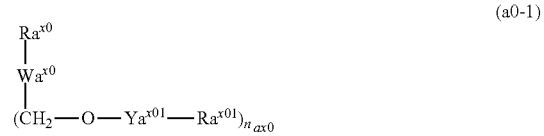

(a0-1)

16 Claims, No Drawings

RESIST COMPOSITION AND METHOD OF FORMING RESIST PATTERN

TECHNICAL FIELD

The present invention relates to a resist composition and a method of forming a resist pattern.

This application claims priority to Japanese Patent Application Nos. 2017-011707 and 2017-011712, both filed Jan. 25, 2017, the entire contents of which are incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If a resist film formed using such a resist composition is selectively exposed at the time of forming a resist pattern, in exposed areas, acid is generated from the acid generator component, and the polarity of the base resin increases by the action of the generated acid, thereby making the exposed areas of the resist film soluble in the alkali developing solution. Thus, by conducting alkali developing, the unexposed portions of the resist film remain to form a positive resist pattern (see, for example, Patent Literature 1).

Further, as a resist material, a chemically amplified resist composition a base component soluble in an alkali developing composition (alkali-soluble base component), an acid-generator component which generates acid upon exposure, and a cross-linking agent has also been conventionally used. In such chemically amplified resist composition, for example, when acid is generated from the acid-generator component upon exposure, by the action of the generated acid, cross-linking occurs between the alkali-soluble base component and the cross-linking component. As a result, the solubility of the chemically amplified resist composition in an alkali developing solution is decreased. Therefore, in the formation of a resist pattern, by applying such chemically amplified resist composition to a substrate to form a resist film, and selectively exposing the resist film, the exposed portions of the resist film becomes hardly soluble in an alkali developing solution, whereas the unexposed portions of the resist film remain soluble in an alkali developing solution. As a result, a negative resist pattern is formed (see, for example, Patent Literature 2).

DOCUMENTS OF RELATED ART

Patent Literature

[Patent Literature 1] Japanese Unexamined Patent Application, First Publication No. 2003-241385

[Patent Literature 2] Japanese Unexamined Patent Application, First Publication No. 2007-084502

SUMMARY OF THE INVENTION

As the lithography technique further progresses and the miniaturization of the resist pattern progresses more and more, for example, a target of the lithography performed by electron beams and EUV is to form fine resist patterns of several tens of nanometers. As miniaturization of resist pattern progress, improvement will be demanded for resist composition with respect to high resolution performance.

In the case where it is attempted to form a finer pattern using the above-mentioned positive chemically amplified resist composition, at exposed portions of the resist film, particularly in the thicknesswise direction, regions having a weak optical strength are generated. As a result, there was a problem that the resolution of the resist pattern is deteriorated.

In this regard, for forming a pattern with minute size, it is effective to use a method in which a chemically amplified resist composition containing an alkali-soluble base component, an acid-generator component and a cross-linking agent is used, and regions having weak optical strength are selectively dissolved and removed to form a resist pattern (negative-tone resist pattern). However, in the formation of a resist pattern using electron beam or the like as the exposure source, when the conventional chemically amplified resist composition containing a cross-linking component was used, it could not be said that the cross-linkability at exposed portions of the resist film was high, and hence, the resolution was unsatisfactory.

The present invention takes the above circumstances into consideration, with an object of providing a resist composition which exhibits improved resolution performance, particularly in lithography using electron beam or EUV, and a method of forming a resist pattern.

For solving the above-mentioned problems, the present invention employs the following aspects.

A first aspect of the present invention is a resist composition which generates acid upon exposure and exhibits changed solubility in a developing solution under action of acid, the resist composition including a polymeric compound (A1) including a structural unit derived from a compound represented by general formula (a0-1) shown below, an acid generator (B1) represented by general formula (b1) shown below, and a photodecomposable base (D1) which is decomposed upon exposure and then loses the ability of controlling of acid diffusion.

[Chemical Formula 1.]

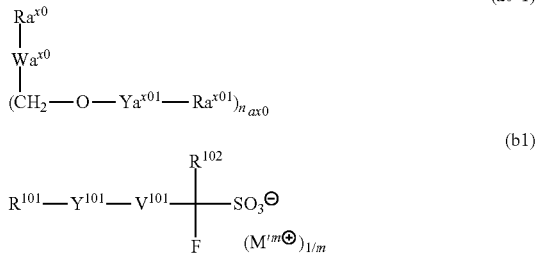

(a0-1)

(b1)

In formula (a0-1), $Ra^{x0}$ represents a polymerizable group-containing group; $Wa^{x0}$ represents an aromatic hydrocarbon group having a valency of ($n_{ax0}$+1), provided that $Ra^{x0}$ and $Wa^{x0}$ may together form a condensed ring structure; $n_{ax0}$ represents an integer of 1 to 3; $Ya^{x01}$ represents a carbonyl group or a single bond; $Ra^{x01}$ represents a hydrogen atom or a hydrocarbon group which may have a substituent; in formula (b1), $R^{101}$ represents a cyclic group which may have a substituent, a chain-like alkyl group which may have a substituent or a chain-like alkenyl group which may have a substituent; $R^{102}$ represents a fluorine atom or a fluorinated alkyl group having 1 to 5 carbon atoms; $Y^{101}$ represents a single bond or a divalent group containing an oxygen atom; $V^{101}$ represents an alkylene group, a fluorinated alkylene group or a single bond; m represents an integer of 1 or more, and $M'^{m-}$ represents an onium cation having a valency of m.

A second aspect of the present invention is a method of forming a resist pattern, including: using a resist composition according to the first aspect to form a resist film, exposing the resist film, and developing the exposed resist film to form a resist pattern.

A third aspect of the present invention is a resist composition which generates acid upon exposure and exhibits changed solubility in a developing solution under action of acid, the resist composition including a base component (A') which exhibits changed solubility in a developing solution under action of acid and a fluorine additive component (F') which exhibits decomposability to an alkali developing solution, the base component (A') including a polymeric compound (A1') including a structural unit derived from a compound represented by general formula (a0-1) shown below, and the fluorine additive component (F') including a fluorine resin component (F1') having a structural unit (f1') containing a base dissociable group.

[Chemical Formula 2.]

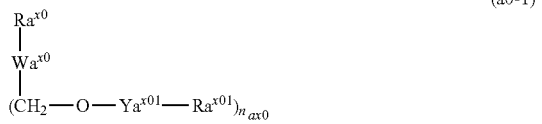

(a0-1)

In the formula, $Ra^{x0}$ represents a polymerizable group-containing group. $Wa^{x0}$ represents an aromatic hydrocarbon group having a valency of ($n_{ax0}$+1), provided that $Ra^{x0}$ and $Wa^{x0}$ may together form a condensed ring structure; $n_{ax0}$ represents an integer of 1 to 3; $Ya^{x01}$ represents a carbonyl group or a single bond; and $Ra^{x01}$ represents a hydrogen atom or a hydrocarbon group which may have a substituent.

A fourth aspect of the present invention is a method of forming a resist pattern, including: using a resist composition according to the third aspect to form a resist film, exposing the resist film, and developing the exposed resist film to form a resist pattern.

According to the resist composition of the present invention, resolution performance can be improved in lithography using electron beam or EUV.

By the method of forming a resist pattern according to the present invention, a resist pattern having a good shape can be formed with a high resolution.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The case of describing "may have a substituent" includes both of the case where the hydrogen atom (—H) is substituted with a monovalent group and the case where the methylene group (—CH$_2$—) is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha 0}$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) on the α-position of the aforementioned α-position of the aforementioned α-substituted acrylate ester can be mentioned.

A "structural unit derived from hydroxystyrene" refers to a structural unit that is formed by the cleavage of the ethylenic double bond of hydroxystyrene. A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

(First Aspect: Resist Composition)

The resist composition according to a first aspect of the present invention is a resist composition which generates acid upon exposure and exhibits changed solubility in a developing solution under action of acid.

As one embodiment of such resist composition, for example, a resist composition including a base component (A) (hereafter, sometimes referred to as "component (A)") which exhibits changed solubility in a developing solution under action of acid, an acid-generator component (B) (hereafter, sometimes referred to as "component (B)") which generates acid upon exposure, and a an acid diffusion control agent (hereafter, sometimes referred to as "component (D)") which controls the diffusion of the acid generated upon exposure may be mentioned.

In the resist composition according to the present embodiment, the component (A) includes a polymeric compound (A1) (hereafter, referred to as "component (A1)") including a structural unit derived from a compound represented by general formula (a0-1), the component (B) includes an acid generator (B1) (hereafter, referred to as "component (B1)") represented by general formula (b1), and the component (D) includes a photodecomposable base (D1) (hereafter, referred to as "component (D1)") which is decomposed upon exposure and then loses the ability of controlling of acid diffusion.

When a resist film is formed using the resist composition according to the present embodiment, and the resist film is selectively exposed, acid is generated from the component (B) at exposed portions of the resist film, and the solubility of the component (A) in a developing solution is changed by the action of the acid. On the other hand, at unexposed portions of the resist film, the solubility of the component (A) in a developing solution is unchanged. As a result, difference is generated between the exposed portions of the resist film and the unexposed portions of the resist film in terms of solubility in a developing solution. Therefore, by developing the resist film, the exposed portions of the resist film are dissolved and removed to form a positive-tone resist pattern in the case of a positive resist, whereas the unexposed portions of the resist film are dissolved and removed to form a negative-tone resist pattern in the case of a negative resist.

In the present specification, a resist composition which forms a positive resist pattern by dissolving and removing the exposed portions of the resist film is called a positive resist composition, and a resist composition which forms a negative resist pattern by dissolving and removing the unexposed portions of the resist film is called a negative resist composition.

The resist composition of the present embodiment may be either a positive resist composition or a negative resist composition. Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

The resist composition of the present embodiment has a function of generating acid upon exposure, and the component (A) may generate acid upon exposure, in addition to the component (B).

In the case where the component (A) generates acid upon exposure, the component (A) is a "base component which generates acid upon exposure and exhibits changed solubility in a developing solution under action of acid".

In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a copolymer having a structural unit which generates acid upon exposure may be mentioned. As the structural unit which generates acid upon exposure, any conventionally known structural unit may be used.

<Component (A)>

The component (A) is a base component which exhibits changed solubility in a developing solution under action of acid.

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymer" refers to a polymer having a molecular weight of 1,000 or more.

As the molecular weight of the polymer, the weight average molecular weight in terms of the polystyrene equivalent value determined by gel permeation chromatography (GPC) is used.

In the resist composition according to the present embodiment, as the component (A), at least a polymeric compound (A1) including a structural unit derived from a compound represented by general formula (a0-1) (hereafter, this structural unit is referred to as "structural unit (a0)") is used, and a polymeric compound and/or low molecular weight compound other than the component (A1) may be used in combination with the component (A1).

When a resist film is formed using a resist composition containing at least the component (A1), and the resist film is selectively exposed, acid is generated from the component (B1) at exposed portions. By the action of the generated acid, cross-linking occurs within the component (A1) through the structural unit (a0) having cross-linking ability. As a result, the solubility of the exposed portions of the resist film in an alkali developing solution is decreased (solubility in an organic developing solution is increased). Therefore, in the formation of a resist pattern, by applying the resist composition of the present embodiment to a substrate to form a resist film, and selectively exposing the resist film, the exposed portions of the resist film becomes hardly soluble in an alkali developing solution (becomes soluble in an organic developing solution), whereas the unexposed portions of the resist film remain soluble in an alkali developing solution (hardly soluble in an organic developing solution). As a result, a negative-tone resist pattern is formed by developing with an alkali developing solution. Alternatively, by developing with an organic developing solution, a positive-tone resist pattern is formed.

Component (A1)

The component (A1) is a polymeric compound having a structural unit derived from a compound represented by general formula (a0-1) (structural unit (a0)).

The component (A1) is preferably a copolymer having, in addition to the structural unit (a0), a structural unit (a10) containing in a side chain thereof an aromatic ring having a hydroxy group bonded thereto.

The component (A1) is preferably a copolymer having, in addition to the structural unit (a0), or in addition to the structural units (a0) and (a10), a structural unit (a11) containing in a side chain thereof an aromatic ring (excluding aromatic rings having a hydroxy group bonded thereto).

Further, the component (A1) may further include a structural unit other than the structural units (a0), (a10) and (a11).

<<Structural Unit (a0)>>

The structural unit (a0) is a structural unit derived from a compound represented by general formula (a0-1) shown below, and has a cross-linking ability.

[Chemical Formula 3.]

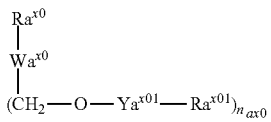

(a0-1)

In formula (a0-1), $Ra^{x0}$ represents a polymerizable group-containing group; $Wa^{x0}$ represents an aromatic hydrocarbon group having a valency of ($n_{ax0}$+1), provided that $Ra^{x0}$ and $Wa^{x0}$ may together form a condensed ring structure; $n_{ax0}$ represents an integer of 1 to 3; $Ya^{x01}$ represents a carbonyl group or a single bond; and $Ra^{x01}$ represents a hydrogen atom or a hydrocarbon group which may have a substituent.

In formula (a0-1), $Ra^{x0}$ represents a polymerizable group-containing group.

The "polymerizable group" for $Ra^{x0}$ refers to a group which renders the compound having the such group polymerizable by radical polymerization or the like, e.g., a group containing a multiple bond between carbon atoms, such as an ethylenic double bond.

Examples of the polymerizable group include a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, an fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group.

The polymerizable group-containing group may be a group constituted of only a polymerizable group, or a group constituted of a polymerizable group and a group other than a polymerizable group. Examples of the group other than a polymerizable group include a divalent hydrocarbon group which may have a substituent, and a divalent linking group containing a hetero atom.

Preferable example of $Ra^{x0}$ include a group represented by a chemical formula: $CH_2$=C(R)-$Ya^{x0}$-. In the chemical formula, R represents a hydrogen atom, an alkyl group of 1 to 5 carbon atoms or a halogenated alkyl group of 1 to 5 carbon atoms; and $Ya^{x0}$ represents a divalent linking group.

In the aforementioned chemical formula, as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable. As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the aforementioned chemical formula, the divalent linking group for $Ya^{x0}$ is not particularly limited, and preferable examples thereof include a divalent hydrocarbon group which may have a substituent and a divalent linking group containing a hetero atom.

Divalent Hydrocarbon Group which may have a Substituent:

In the case where $Ya^{x0}$ is a divalent linking group which may have a substituent, the hydrocarbon group may be either an aliphatic hydrocarbon group or an aromatic hydrocarbon group.

Aliphatic Hydrocarbon Group for $Ya^{x0}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and more preferably a methyl group, an ethyl group, a propyl group, an n-butyl group or a tert-butyl group.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and still more preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for Ya$^{x0}$

The aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Here, the number of carbon atoms within a substituent(s) is not included in the number of carbon atoms of the aromatic hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and more preferably a methyl group, an ethyl group, a propyl group, an n-butyl group or a tert-butyl group.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

In the case where Ya$^{x0}$ represents a divalent linking group containing a hetero atom, preferable examples of the linking group include —O—, —C(=O)—O—, —O—C(=O)—, —C(=O)—, —O—C(=O)—O—, —C(=O)—NH—, —NH—, —NH—C(=NH)— (may be substituted with a substituent such as an alkyl group, an acyl group or the like), —S—, —S(=O)$_2$—, —S(=O)$_2$—O—, and a group represented by general formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m' represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$—$Y^{22}$—, m" represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Among these examples, as $Ya^{x0}$, a single bond, an ester bond [—C(=O)—O—, —O—C(=O)—], an ether bond (—O—), a linear or branched alkylene group, or a combination of any of these groups is preferable, and a single bond or an ester bond [—C(=O)—O—, —O—C(=O)—] is more preferable.

In formula (a0-1), $Wa^{x0}$ represents an aromatic hydrocarbon group having a valency of ($n_{ax0}$+1).

Examples of the aromatic hydrocarbon group for $Wa^{x0}$ include a group obtained by removing ($n_{ax0}$+1) hydrogen atoms from an aromatic ring. The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Specific examples of the aromatic ring include an aromatic hydrocarbon ring, such as benzene, naphthalene, anthracene or phenanthrene; and an aromatic heterocyclic ring in which part of the carbon atoms constituting the aromatic hydrocarbon ring has been substituted with a heteroatom. Examples of the hetero atom within the aromatic hetero rings include an oxygen atom, a sulfur atom and a nitrogen atom. Specific examples of the aromatic hetero ring include a pyridine ring and a thiophene ring.

Further examples of the aromatic hydrocarbon group for $Wa^{x0}$ include a group in which ($n_{ax0}$+1) hydrogen atom(s) has been removed from an aromatic group containing 2 or more aromatic rings (e.g., biphenyl, fluorene, or the like).

$Ra^{x0}$ and $Wa^{x0}$ may together form a condensed ring structure.

In the case where $Ra^{x0}$ and $Wa^{x0}$ together form a condensed ring structure, the condensed ring structure contains the aromatic ring derived from $Wa^{x0}$. Further, the multiple bond between carbon atoms within the polymerizable group derived from $Ra^{x0}$ is cleaved, and forms the main chain of the component (A1). That is, part of the carbon atoms constituting the condensed ring constitutes the main chain of the component (A1).

In formula (a0-1), $n_{ax0}$ represents an integer of 1 to 3, and preferably 1 or 2.

In formula (a0-1), $Ya^{x01}$ represents a carbonyl group or a single bond, preferably a single bond.

In formula (a0-1), $Ra^{x01}$ represents a hydrogen atom or a hydrocarbon group which may have a substituent.

The hydrocarbon group for $Ra^{x01}$ may be an aliphatic hydrocarbon group or an aromatic hydrocarbon group. Examples of the hydrocarbon group for $Ra^{x01}$ include an alkyl group, a monovalent alicyclic hydrocarbon group, an aryl group and an aralkyl group.

The alkyl group for $Ra^{x01}$ preferably has 1 to 8 carbon atoms, more preferably 1 to 5 carbon atoms, and still more preferably 1 to 3 carbon atoms. The alkyl group may be linear or branched. Specifically, as the alkyl group, a methyl group, an ethyl group, a propyl group, a butyl group, a pentyl group, a hexyl group or an octyl group is preferable, and a methyl group, an ethyl group or a propyl group is more preferable, and a methyl group is most preferable.

The monovalent alicyclic hydrocarbon group for $Ra^{x01}$ preferably has 3 to 20 carbon atoms, and more preferably 3 to 12 carbon atoms. The monovalent alicyclic hydrocarbon group may be polycyclic or monocyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aryl group for $Ra^{x01}$ preferably has 6 to 18 carbon atoms, and more preferably 6 to 10 carbon atoms. Specifically, a phenyl group is particularly desirable.

As the aralkyl group for $Ra^{x01}$, an aralkyl group in which an alkylene group having 1 to 8 carbon atoms is bonded to the aforementioned "aryl group for $Ra^{x01}$" is preferable, an aralkyl group in which an alkylene group having 1 to 6 carbon atoms is bonded to the aforementioned "aryl group for $Ra^{x01}$" is more preferable, and an aralkyl group in which an alkylene group having 1 to 4 carbon atoms is bonded to the aforementioned "aryl group for $Ra^{x01}$" is most preferable.

Among these examples, as $Ra^{x01}$, a hydrogen atom or an aliphatic hydrocarbon group is preferable, a hydrogen atom or an alkyl group is more preferable, a hydrogen atom or an alkyl group having 1 to 5 carbon atoms is still more preferable, and a hydrogen atom or a methyl group is most preferable.

The hydrocarbon group for $Ra^{x01}$ may have a substituent. Examples of the substituent include a halogen atom, an oxo group (=O), a hydroxy group (—OH), an amino group (—NH$_2$) and —SO$_2$—NH$_2$. Further, part of the carbon atoms (methylene group(s)) constituting the hydrocarbon group for $Ra^{x01}$ may be substituted with a substituent containing a hetero atom. Examples of the substituent containing a hetero atom include —O—, —NH—, —N=, —C(=O)—O—, —S—, —S(=O)$_2$—, and —S(=O)$_2$—O—.

Specific examples of the structural unit (a0) include a structural unit represented by general formula (a0-u1) shown below.

[Chemical Formula 4.]

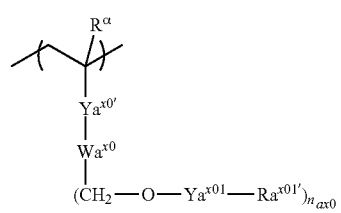

(a0-u1)

In the formula, $R^\alpha$ represents a hydrogen atom, a methyl group or a trifluoromethyl group; $Ya^{x0\prime}$ represents a single bond or a divalent linking group containing a hetero atom; $Wa^{x0}$ represents an aromatic hydrocarbon group having a valency of $(n_{ax0}+1)$; $n_{ax0}$ represents an integer of 1 to 3; $Ya^{x01}$ represents a carbonyl group or a single bond; and $Ra^{x01\prime}$ represents a hydrogen atom or an alkyl group of 1 to 5 carbon atoms.

In formula (a0-u1), $R^\alpha$ represents a hydrogen atom, a methyl group or a trifluoromethyl group. Among these, as $R^\alpha$, a hydrogen atom or a methyl group is preferable.

In formula (a0-u1), $Ya^{x0\prime}$ represents a single bond or a divalent linking group containing a hetero atom.

The divalent linking group containing a hetero atom for $Ya^{x0\prime}$ is the same as defined for the divalent linking group containing a hetero atom for $Ya^{x0}$. Among these, as $Ya^{x0\prime}$, a single bond or an ester bond [—C(=O)—O—, —O—C(=O)—] is preferable.

In formula (a0-u1), $Wa^{x0}$, $n_{ax0}$ and $Ya^{x01}$ are the same as defined for $Wa^{x0}$, $n_{ax0}$ and $Ya^{x01}$ in the aforementioned formula (a0-1), respectively.

In formula (a0-u1), $Ra^{x01\prime}$ represents a hydrogen atom or an alkyl group of 1 to 5 carbon atoms, preferably a hydrogen atom or a methyl group, and more preferably a hydrogen atom.

Preferable examples of structural units represented by general formula (a0-u1) include structural units represented by general formulae (a0-u1-1) to (a0-u1-9) shown below.

[Chemical Formula 5.]

(a0-u1-1)

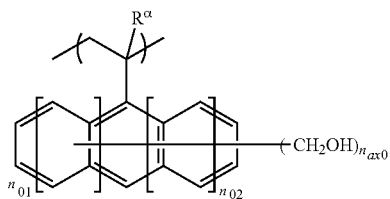

(a0-u1-2)

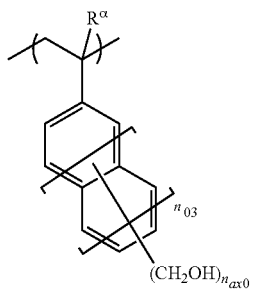

(a0-u1-3)

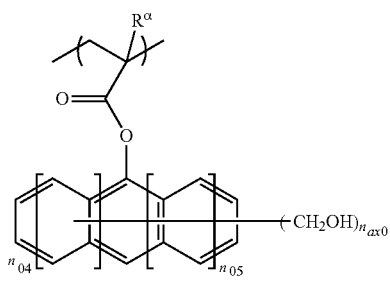

(a0-u1-4)

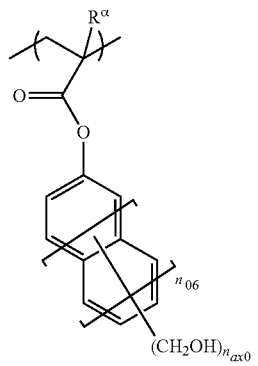

(a0-u1-5)

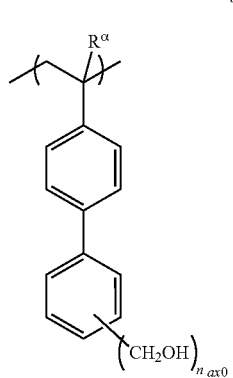

In the formula, $R^\alpha$ represents a hydrogen atom, a methyl group or a trifluoromethyl group; $n_{ax0}$ represents an integer of 1 to 3; $n_{o1}$, $n_{o2}$, $n_{o4}$ and $n_{o5}$ each independently represents 0 or 1; and $n_{o3}$ and $n_{o6}$ each independently represents 1 or 2.

[Chemical Formula 6.]

(a0-u1-6)

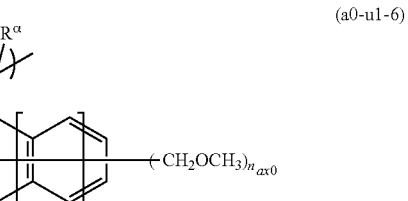

(a0-u1-7)

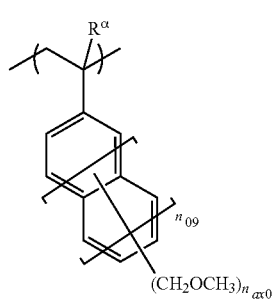

(a0-u1-8)

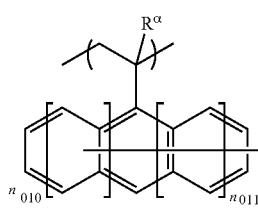

(a0-u1-9)

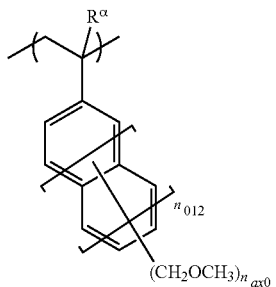

In the formula, $R^\alpha$ represents a hydrogen atom, a methyl group or a trifluoromethyl group; $n_{ax0}$ represents an integer of 1 to 3; $n_{o7}$, $n_{o8}$, $n_{o10}$ and $n_{o11}$ each independently represents 0 or 1; and $n_{o9}$ and $n_{o12}$ each independently represents 1 or 2.

Specific examples of the structural unit derived from a compound represented by general formula (a0-1) (structural unit (a0)) are shown below.

In the formulae shown below, $R^\alpha$ represents a hydrogen atom, a methyl group or a trifluoromethyl group.

[Chemical Formula 7.]

(a0-u1-11)

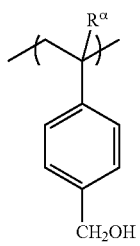

(a0-u1-12)

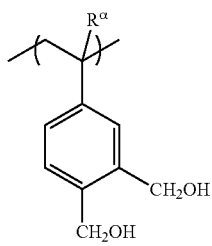

(a0-u1-13)

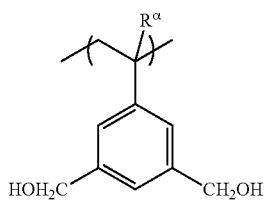

(a0-u1-14)

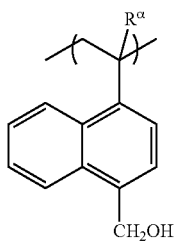

(a0-u1-15)

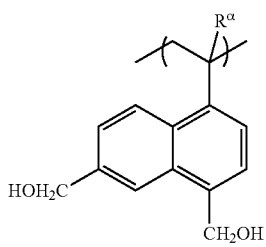

(a0-u1-16)

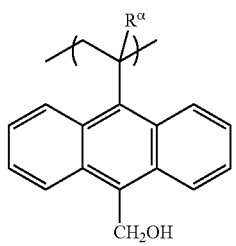

[Chemical Formula 8.]

(a0-u1-21)

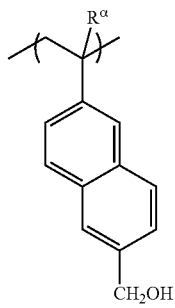

(a0-u1-22)

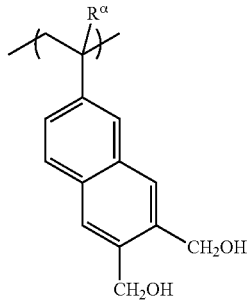

(a0-u1-23)

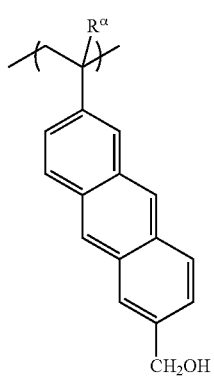

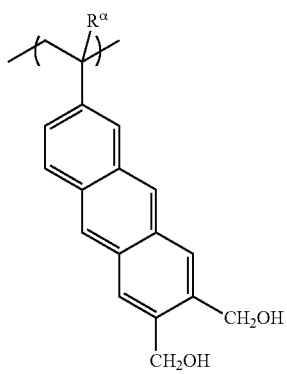
(a0-u1-24)
[Chemical Formula 9.]
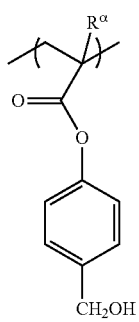
(a0-u1-31)
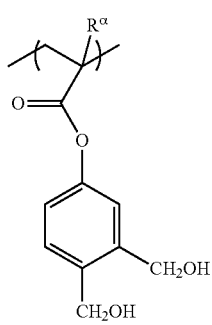
(a0-u1-32)
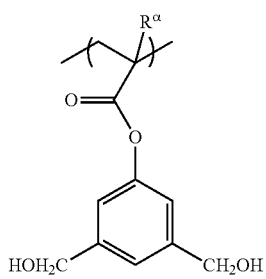
(a0-u1-33)
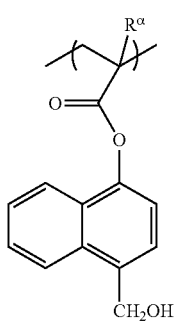
(a0-u1-34)
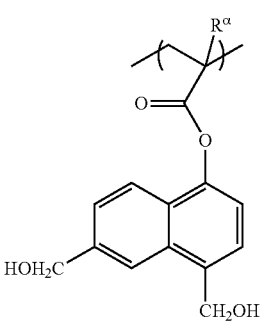
(a0-u1-35)
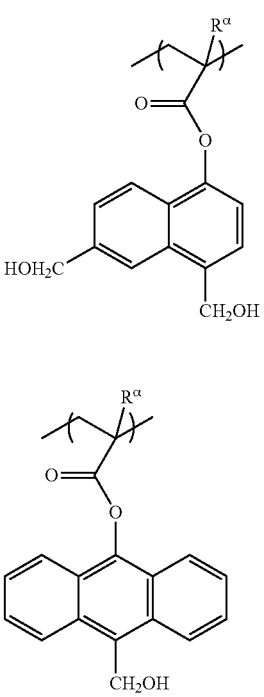
(a0-u1-36)
[Chemical Formula 10.]
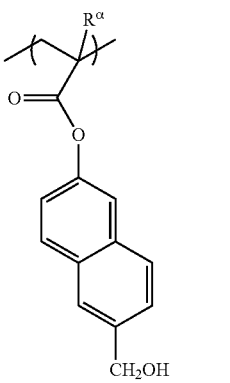
(a0-u1-41)
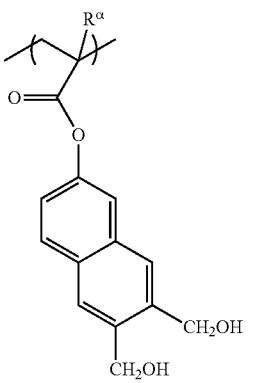
(a0-u1-42)

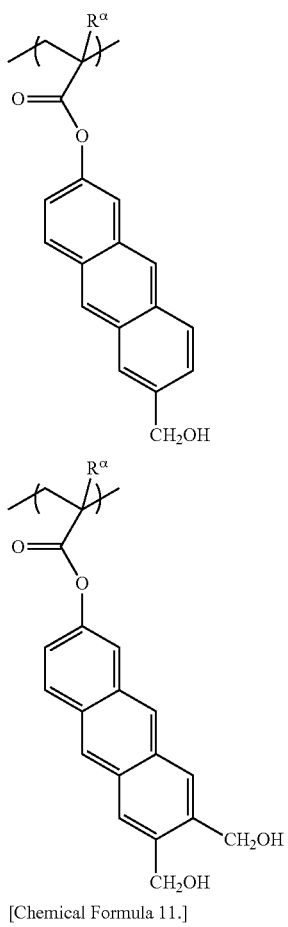

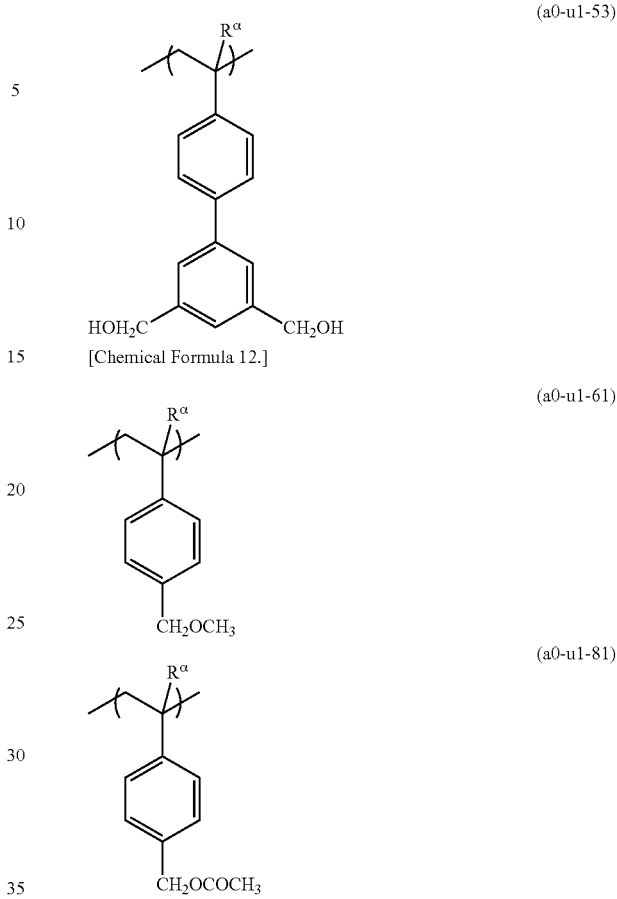

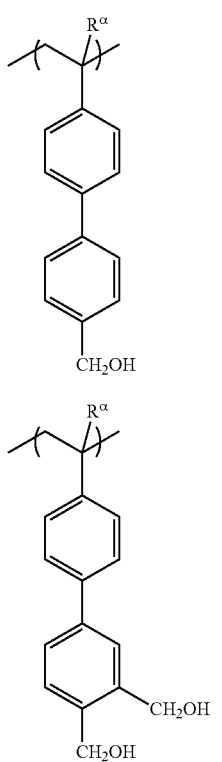

Further, as the structural unit (a0), a structural unit represented by general formula (a0-u1-10) shown below may also be given as a preferable example. Specific examples thereof are shown below. In the formula below, $n_{ax0}$ represents an integer of 1 to 3.

Among these examples, as the structural unit (a0), a structural unit represented by general formula (a0-u1-1), and structural units represented by general formulae (a0-u1-5) to (a0-u1-10) are preferable.

Among these, any of the structural units represented by chemical formulae (a0-u1-11) to (a0-u1-13), (a0-u1-51) to (a0-u1-53), (a0-u1-61), (a0-u1-81) or (a0-u1-101) is most preferable.

As the structural unit (a0) contained in the component (A1), 1 type of structural unit may be used, or 2 or more types may be used.

In the component (A1), the amount of the structural unit (a0) based on the combined total (100 mol %) of all structural units constituting the component (A1) is preferably 5 to 50 mol %, more preferably 10 to 40 mol %, and still more preferably 15 to 30 mol %.

When the amount of the structural unit (a0) is at least as large as the lower limit of the above-mentioned range, the resolution performance of the resist composition may be further improved. On the other hand, when the amount of the structural unit (a1) is no more than the upper limit of the above-mentioned range, a good balance may be reliably achieved with the other structural units.

<<Structural Unit (a10)>>

The component (A1) is preferably a copolymer having, in addition to the structural unit (a0), a structural unit (a10) containing in a side chain thereof an aromatic ring having a hydroxy group bonded thereto.

As the compound containing in a side chain thereof an aromatic ring having a hydroxy group bonded thereto, a compound represented by general formula (a10-1) shown below may be given as a preferable example.

[Chemical Formula 4.]

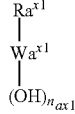

(a10-1)

In formula (a10-1), $Ra^{x1}$ represents a polymerizable group-containing group; $Wa^{x1}$ represents an aromatic hydrocarbon group having a valency of $(n_{ax1}+1)$; provided that $Ra^{x1}$ and $Wa^{x1}$ may together form a condensed ring structure; and $n_{ax1}$ represents an integer of 1 to 3.

In formula (a10-1), $Ra^{x1}$ represents a polymerizable group-containing group, and is the same as defined for $Ra^{x0}$ in the aforementioned general formula (a0-1).

In formula (a10-1), $Wa^{x1}$ represents an aromatic hydrocarbon group having a valency of $(n_{ax1}+1)$, and is the same as defined for $Wa^{x0}$ in the aforementioned general formula (a0-1).

$Ra^{x1}$ and $Wa^{x1}$ may together form a condensed ring structure.

In the case where $Ra^{x1}$ and $Wa^{x1}$ together form a condensed ring structure, the condensed ring structure contains the aromatic ring derived from $Wa^{x1}$. Further, the multiple bond between carbon atoms within the polymerizable group derived from $Ra^{x1}$ is cleaved, and forms the main chain of the component (A1). That is, part of the carbon atoms constituting the condensed ring constitutes the main chain of the component (A1).

In formula (a10-1), $n_{ax1}$ represents an integer of 1 to 3, and preferably 1 or 2.

Specific examples of the structural unit (a10) include a structural unit represented by general formula (a10-u1) shown below.

[Chemical Formula 15.]

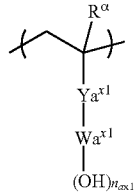

(a10-u1)

In the formula, $R^{\alpha}$ represents a hydrogen atom, a methyl group or a trifluoromethyl group; $Ya^{x1}$ represents a single bond or a divalent linking group containing a hetero atom; $Wa^{x1}$ represents an aromatic hydrocarbon group having a valency of $(n_{ax1}+1)$; and $n_{ax1}$ represents an integer of 1 to 3.

In formula (a10-u1), $R^{\alpha}$ represents a hydrogen atom, a methyl group or a trifluoromethyl group. Among these, as $R^{\alpha}$, a hydrogen atom or a methyl group is preferable.

In formula (a10-u1), $Ya^{x1}$ represents a single bond or a divalent linking group containing a hetero atom.

The divalent linking group containing a hetero atom for $Ya^{x1}$ is the same as defined for the divalent linking group containing a hetero atom for $Ya^{x0}$. Among these, as $Ya^{x1}$, a single bond or an ester bond [—C(=O)—O—, —O—C(=O)—] is preferable.

In formula (a10-u1), $Wa^{x1}$ represents an aromatic hydrocarbon group having a valency of $(n_{ax1}+1)$. Examples of the aromatic hydrocarbon group for $Wa^{x1}$ include a group in which $(n_{ax1}+1)$ hydrogen atoms have been removed from an aromatic ring. The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Specific examples of the aromatic ring include an aromatic hydrocarbon ring, such as benzene, naphthalene, anthracene or phenanthrene; and an aromatic heterocyclic ring in which part of the carbon atoms constituting the aromatic hydrocarbon ring has been substituted with a heteroatom. Examples of the hetero atom within the aromatic hetero rings include an oxygen atom, a sulfur atom and a nitrogen atom. Specific examples of the aromatic hetero ring include a pyridine ring and a thiophene ring.

Further examples of the aromatic hydrocarbon group for $Wa^{x1}$ include a group in which $(n_{ax1}+1)$ hydrogen atom(s) has been removed from an aromatic group containing 2 or more aromatic rings (e.g., biphenyl, fluorene, or the like).

In formula (a10-u1), $n_{ax1}$ represents an integer of 1 to 3, and preferably 1 or 2.

Preferable examples of structural units represented by general formula (a10-u1) include structural units represented by general formulae (a10-u1-1) to (a10-u1-4) shown below.

[Chemical Formula 16.]

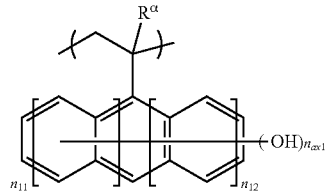

(a10-u1-1)

(a10-u1-2)

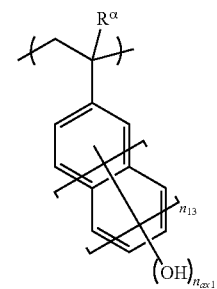

(a10-u1-3)

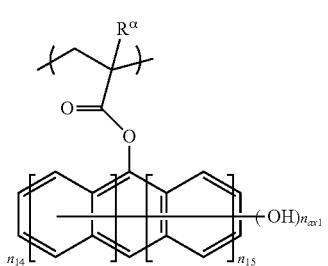

(a10-u1-4)

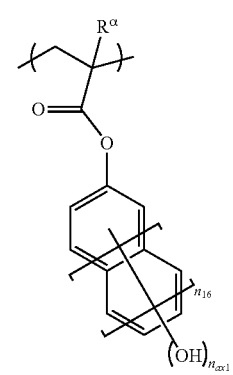

In the formula, $R^\alpha$ represents a hydrogen atom, a methyl group or a trifluoromethyl group; $n_{\alpha x1}$ represents an integer of 1 to 3; $n_{11}$, $n_{12}$, $n_{14}$ and $n_{15}$ each independently represents 0 or 1; and $n_{13}$ and $n_{16}$ each independently represents 1 or 2.

Specific examples of the structural unit derived from a compound represented by general formula (a10-1) (structural unit (a10)) are shown below.

In the formulae shown below, $R^\alpha$ represents a hydrogen atom, a methyl group or a trifluoromethyl group.

[Chemical Formula 17.]

(a10-u1-11)

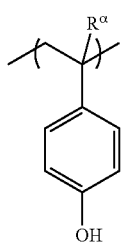

(a10-u1-12)

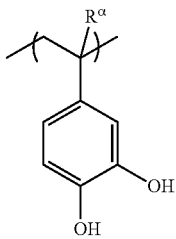

(a10-u1-13)

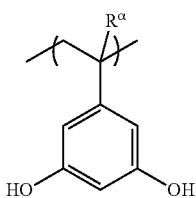

(a10-u1-14)

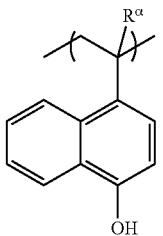

(a10-u1-15)

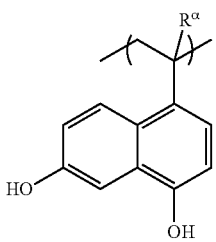

(a10-u1-16)

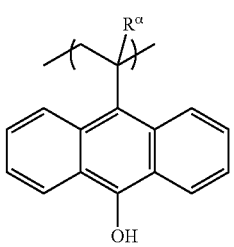

[Chemical Formula 18.]

(a10-u1-21)

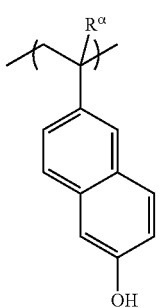

-continued
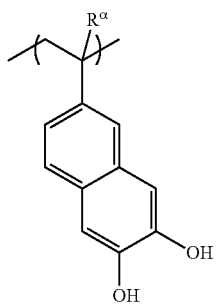
(a10-u1-22)
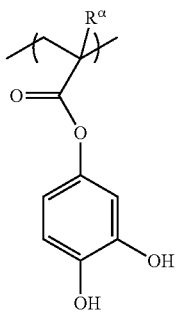
(a10-u1-32)
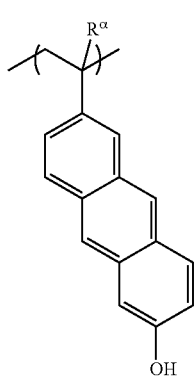
(a10-u1-23)
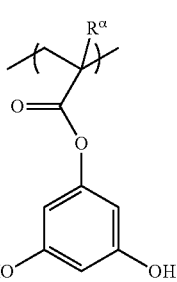
(a10-u1-33)
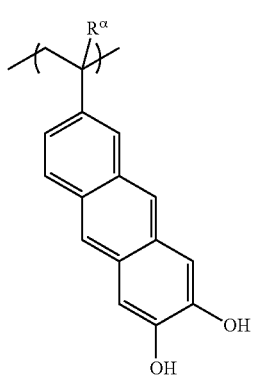
(a10-u1-24)
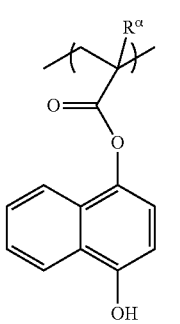
(a10-u1-34)
[Chemical Formula 19.]
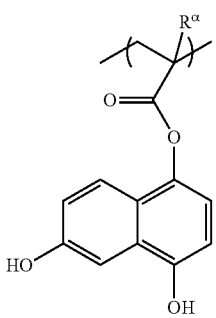
(a10-u1-35)
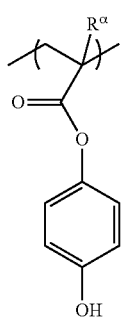
(a10-u1-31)
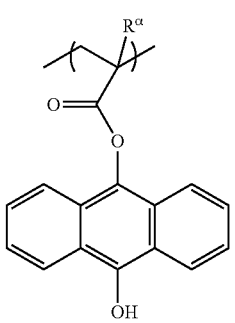
(a10-u1-36)

[Chemical Formula 20.]

(a10-u1-41)
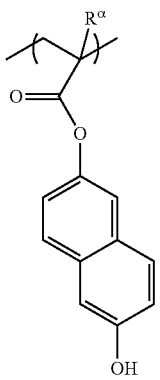

(a10-u1-42)
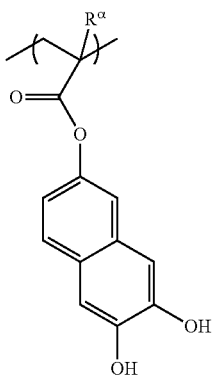

(a10-u1-43)
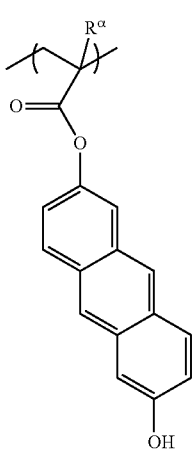

(a10-u1-44)
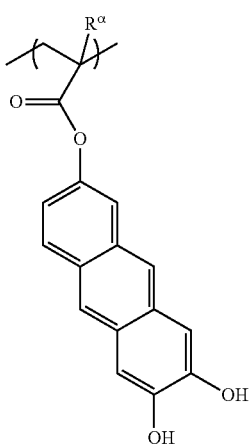

Among these examples, as the structural unit (a10), at least one member selected from the group consisting of structural units represented by any of general formulae (a10-u1-1) to (a10-u1-4) is preferable, and a structural unit represented by general formula (a10-u1-1) is more preferable.

Among these, as the structural unit (a10), a structural unit represented by any of the chemical formulae (a10-u1-11), (a10-u1-21), (a10-u1-31) or (a10-u1-41) is preferable.

As the structural unit (a10) contained in the component (A1), 1 kind of structural unit may be used, or 2 or more kinds of structural units may be used.

When the component (A1) includes the structural unit (a10), the amount of the structural unit (a10) based on the combined total of all structural units constituting the component (A1) (100 mol %) is preferably 50 to 90 mol %, more preferably 55 to 80 mol %, and still more preferably 60 to 70 mol %.

When the amount of the structural unit (a10) is at least as large as the lower limit of the above-mentioned range, the developing properties and the lithography properties may be further improved. On the other hand, when the amount of the structural unit (a10) is no more than the upper limit of the above-mentioned range, a good balance may be reliably achieved with the other structural units.

<<Structural Unit (a11)>>

The component (A1) is preferably a copolymer having, in addition to the structural unit (a0), or in addition to the structural units (a0) and (a10), a structural unit (a11) derived from a compound containing in a side chain thereof an aromatic ring (excluding aromatic rings having a hydroxy group bonded thereto).

As the compound containing in a side chain thereof an aromatic ring (excluding aromatic rings having a hydroxy group bonded thereto), a compound represented by general formula (a11-1) shown below may be given as a preferable example.

[Chemical Formula 21.]

(a11-1)
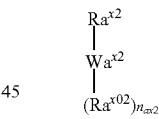

In formula (a11-1), $Ra^{x2}$ represents a polymerizable group-containing group; $Wa^{x2}$ represents an aromatic hydrocarbon group having a valency of $(n_{ax2}+1)$; provided that $Ra^{x2}$ and $Wa^{x2}$ may together form a condensed ring structure; $Ra^{x02}$ represents a substituent which substitutes a hydrogen atom constituting $Wa^{x2}$ (aromatic hydrocarbon group); $n_{ax2}$ represents an integer of 0 to 3; and when 2 or more $n_{ax2}$ groups are present, the plurality of $Ra^{x02}$ groups may be mutually bonded to form a ring structure.

In formula (a11-1), $Ra^{x2}$ represents a polymerizable group-containing group, and is the same as defined for $Ra^{x0}$ in the aforementioned general formula (a0-1).

In formula (a11-1), $Wa^{x2}$ represents an aromatic hydrocarbon group having a valency of $(n_{ax2}+1)$, and is the same as defined for $Wa^{x0}$ in the aforementioned general formula (a0-1).

$Ra^{x2}$ and $Wa^{x2}$ may together form a condensed ring structure.

In the case where $Ra^{x2}$ and $Wa^{x2}$ together form a condensed ring structure, the condensed ring structure contains the aromatic ring derived from $Wa^{x2}$. Further, the multiple bond between carbon atoms within the polymerizable group derived from $Ra^{x2}$ is cleaved, and forms the main chain of the component (A1). That is, part of the carbon atoms constituting the condensed ring constitutes the main chain of the component (A1).

In formula (a11-1), $Ra^{x02}$ represents a substituent which substitutes a hydrogen atom constituting $Wa^{x2}$ (aromatic hydrocarbon group).

Examples of the substituent represented by $Ra^{x02}$ include an alkyl group, an alkoxy group and acyloxy group.

The alkyl group as the substituent represented by $Ra^{x02}$ is preferably an alkyl group of 1 to 5 carbon atoms, and more preferably a methyl group, an ethyl group, a propyl group, an n-butyl group or a tert-butyl group.

The alkoxy group as the substituent represented by $Ra^{x02}$ is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The acyloxy group as the substituent for $Ra^{x02}$ preferably has 2 to 6 carbon atoms, more preferably $CH_3C(=O)-O-$ (acetoxy group) and $C_2H_5C(=O)-O-$, and most preferably $CH_3C(=O)-O-$ (acetoxy group).

In formula (a11-1), $n_{ax2}$ represents an integer of 0 to 3, more preferably 0, 1 or 2, and still more preferably 0 or 1.

When 2 or more $n_{ax2}$ groups are present, the plurality of $Ra^{x02}$ groups may be mutually bonded to form a ring structure. The ring structure formed may be either a hydrocarbon ring or a hetero ring. For example, two $Ra^{x02}$ groups bonded to the same aromatic ring of $Wa^{x2}$ may form a ring structure together with one side (carbon-carbon bond) of the aromatic ring ($Wa^{x2}$) to which the two $Ra^{x02}$ groups are bonded.

Preferable examples of the structural unit (a11) include structural units represented by any of general formulae (a11-u1-1) to (a11-u1-6) shown below.

[Chemical Formula 22.]

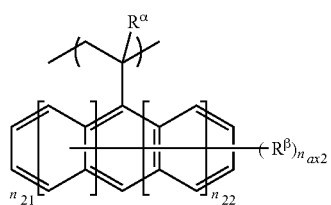
(a11-u1-1)

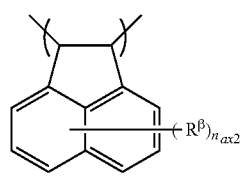
(a11-u1-2)

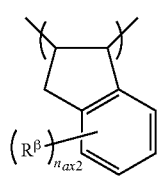
(a11-u1-3)

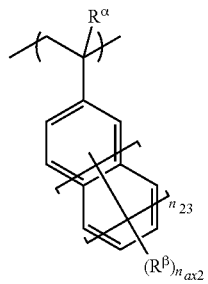
(a11-u1-4)

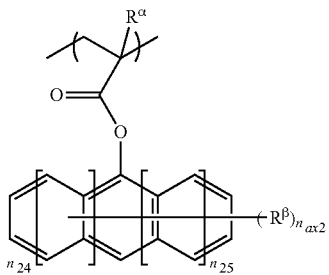
(a11-u1-5)

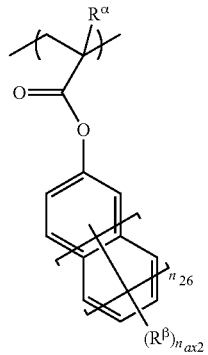
(a11-u1-6)

In the formula, $R^\alpha$ represents a hydrogen atom, a methyl group or a trifluoromethyl group; $R^\beta$ represents an alkyl group, an alkoxy group or an acyloxy group; $n_{ax2}$ represents an integer of 0 to 3; when 2 or more $n_{ax2}$ groups are present, the plurality of $R^\beta$ groups may be mutually bonded to form a ring structure; $n_{21}$, $n_{22}$, $n_{24}$ and $n_{25}$ each independently represents 0 or 1; and $n_{23}$ and $n_{26}$ each independently represents 1 or 2.

In formulae (a11-u1-1) to (a11-u1-6), the alkyl group, the alkoxy group and the acyloxy group for $R^\beta$ are the same as defined for the alkyl group, the alkoxy group and the acyloxy group for $Ra^{x02}$ in the aforementioned formula (a11-1).

Specific examples of the structural unit derived from a compound represented by general formula (a11-1) (structural unit (a11)) are shown below.

In the formulae shown below, $R^\alpha$ represents a hydrogen atom, a methyl group or a trifluoromethyl group.

[Chemical Formula 23.]
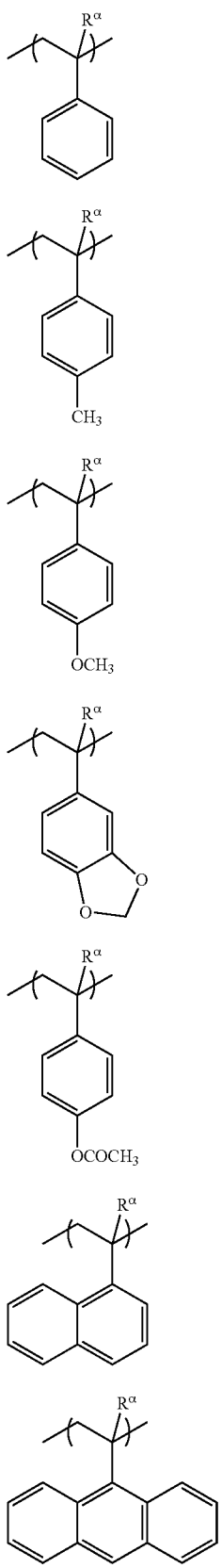
(a11-u1-11)
(a11-u1-12)
(a11-u1-13)
(a11-u1-14)
(a11-u1-15)
(a11-u1-16)
(a11-u1-17)
[Chemical Formula 24.]
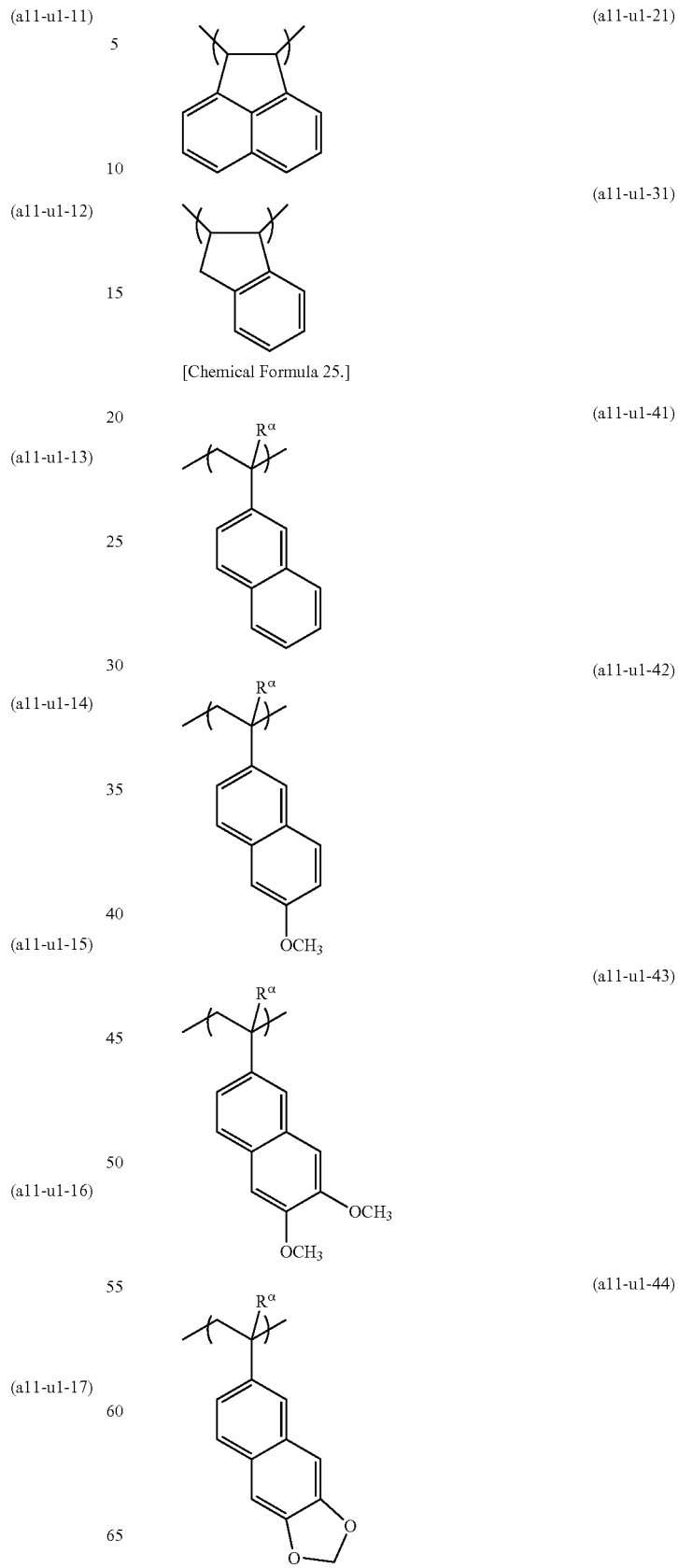
(a11-u1-21)
(a11-u1-31)
[Chemical Formula 25.]
(a11-u1-41)
(a11-u1-42)
(a11-u1-43)
(a11-u1-44)

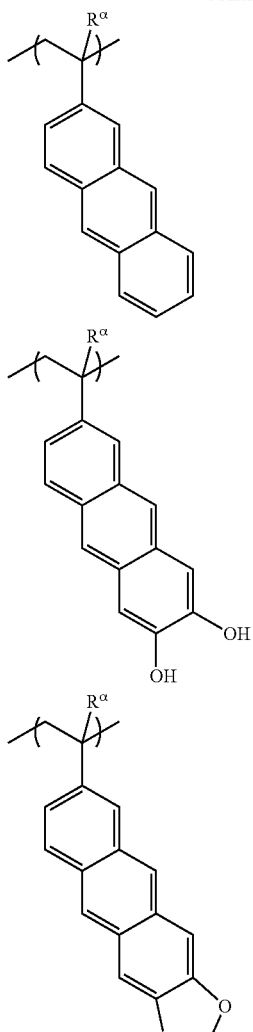
[Chemical Formula 26.]
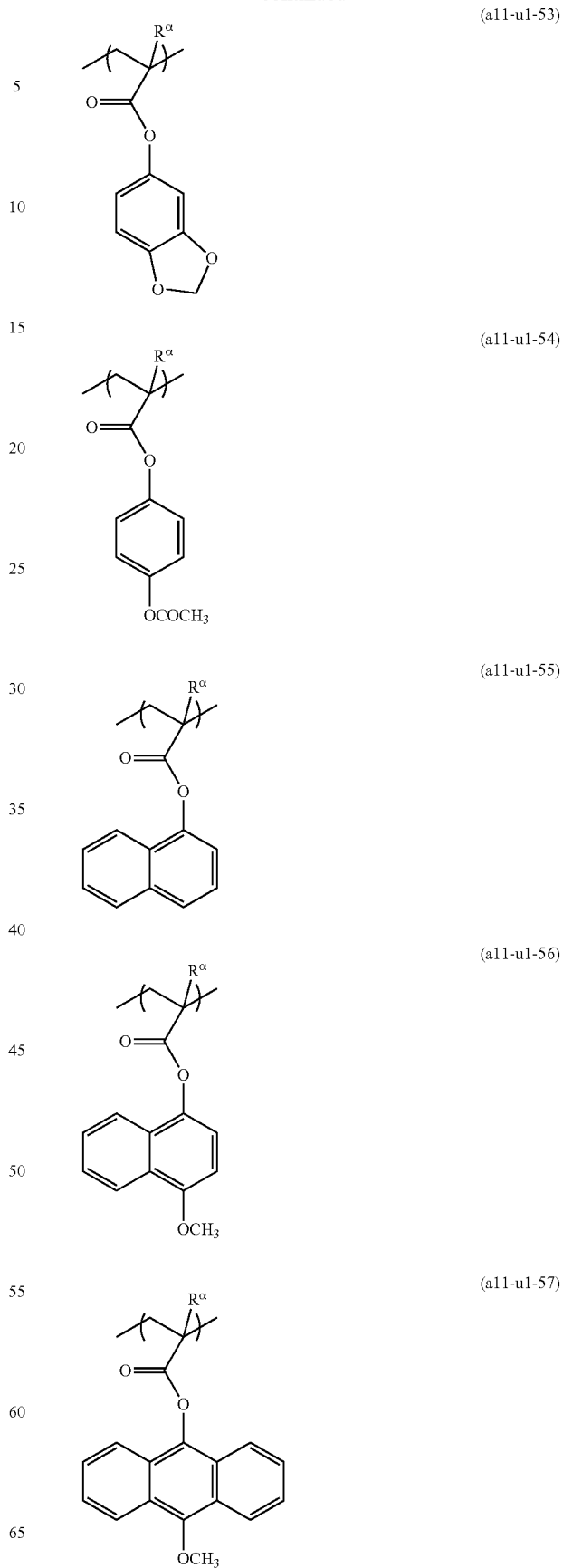

-continued
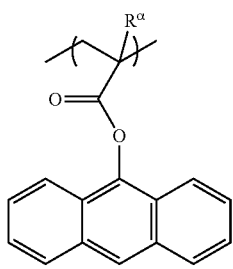 (a11-u1-58)
[Chemical Formula 27.]
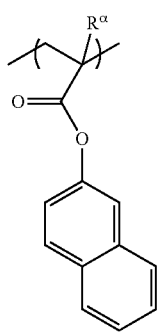 (a11-u1-61)
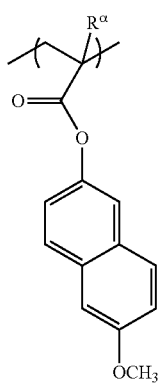 (a11-u1-62)
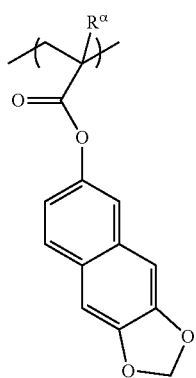 (a11-u1-63)
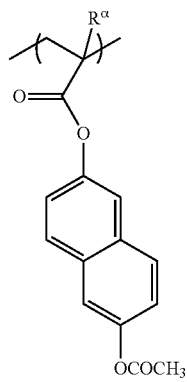 (a11-u1-64)
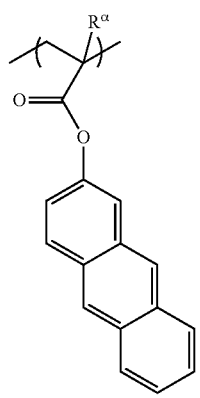 (a11-u1-65)
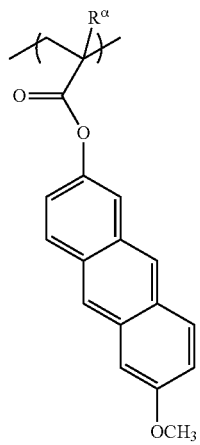 (a11-u1-66)
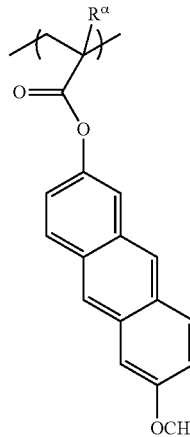 (a11-u1-67)

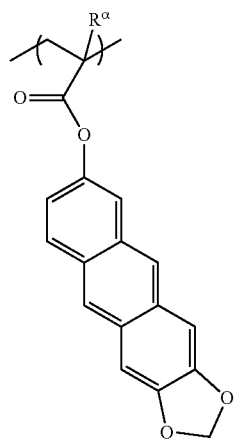

(a11-u1-68)

Among these examples, as the structural unit (a11), at least one member selected from the group consisting of structural units represented by any of general formulae (a11-u1-1) to (a11-u1-3) is preferable, and a structural unit represented by general formula (a11-u1-1) is more preferable.

Among these, as the structural unit (a11), a structural unit represented by any of the chemical formulae (a11-u1-11), (a11-u1-21) or (a11-u1-31) is preferable.

As the structural unit (a11) contained in the component (A1), 1 kind of structural unit may be used, or 2 or more kinds of structural units may be used.

When the component (A1) includes the structural unit (a11), the amount of the structural unit (a11) based on the combined total of all structural units constituting the component (A1) (100 mol %) is preferably 5 to 40 mol %, more preferably 10 to 35 mol %, and still more preferably 10 to 30 mol %.

When the amount of the structural unit (a11) is at least as large as the lower limit of the above-mentioned range, the etching resistance and the lithography properties may be further improved. On the other hand, when the amount of the structural unit (a11) is no more than the upper limit of the above-mentioned range, a good balance may be reliably achieved with the other structural units.

<<Other Structural Units>>

The component (A1) may further include a structural unit other than the structural units (a0), (a10) and (a11).

Examples of compounds which derive such other structural units include monocarboxylic acids, such as acrylic acid, methacrylic acid and protonic acid; dicarboxylic acids, such as maleic acid, numeric acid and itaconic acid; methacrylic acid derivatives having a carboxy group and an ester bond, such as 2-methacryloyloxyethyl succinate, 2-methacryloyloxyethyl maleate, 2-methacryloyloxyethyl phthalate, 2-methacryloyloxyethyl hexahydrophthalate; (meth)acrylate alkylesters, such as methyl (meth)acrylate, ethyl (meth)acrylate and butyl (meth)acrylate; (meth)acrylate hydroxyalkylesters, such as 2-hydroxyethyl (meth)acrylate and 2-hydroxypropyl (meth)acrylate; (meth)acrylate arylesters, such as phenyl (meth)acrylate and benzyl (meth)acrylate; dicarboxylic acid diesters, such as diethyl maleate and dibutyl fumarate; vinyl group-containing aliphatic compounds, such as vinyl acetate; conjugated diolefins, such as butadiene and isoprene; nitrile group-containing polymerizable compounds, such as acrylonitrile and methacrylonitrile; chorine-containing polymerizable compounds, such as vinyl chloride and vinylidene chloride; amide-bond containing polymerizable compounds, such as acrylamide and methacrylamide; and epoxy group-containing polymerizable compounds.

In the resist composition of the first aspect, the component (A) contains a polymeric compound (A1) (component (A1)) having a structural unit (a0).

Preferable examples of the component (A1) include a polymeric compound having at least the structural unit (a0) and the structural unit (a10). Specific examples of polymeric compounds preferable as the component (A1) include a polymeric compound having repeating structures of the structural units (a0) and (a10), and a polymeric compound having repeating structures of the structural units (a0), (a10) and (a11).

The weight average molecular weight (Mw) (the polystyrene equivalent value determined by gel permeation chromatography (GPC)) of the component (A1) is not particularly limited, but is preferably 500 to 50,000, more preferably 1,000 to 30,000, and still more preferably 2,000 to 20,000.

When the Mw of the component (A1) is no more than the upper limit of the above-mentioned range, the resist composition exhibits a satisfactory solubility in a resist solvent. On the other hand, when the Mw of the component (A1) is at least as large as the lower limit of the above-mentioned range, dry etching resistance and the cross-sectional shape of the resist pattern becomes satisfactory.

The dispersity (Mw/Mn) of the component (A1) is not particularly limited, but is preferably 1.0 to 4.0, more preferably 1.0 to 3.0, and most preferably 1.5 to 2.5. Here, Mn is the number average molecular weight.

In the resist composition of the first aspect, as the component (A), one kind of compound may be used, or two or more kinds of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, a resist pattern with improved lithography properties such as improvement in sensitivity, resolution and roughness may be reliably formed. Such effects are significant in lithography using electron beam or EUV.

The component (A1) can be produced, for example, by dissolving the monomers corresponding with each of the structural units in a polymerization solvent, followed by addition of a radical polymerization initiator such as azobisisobutyronitrile (AIBN) or dimethyl-2,2'-azobisisoutyrate (e.g., V-601). Furthermore, in the component (F), by using a chain transfer agent such as HS—$CH_2$—$CH_2$—$CH_2$—C($CF_3$)$_2$—OH, a —C($CF_3$)$_2$—OH group can be introduced at the terminals of the component (F). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the resist composition of the first aspect, as the component (A), one kind of compound may be used, or two or more kinds of compounds may be used in combination.

In the resist composition of the first aspect, the amount of the component (A) may be appropriately adjusted depending on the thickness of the resist film to be formed, and the like.

<Component (B)>

The component (B) is an acid generator component which generates acid upon exposure.

Component (B1)

In the resist composition of the first aspect, the component (B) contains an acid generator (B1) (component (B1)) represented by general formula (b1).

[Chemical Formula 28.]

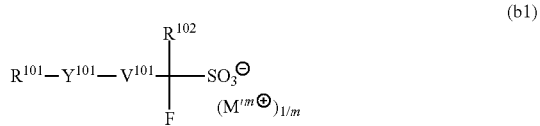

(b1)

In formula (b1), $R^{101}$ represents a cyclic group which may have a substituent, a chain-like alkyl group which may have a substituent or a chain-like alkenyl group which may have a substituent; $R^{102}$ represents a fluorine atom or a fluorinated alkyl group having 1 to 5 carbon atoms; $Y^{101}$ represents a single bond or a divalent group containing an oxygen atom; $V^{101}$ represents an alkylene group, a fluorinated alkylene group or a single bond; m represents an integer of 1 or more, and $M'^{m+}$ represents an onium cation having a valency of m.

Anion Moiety ($R^{101}$—$Y^{101}$—$V^{101}$—$CF(R^{102})$—$SO_3$

In formula (b1), $R^{101}$ represents a cyclic group which may have a substituent, a chain-like alkyl group which may have a substituent or a chain-like alkenyl group which may have a substituent.

Cyclic Group which may have a Substituent:

The cyclic group is preferably a cyclic hydrocarbon group, and the cyclic hydrocarbon group may be either an aromatic hydrocarbon group or an aliphatic hydrocarbon group. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Specific examples of the aromatic ring contained in the aromatic hydrocarbon group for $R^{101}$ include benzene, fluorene, naphthalene, anthracene, phenanthrene, biphenyl, or an aromatic hetero ring in which part of the carbon atoms constituting any one of these aromatic rings have been substituted with a hetero atom. Examples of the hetero atom within the aromatic hetero rings include an oxygen atom, a sulfur atom and a nitrogen atom.

Specific examples of the aromatic hydrocarbon group for $R^{101}$ include a group in which one hydrogen atom has been removed from the aforementioned aromatic ring (aryl group: e.g., a phenyl group or a naphthyl group), and a group in which one hydrogen atom of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for $R^{101}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclododecane, and a polycycloalkane having a condensed ring polycyclic skeleton, such as a cyclic group having a steroid skeleton are preferable.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for $R^{101}$ may contain a hetero atom such as a heterocycle. As the cyclic hydrocarbon group for $R^{101}$, specific examples include lactone-containing cyclic groups represented by the aforementioned general formulae (a2-r-1) to (a2-r-7), the —$SO_2$— containing cyclic group represented by the aforementioned formulae (a5-r-1) to (a5-r-4), and other heterocyclic groups represented by chemical formulae (r-hr-1) to (r-hr-16) shown below.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

[Chemical Formula 29.]

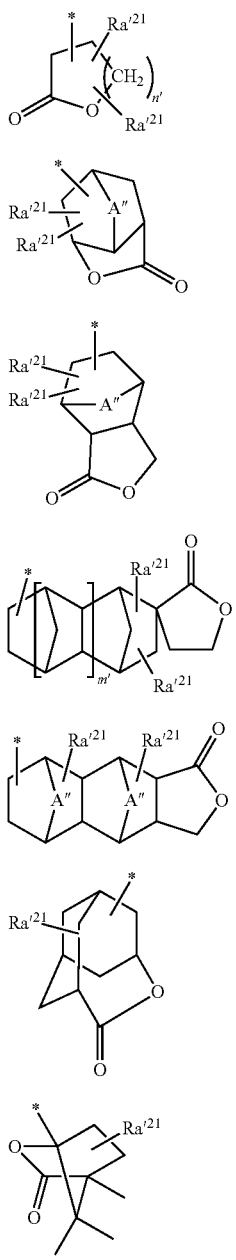

In the formulae, each $Ra'^{21}$ independently represents an alkyl group, an alkoxy group, a halogen atom, a halogenated alkyl group, —COOR", —OC(=O)R", a hydroxyalkyl group or a cyano group; R" represents a hydrogen atom, an alkyl group, a lactone-containing cyclic group or an —SO$_2$— containing cyclic group; A" represents an oxygen atom, a sulfur atom, or an alkylene group of 1 to 5 carbon atoms which may contain an oxygen atom or a sulfur atom; n' represents an integer of 0 to 2; and m' represents 0 or 1.

In formulae (a2-r-1) to (a2-r-7), the alkyl group for $Ra'^{21}$ is preferably an alkyl group of 1 to 6 carbon atoms. The alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is most preferable.

The alkoxy group for $Ra'^{21}$ is preferably an alkoxy group of 1 to 6 carbon atoms.

The alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable. Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{21}$, R" represents a hydrogen atom, an alkyl group, a lactone-containing cyclic group or an —SO$_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing cyclic group for R" include groups represented by the aforementioned general formulae (a2-r-1) to (a2-r-7).

The —SO$_2$— containing cyclic group for R" is the same as defined for the —SO$_2$— containing cyclic group described later. Specific examples of the —SO$_2$— containing cyclic group include groups represented by general formulae (a5-r-1) to (a5-r-4).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In formulae (a2-r-2), (a2-r-3) and (a2-r-5), as the alkylene group of 1 to 5 carbon atoms represented by A″, a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, and —CH$_2$—S—CH$_2$—.

As A″, an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a2-r-1) to (a2-r-7) are shown below.

[Chemical Formula 30.]

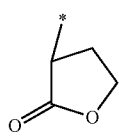 (r-lc-1-1)

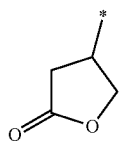 (r-lc-1-2)

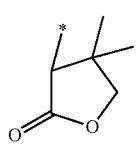 (r-lc-1-3)

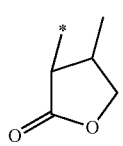 (r-lc-1-4)

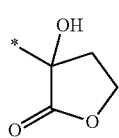 (r-lc-1-5)

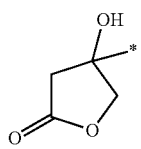 (r-lc-1-6)

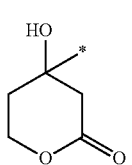 (r-lc-1-7)

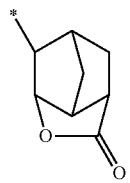 (r-lc-2-1)

 (r-lc-2-2)

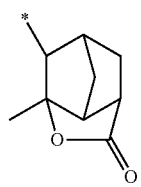 (r-lc-2-3)

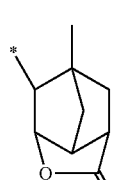 (r-lc-2-4)

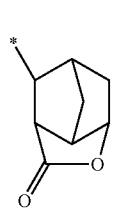 (r-lc-2-5)

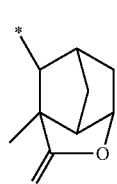 (r-lc-2-6)

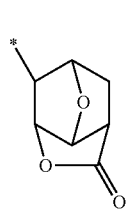 (r-lc-2-7)

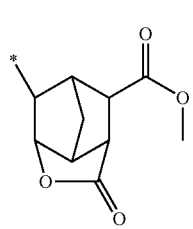 (r-lc-2-8)

(r-lc-2-9)
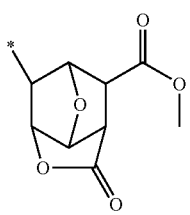
(r-lc-2-10)
(r-lc-2-11)
(r-lc-2-12)
(r-lc-2-13)
(r-lc-2-14)
(r-lc-2-15)
(r-lc-2-16)
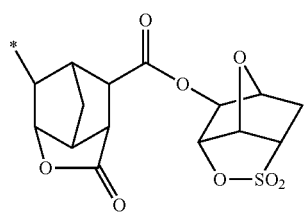
(r-lc-2-17)
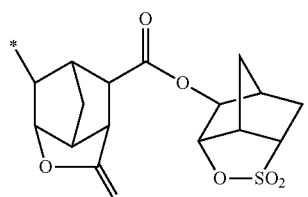
(r-lc-2-18)
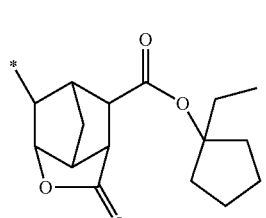
(r-lc-3-1)
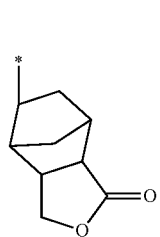
(r-lc-3-2)
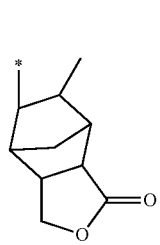
(r-lc-3-3)
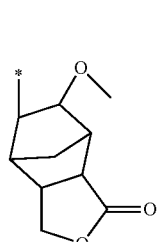
(r-lc-3-4)
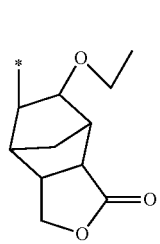

-continued (r-lc-3-5)
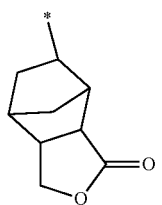

[Chemical Formula 31.]

(r-lc-4-1)
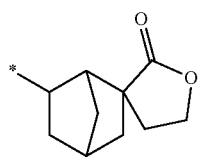

(r-lc-4-2)
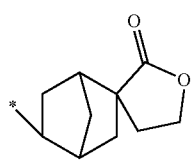

(r-lc-4-3)
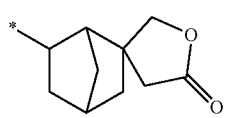

(r-lc-4-4)
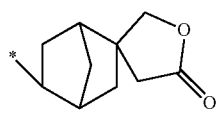

(r-lc-4-5)
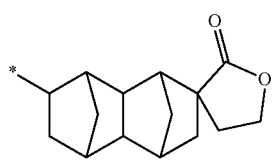

(r-lc-4-6)
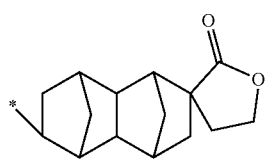

(r-lc-4-7)
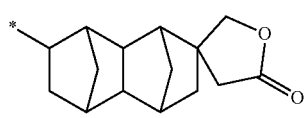

(r-lc-4-8)
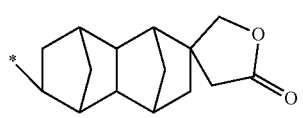

(r-lc-4-9)
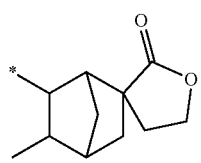

-continued (r-lc-5-1)
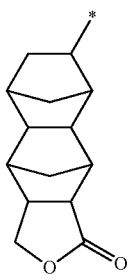

(r-lc-5-2)
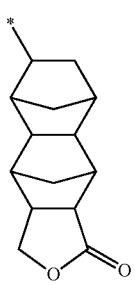

(r-lc-5-3)
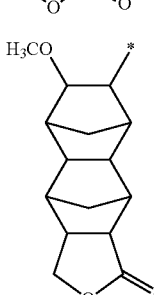

(r-lc-5-4)
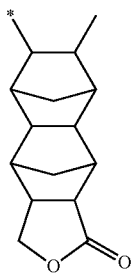

(r-lc-6-1)
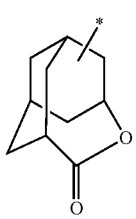

(r-lc-7-1)
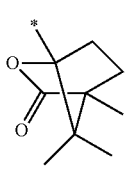

An "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

[Chemical Formula 32.]

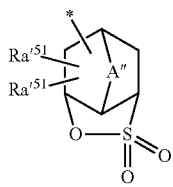
(a5-r-1)

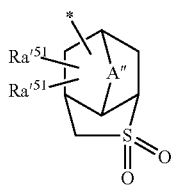
(a5-r-2)

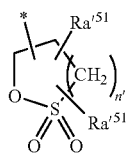
(a5-r-3)

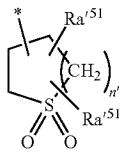
(a5-r-4)

In the formulae, each Ra'$^{51}$ independently represents an alkyl group, an alkoxy group, a halogen atom, a halogenated alkyl group, —COOR", —OC(=O)R", a hydroxyalkyl group or a cyano group; R" represents a hydrogen atom, an alkyl group, a lactone-containing cyclic group or an —SO$_2$— containing cyclic group; A" represents an oxygen atom, a sulfur atom, or an alkylene group of 1 to 5 carbon atoms with or without an oxygen atom or a sulfur atom; and n' represents an integer of 0 to 2.

In general formulae (a5-r-1) and (a5-r-2), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for Ra'$^{51}$ include the same groups as those described above in the explanation of Ra'$^{21}$ in the general formulas (a2-r-1) to (a2-r-7).

Specific examples of the groups represented by the aforementioned general formulae (a5-r-1) to (a5-r-4) are shown below. In the formulae shown below, "Ac" represents an acetyl group.

[Chemical Formula 33.]

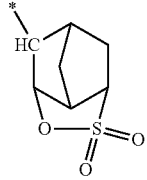
(r-sl-1-1)

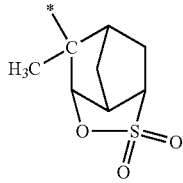
(r-sl-1-2)

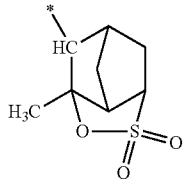
(r-sl-1-3)

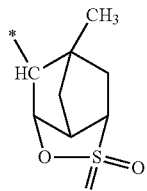
(r-sl-1-4)

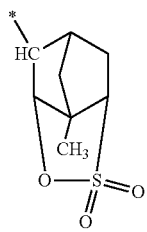
(r-sl-1-5)

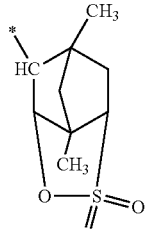
(r-sl-1-6)

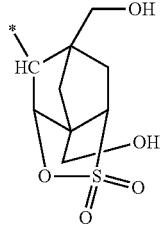
(r-sl-1-7)

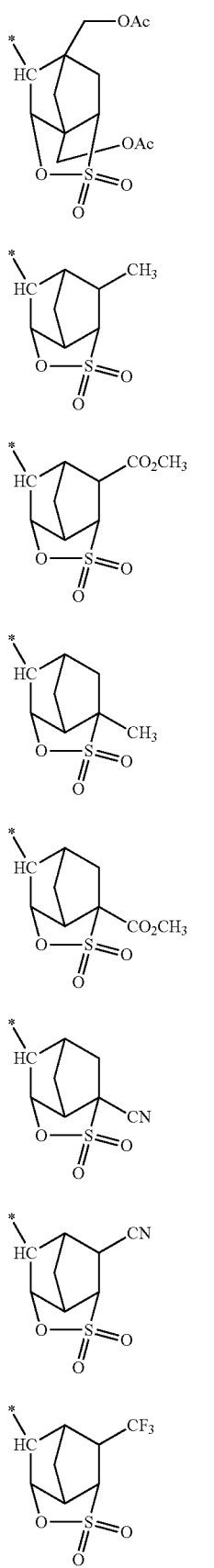
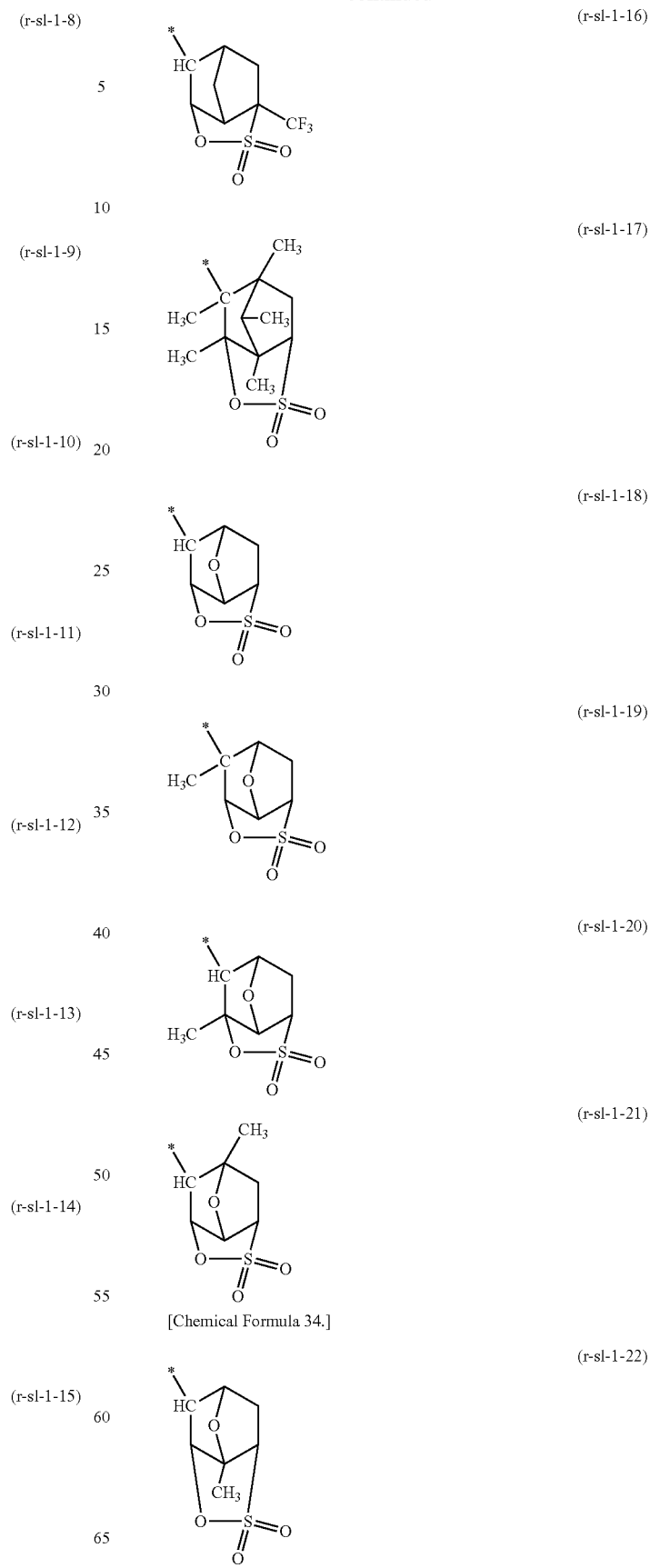
[Chemical Formula 34.]

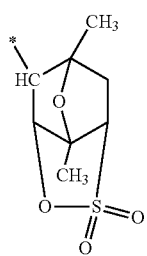 (r-sl-1-23)
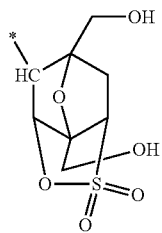 (r-sl-1-24)
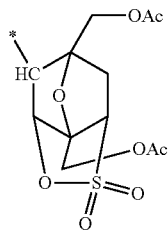 (r-sl-1-25)
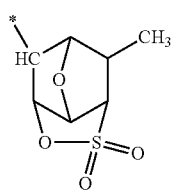 (r-sl-1-26)
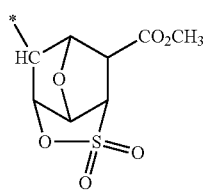 (r-sl-1-27)
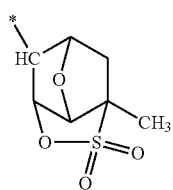 (r-sl-1-28)
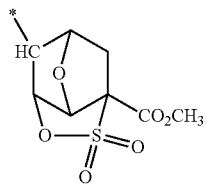 (r-sl-1-29)
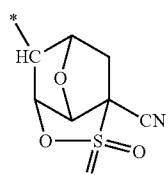 (r-sl-1-30)
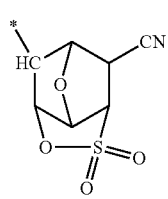 (r-sl-1-31)
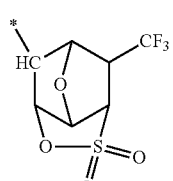 (r-sl-1-32)
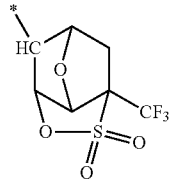 (r-sl-1-33)
[Chemical Formula 35.]
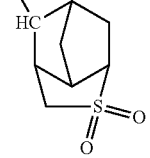 (r-sl-2-1)
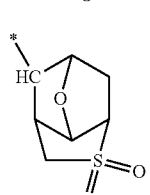 (r-sl-2-2)
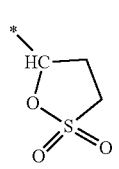 (r-sl-3-1)
(r-sl-4-1)

-continued

[Chemical Formula 36.]

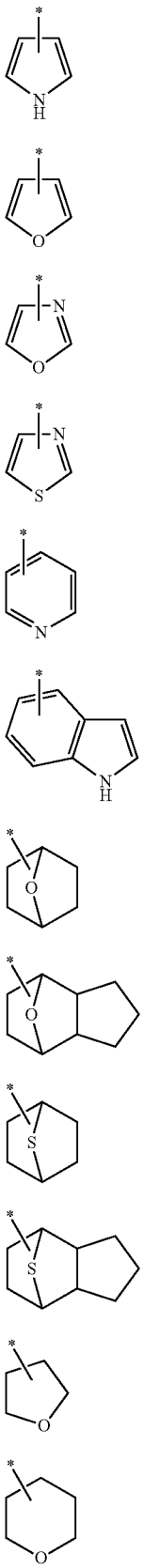

(r-hr-1)
(r-hr-2)
(r-hr-3)
(r-hr-4)
(r-hr-5)
(r-hr-6)
(r-hr-7)
(r-hr-8)
(r-hr-9)
(r-hr-10)
(r-hr-11)
(r-hr-12)

-continued

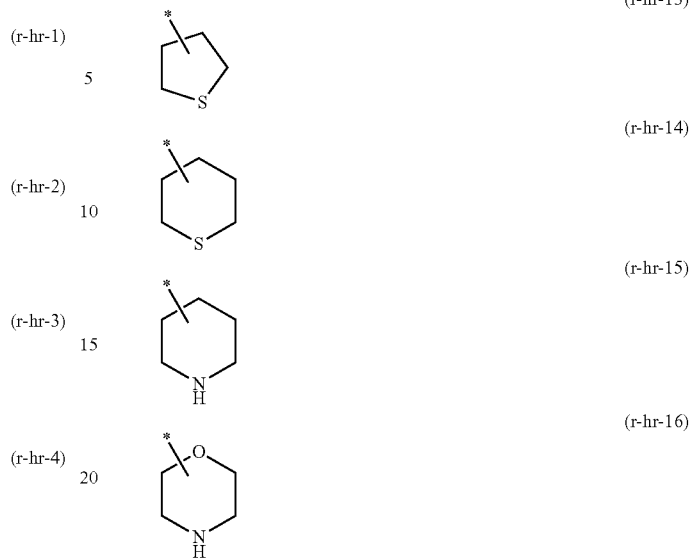

(r-hr-13)
(r-hr-14)
(r-hr-15)
(r-hr-16)

Further, as the cyclic group which may have a substituent, an acid dissociable group may also be mentioned.

As the substituent for the cyclic group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and more preferably a methyl group, an ethyl group, a propyl group, an n-butyl group or a tert-butyl group.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—$CH_2$—) constituting the cyclic hydrocarbon group.

Chain-like Alkyl Group which may have a Substituent:

The chain-like alkyl group for $R^{101}$ may be linear or branched.

The linear alkyl group preferably has 1 to 20 carbon atoms, more preferably 1 to 15 carbon atoms, and still more preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15 carbon atoms, and still more preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Further, as the chain-like alkyl group which may have a substituent, the acid dissociable group represented by the aforementioned formula (a1-r-2) may be mentioned.

Chain-like Alkenyl Group which may have a Substituent:

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among the above examples, as $R^{101}$, a cyclic group which may have a substituent is preferable, and a cyclic hydrocarbon group which may have a substituent is more preferable. More specifically, a phenyl group which may have a substituent; a naphthyl group which may have a substituent; a group in which 1 or more hydrogen atoms have been removed from a polycycloalkane which may have a substituent; a lactone-containing cyclic group represented by any of the aforementioned general formulae (a2-r-1), (a2-r-3) to (a2-r-7); and an —SO$_2$— containing cyclic group represented by any of the aforementioned general formulae (a5-r-1) to (a5-r-4).

In formula (b1), $R^{102}$ represents a fluorinated alkyl group of 1 to 5 carbon atoms or a fluorine atom.

$R^{102}$ is preferably a perfluoroalkyl group of 1 to 5 carbon atoms or a fluorine atom, and is more preferably a fluorine atom.

In formula (b1), $Y^{101}$ represents a single bond or a divalent linking group containing an oxygen atom.

The divalent linking group for $Y^{101}$ may contain an atom other than oxygen. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto.

Examples of the divalent linking group containing an oxygen atom include divalent linking groups represented by general formula (y-al-1) to (y-al-7) shown below.

[Chemical Formula 37.]

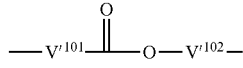  (y-al-1)

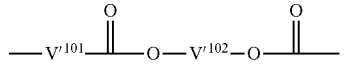  (y-al-2)

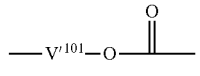  (y-al-3)

  (y-al-4)

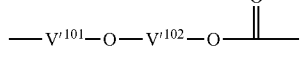  (y-al-5)

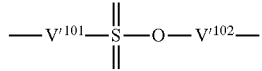  (y-al-6)

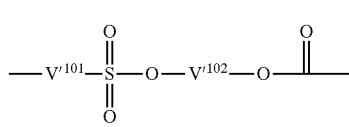  (y-al-7)

In the formulae, $V'^{101}$ represents a single bond or an alkylene group of 1 to 5 carbon atoms; $V'^{102}$ represents a single bond or a divalent saturated hydrocarbon group of 1 to 30 carbon atoms.

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—CH$_2$—]; an alkylmethylene group, such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; an alkylethylene group, such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; an alkyltrimethylene group, such as —CH(CH$_3$)CH$_2$CH$_2$— and —CH$_2$CH(CH$_3$)CH$_2$—; a tetramethylene group [—CH$_2$CH$_2$CH$_2$CH$_2$—]; an alkyltetramethylene group, such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $R^{101}$, and a cyclohexylene group, 1,5-adamantylene group or 2,6-adamantylene group is preferable.

$Y^{101}$ is preferably a divalent linking group containing an ether bond or a divalent linking group containing an ester bond, and groups represented by the aforementioned formulas (y-al-1) to (y-al-5) are preferable.

In formula (b1), $V^{101}$ represents an alkylene group, a fluorinated alkylene group or a single bond.

The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

Specific examples of the anion moiety of the component (B1) include an anion represented by general formula (an-1) or (an-2) shown below.

[Chemical Formula 38.]

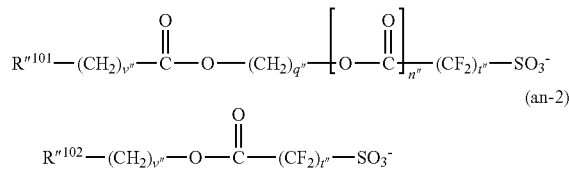

(an-1)

(an-2)

In the formulae, $R''^{101}$ represents an aliphatic cyclic group which may have a substituent, a group represented by any one of the formulae (r-hr-1) to (r-hr-6), or a chain alkyl group which may have a substituent; $R''^{102}$ represents an aliphatic cyclic group which may have a substituent, a lactone-containing cyclic group represented by any one of the formulae (a2-r-1) to (a2-r-7), or an —$SO_2$— containing cyclic group represented by any one of the general formulae (a5-r-1) to (a5-r-4); each $v''$ independently represents an integer of 0 to 3; $q''$ represents an integer of 1 to 20; each $t''$ independently represents an integer of 1 to 3; and $n''$ represents 0 or 1.

As the aliphatic cyclic group for $R''^{101}$ and $R''^{102}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ may be mentioned.

As the chain-like alkyl group for $R''^{101}$ which may have a substituent, the same groups as those described above for $R^{101}$ are preferable.

Among these examples, as the anion moiety of the component (B1), an anion represented by general formula (an-1) or (an-2) is preferable, and an anion represented by general formula (an-2) is more preferable.

Specific examples of the anion moiety of the component (B1) include an anion represented by any of general formulae (an-1-1) to (an-1-3) and (an-2-1) shown below.

[Chemical Formula 39.]

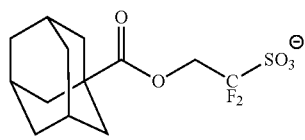

(an-1-1)

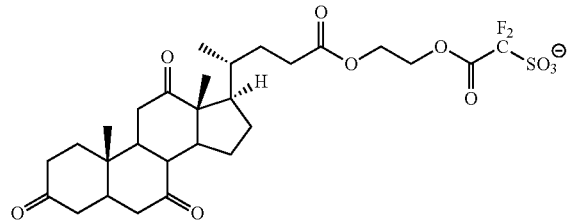

(an-1-2)

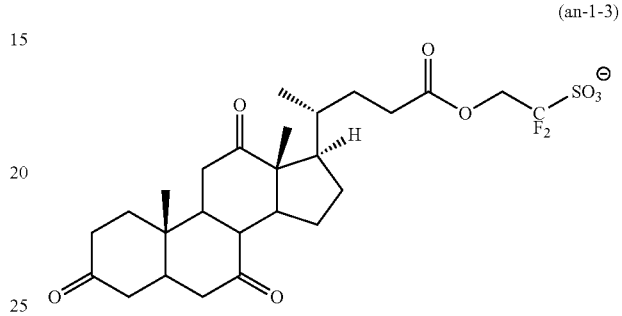

(an-1-3)

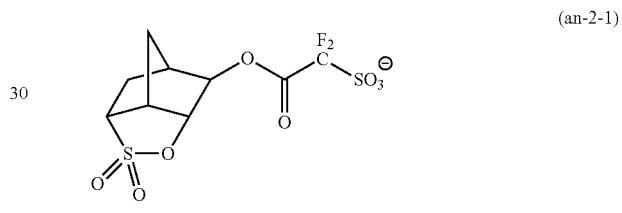

(an-2-1)

Cation Moiety $((M'^{m-})_{1/m})$

In formula (b1), $M'^{m+}$ represents an onium cation having a valency of m. m represents an integer of 1 or more.

As the onium cation for $M'^{m+}$, a sulfonium cation or a iodonium cation is preferable.

Preferable examples of the cation moiety $((M'^{m+})_{1/m})$ include an organic cation represented by any of general formulae (ca-1) to (ca-5) shown below.

[Chemical Formula 40.]

(ca-1)

(ca-2)

(ca-3)

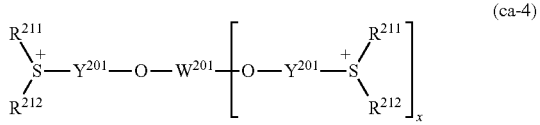

(ca-4)

(ca-5)

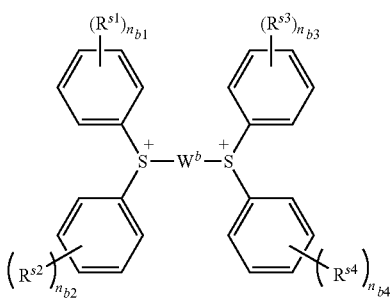

In the formula, $R^{201}$ to $R^{207}$, $R^{211}$ and $R^{212}$ each independently represents an aryl group which may have a substituent, an alkyl group which may have a substituent or an alkenyl group which may have a substituent. $R^{201}$ to $R^{203}$, $R^{206}$ and $R^{207}$, and $R^{211}$ and $R^{212}$ may be mutually bonded to form a ring with the sulfur atom. $R^{208}$ and $R^{209}$ each independently represents a hydrogen atom or an alkyl group of 1 to 5 carbon atoms. $R^{210}$ represents an aryl group which may have a substituent, an alkyl group which may have a substituent, an alkenyl group which may have a substituent, or an —$SO_2$— containing cyclic group which may have a substituent. $L^{201}$ represents —C(=O)— or —C(=O)—O—. Each $Y^{201}$ independently represents an arylene group, an alkylene group or an alkenylene group. x represents 1 or 2. $W^{201}$ represents an (x+1) valent linking group. $W^b$ represents a hydrocarbon group which may have a substituent. $R^{s1}$ to $R^{s4}$ each independently represents a substituent. $n_{b1}$ to $n_{b4}$ each independently represents an integer of 0 to 3.

In formulae (ca-1) to (ca-4), as the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by general formulae (ca-r-1) to (ca-r-7) shown below.

[Chemical Formula 41.]

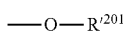
[ca-r-1]

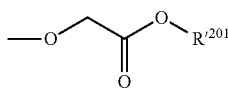
[ca-r-2]

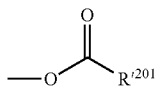
[ca-r-3]

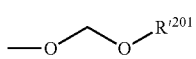
[ca-r-4]

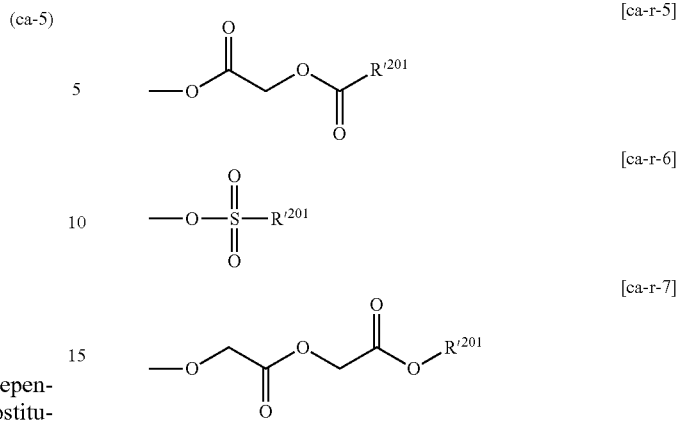

In the formulae, each $R'^{201}$ independently represents a hydrogen atom, a cyclic group which may have a substituent, a chain-like alkyl group which may have a substituent, or a chain-like alkenyl group which may have a substituent.

As the cyclic group which may have a substituent, the chain-like alkyl group which may have a substituent and the chain-like alkenyl group which may have a substituent for $R'^{201}$, the same groups as those described later for $R^{101}$ in formula (b-1) can be mentioned. As the cyclic group which may have a substituent and chain-like alkyl group which may have a substituent, an acid dissociable group may also be mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— (wherein $R_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —$SO_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —$SO_2$— containing cyclic group for $R^{210}$ which may have a substituent, an "—$SO_2$— containing polycyclic group" is preferable, and a group represented by the aforementioned general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

Examples of the alkylene group and alkenylene group for $Y^{201}$ include groups in which one hydrogen atom has been removed from the chain-like alkyl group or the chain-like alkenyl group given as an example of $R^{101}$ in the aforementioned formula (b1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups (which may have a substituent) as those described above for $Ya^{x0}$ may be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

In formula (ca-5), $W^b$ represents a hydrocarbon group which may have a substituent.

The hydrocarbon group for $W^b$ may be either an aliphatic hydrocarbon group, or an aromatic hydrocarbon group.

Aliphatic Hydrocarbon Group

The aliphatic hydrocarbon group as the divalent hydrocarbon group for $W^b$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

Aliphatic Hydrocarbon Group Containing a Ring in the Structure Thereof

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

Aromatic Hydrocarbon Group

The aromatic hydrocarbon group is a hydrocarbon group having an aromatic ring.

The aromatic hydrocarbon group as the divalent hydrocarbon group for $W^b$ preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 2 hydrogen atoms have been removed from the aforementioned aromatic hydrocarbon ring (arylene group, preferably a phenylene group or a naphthylene group); and a group in which 1 hydrogen atom has been removed from the aforementioned aromatic hydrocarbon ring (aryl group), and has another hydrogen atom substituted with an alkylene group (e.g., a group in which 1 hydrogen atom has been removed from an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Examples of the substituent for the hydrocarbon group represented by $W^b$ include an alkyl group having 1 to 5 carbon atoms, an alkoxy group having 1 to 5 carbon atoms, an oxo group (=O), a hydroxy group (—OH), and an amino group (—NH$_2$).

Among these examples, as $W^b$, an aromatic hydrocarbon group is preferable. As the aromatic ring contained in the aromatic hydrocarbon group, benzene, biphenyl or naphthalene is preferable, and benzene or biphenyl is more preferable.

In formula (ca-5), $R^{s1}$ to $R^{s4}$ each independently represents a substituent.

Examples of the substituent for $R^{s1}$ to $R^{s4}$ include an alkyl group, a halogen atom, a halogenated alkyl group, a carbonyl group, a cyano group, an amino group, an aryl group, an arylthio group, and a group represented by any of the aforementioned general formulae (ca-r-1) to (ca-r-7).

Examples of the arylthio group as the substituent include a phenylthio group and a biphenylthio group.

In formula (ca-5), $n_{b1}$ to $n_{b4}$ each independently represents an integer of 0 to 3, preferably 0 or 1, and more preferably 0.

Specific examples of preferable cations represented by formula (ca-1) include cations represented by formulae (ca-1-1) to (ca-1-75) shown below.

[Chemical Formula 42.]

(ca-1-1)
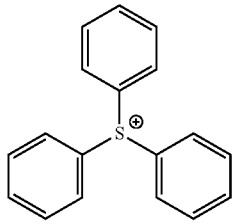

(ca-1-2)
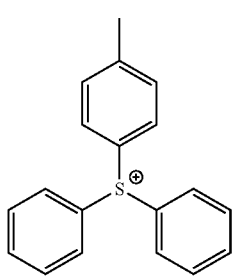

(ca-1-3)
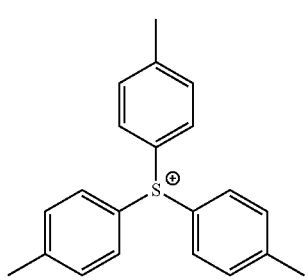

(ca-1-4)
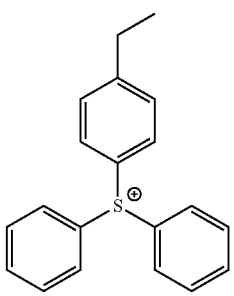

(ca-1-5)
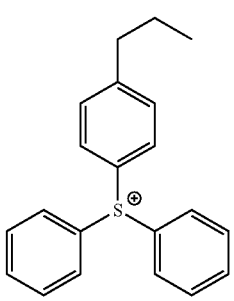

(ca-1-6)
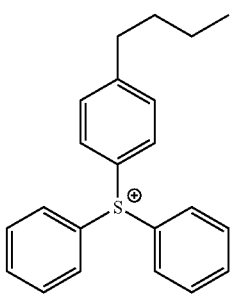

(ca-1-7)
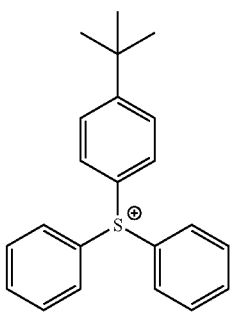

(ca-1-8)
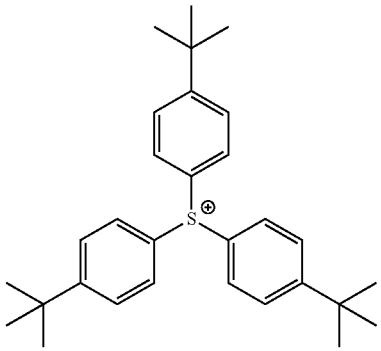

-continued
(ca-1-9)
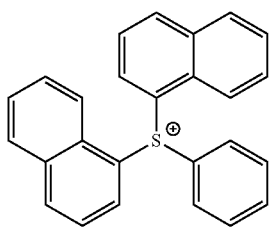
(ca-1-10)
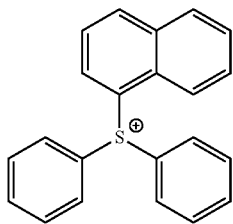
(ca-1-11)
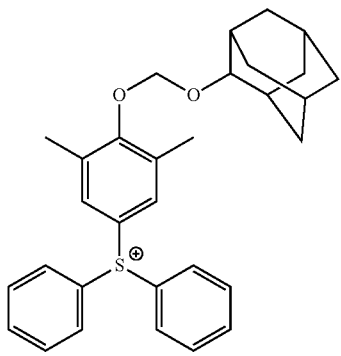
(ca-1-12)
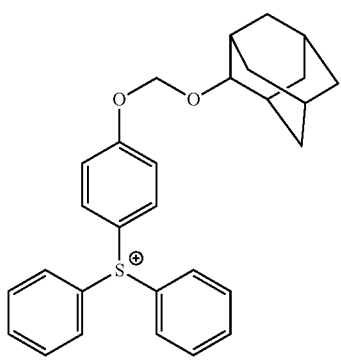
(ca-1-13)
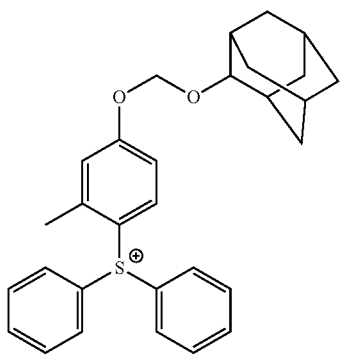
-continued
(ca-1-14)
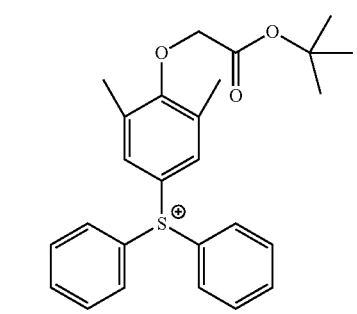
(ca-1-15)
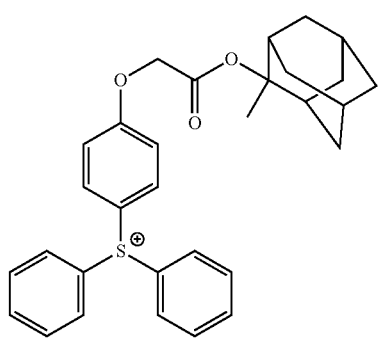
(ca-1-16)
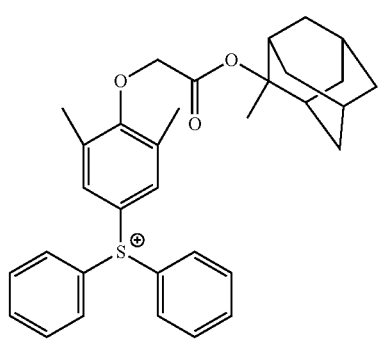
[Chemical Formula 43.]
(ca-1-17)
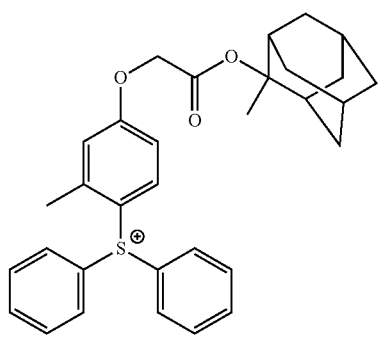

(ca-1-18) 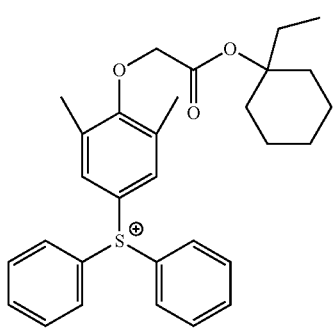
(ca-1-19) 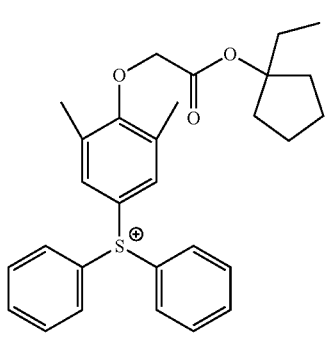
(ca-1-20) 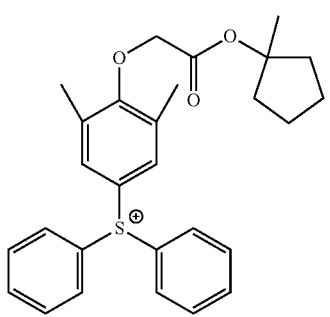
(ca-1-21) 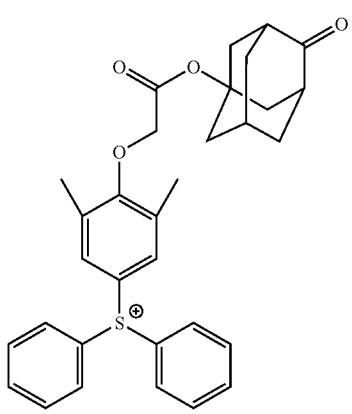
(ca-1-22) 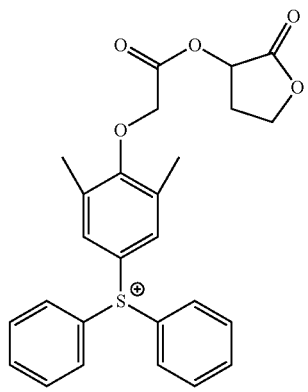
(ca-1-23) 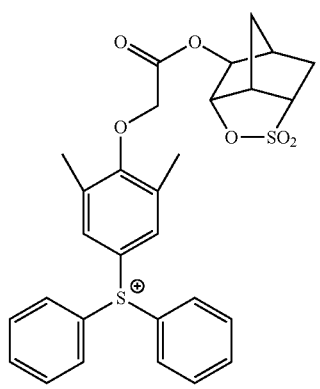
(ca-1-24) 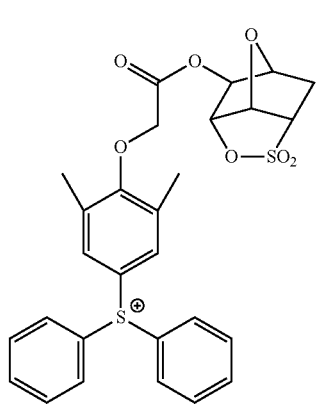
(ca-1-25) 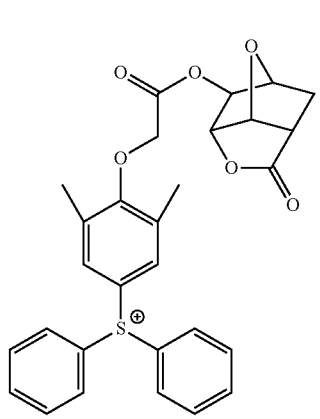

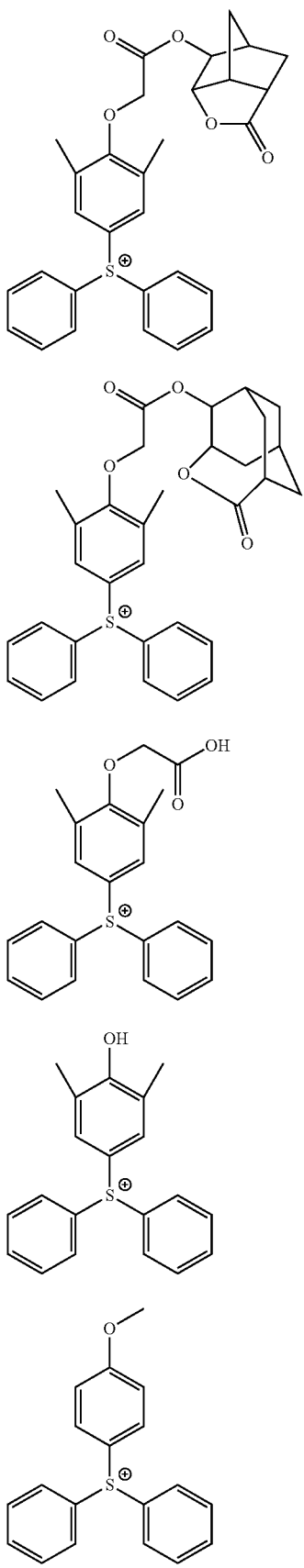
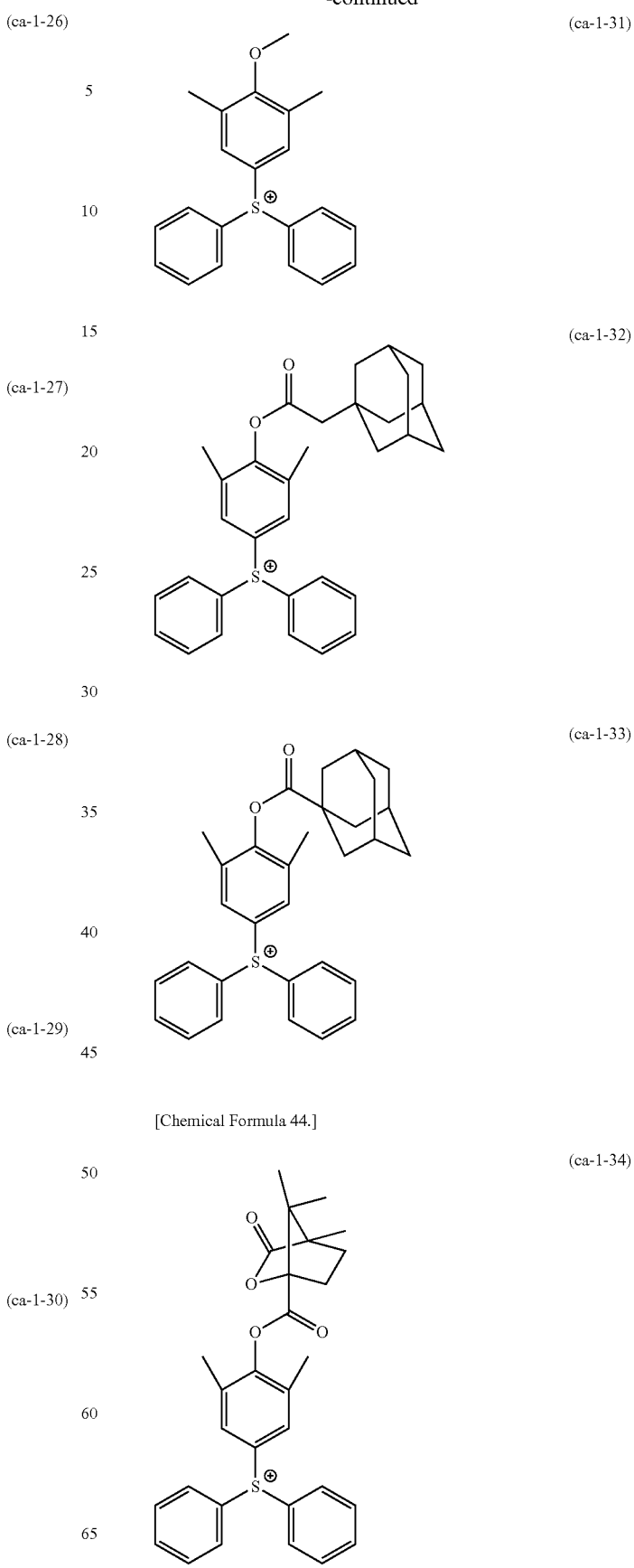

(ca-1-35) 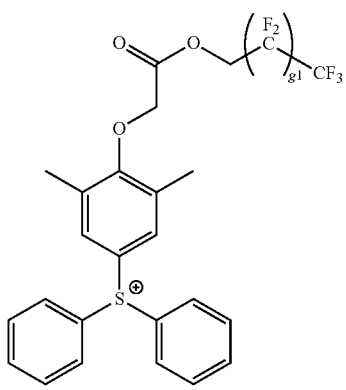
(ca-1-36) 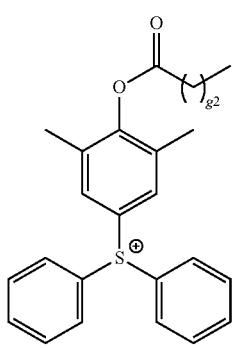
(ca-1-37) 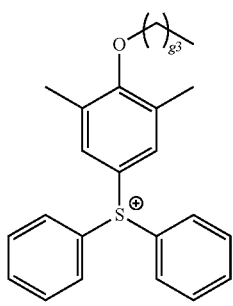
(ca-1-38) 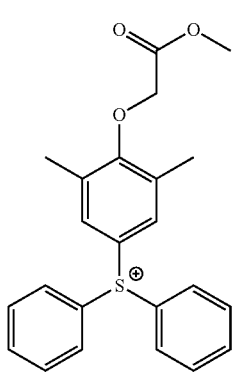
(ca-1-39) 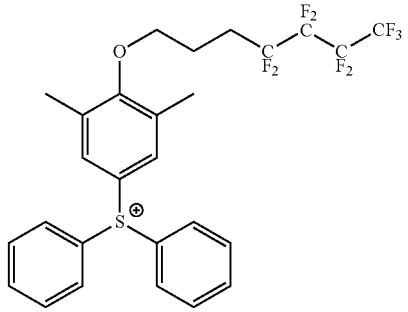
(ca-1-40) 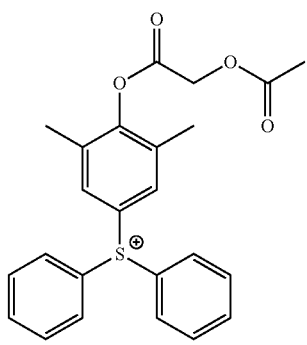
(ca-1-41) 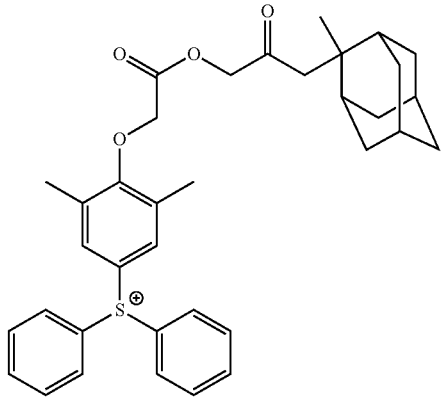
(ca-1-42) 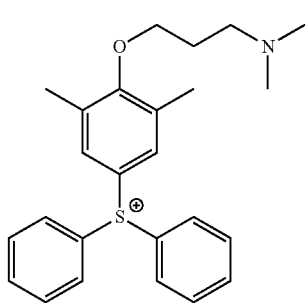
(ca-1-43) 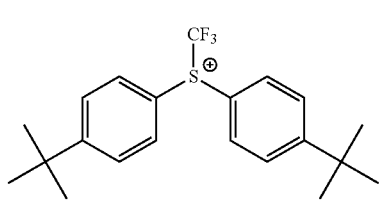

-continued
(ca-1-44)
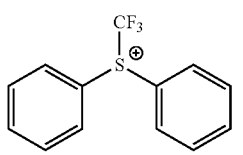
(ca-1-45)
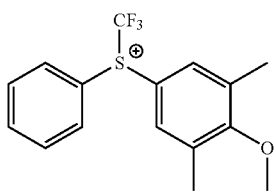
(ca-1-46)
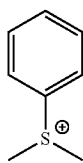
(ca-1-47)
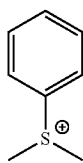
(ca-1-48)
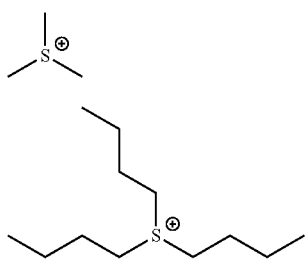
(ca-1-49)
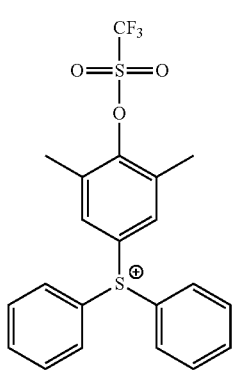
(ca-1-50)
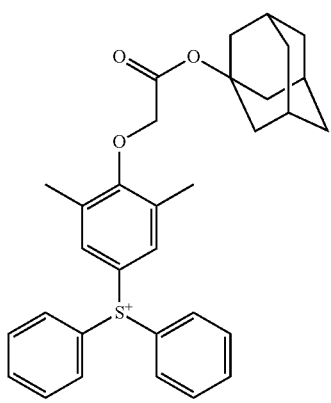
-continued
(ca-1-51)
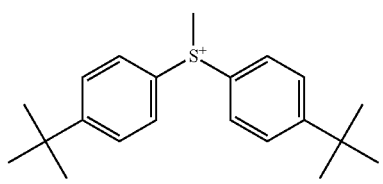
(ca-1-52)
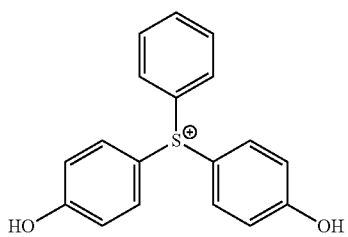
In the formulae, g1, g2 and g3 represent recurring numbers, wherein g1 is an integer of 1 to 5, g2 is an integer of 0 to 20, and g3 is an integer of 0 to 20.
[Chemical Formula 45.]
(ca-1-53)
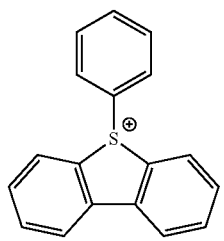
(ca-1-54)
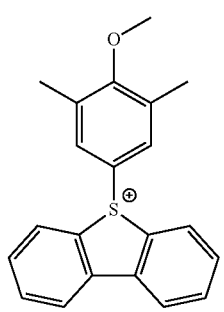
(ca-1-55)
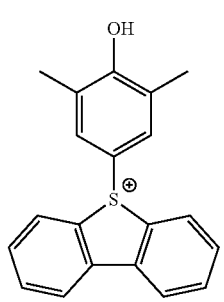

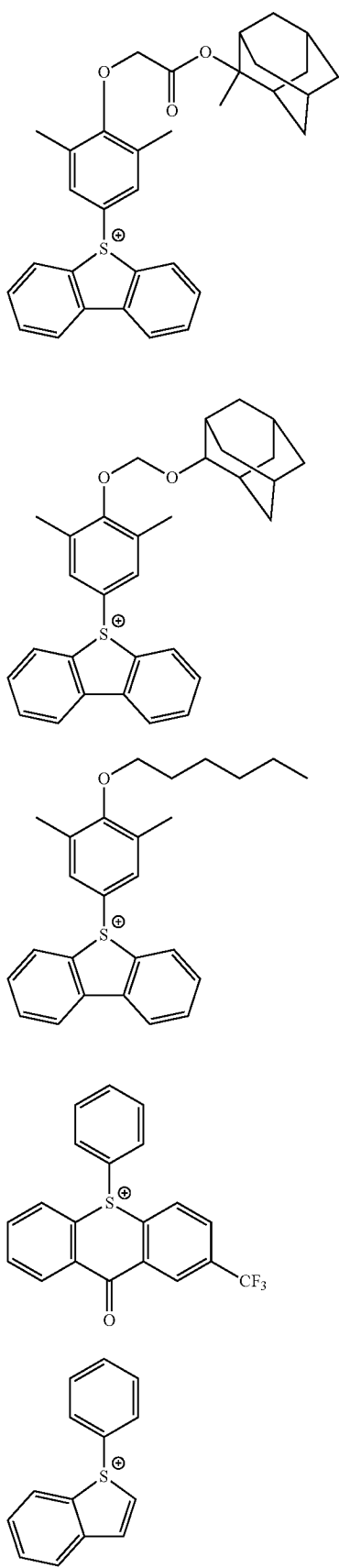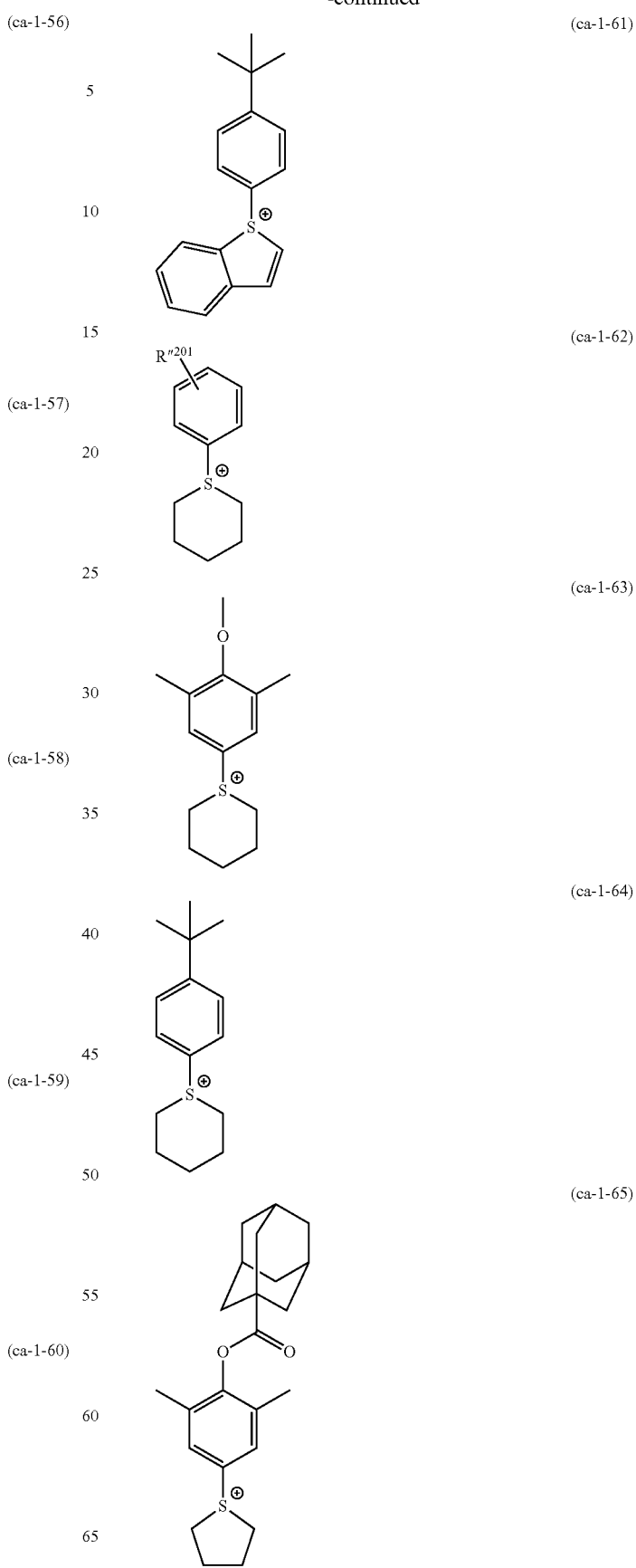

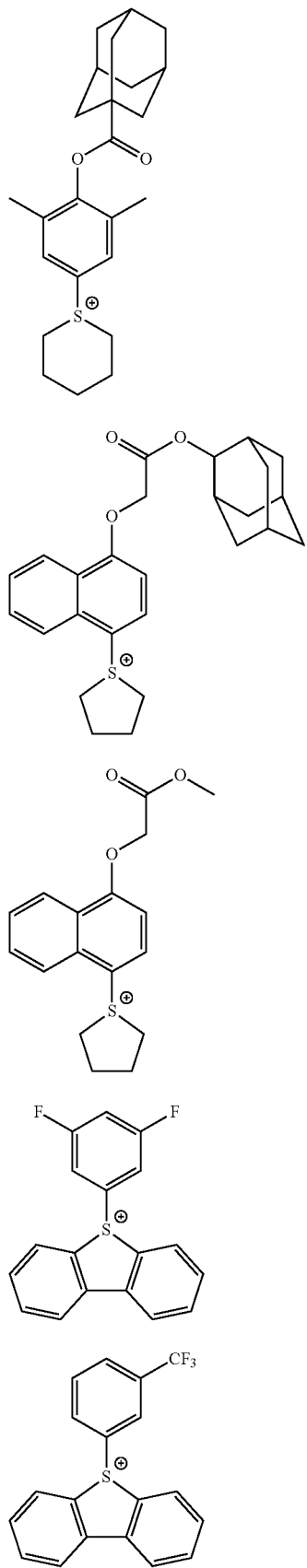
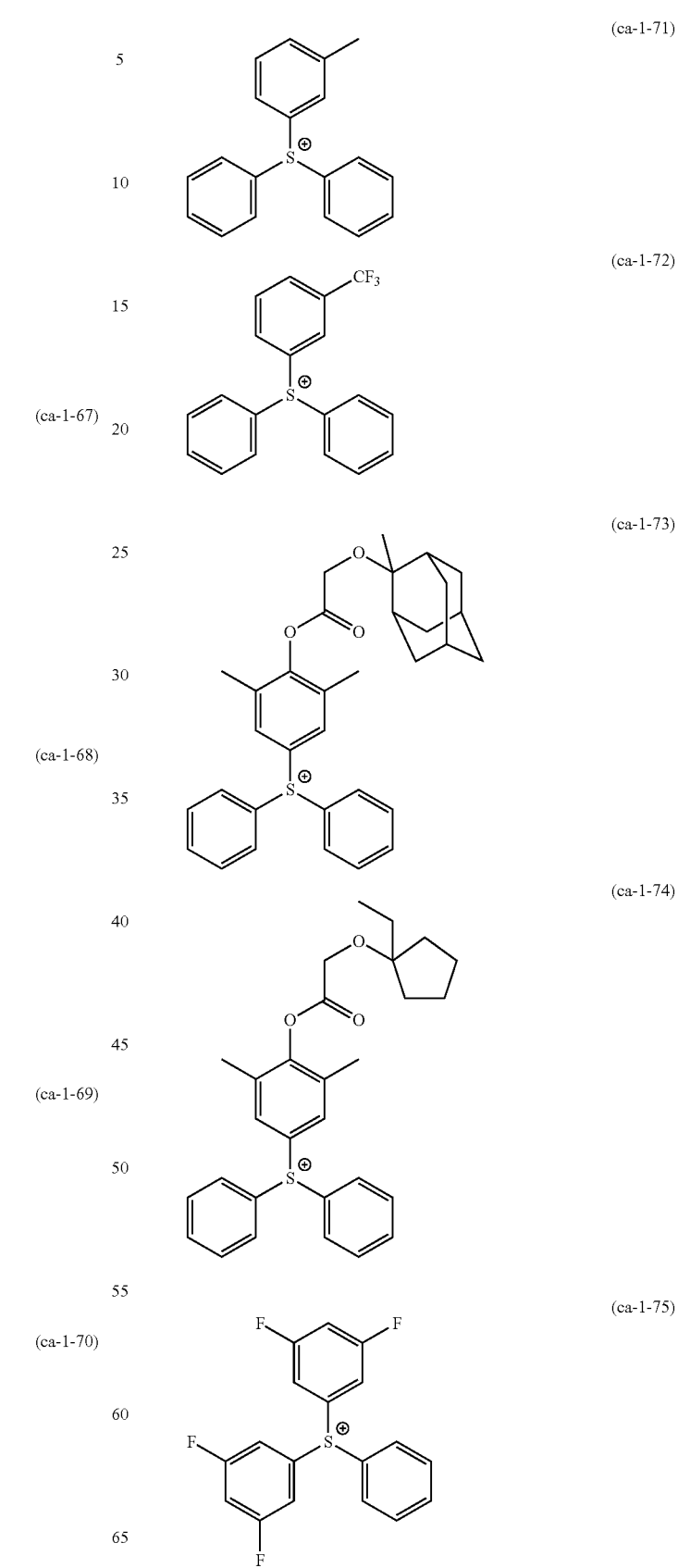

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a dihphenyliodonium cation and a bis(4-tert-butylphenyl)iodonium cation.

Specific examples of preferable cations represented by formula (ca-3) include cations represented by formulae (ca-3-1) to (ca-3-6) shown below.

[Chemical Formula 47.]

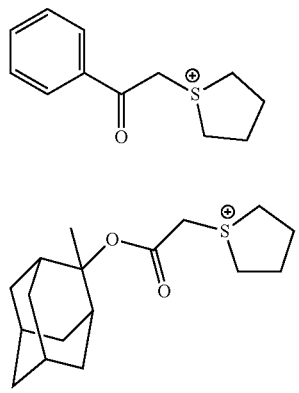

(ca-3-1)

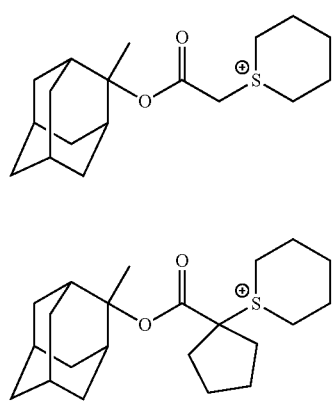

(ca-3-2)

(ca-3-3)

(ca-3-4)

(ca-3-5)

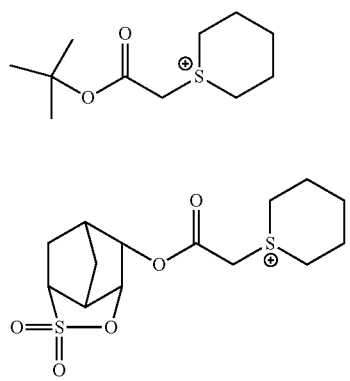

(ca-3-6)

Specific examples of preferable cations represented by formula (ca-4) include cations represented by formulae (ca-4-1) and (ca-4-2) shown below.

[Chemical Formula 48.]

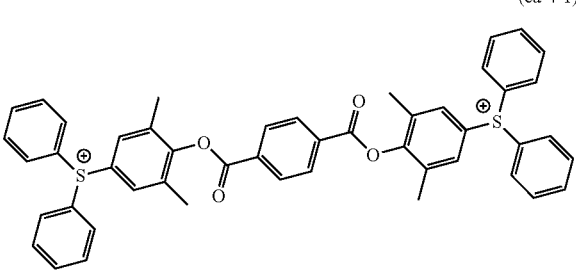

(ca-4-1)

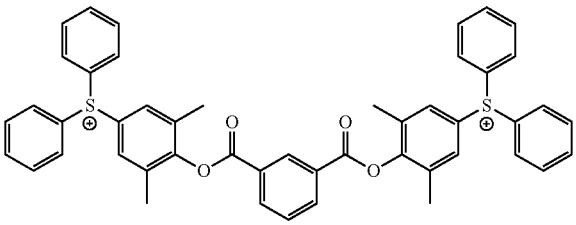

(ca-4-2)

Specific examples of preferable cations represented by formula (ca-5) include cations represented by formulae (ca-5-1) and (ca-5-2) shown below.

[Chemical Formula 49.]

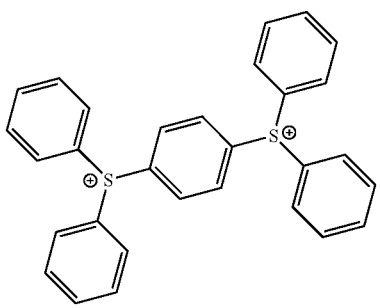

(ca-5-1)

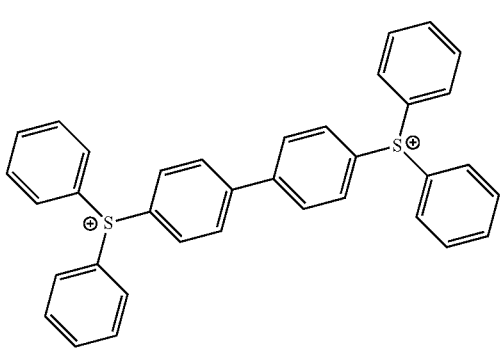

(ca-5-2)

Among these examples, as the cation moiety $((M'^{m+})_{1/m})$ of the component (B1), a cation represented by general formula (ca-1) is preferable. Among these, an onium cation represented by general formula (b1-ca-1) shown below is most preferable.

[Chemical Formula 50.]

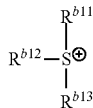

(b1-ca-1)

In the formula, $R^{b11}$ represents an aryl group which has a fluorinated alkyl group or a fluorine atom as a substituent, an alkyl group which may have a fluorinated alkyl group or a fluorine atom as a substituent, or an alkenyl group which may have a fluorinated alkyl group or a fluorine atom as a substituent; $R^{b12}$ and $R^{b13}$ each independently represents an aryl group which may have a substituent, an alkyl group which may have a substituent, or an alkenyl group which may have a substituent; provided that $R^{b11}$ to $R^{b13}$ may be mutually bonded to form a ring with the sulfur atom.

In formula (b1-ca-1), $R^{b11}$ represents an aryl group which has a fluorinated alkyl group or a fluorine atom as a substituent, an alkyl group which may have a fluorinated alkyl group or a fluorine atom as a substituent, or an alkenyl group which may have a fluorinated alkyl group or a fluorine atom as a substituent.

$R^{b11}$ is the same as defined for the aryl group, the alkyl group or the alkenyl group for $R^{201}$ in the aforementioned formula (ca-1) except that the aryl group, the alkyl group or the alkenyl group has a fluorinated alkyl group or a fluorine atom as a substituent.

In formula (b1-ca-1), $R^{b12}$ and $R^{b13}$ each independently represents an aryl group which may have a substituent, an alkyl group which may have a substituent, or an alkenyl group which may have a substituent. $R^{b12}$ and $R^{b13}$ are the same as defined for $R^{202}$ and $R^{203}$ in the aforementioned general formula (ca-1), respectively.

In the case where $R^{b11}$ to $R^{b13}$ are mutually bonded to form a ring with the sulfur atom, $R^{b11}$ to $R^{b13}$ may be bonded via a hetero atom such as a sulfur atom, an oxygen atom or a nitrogen atom or a functional group such as a carbonyl group, —SO—, —SO$_2$—, —SO$_3$—, —COO—, —CONH— or —N(R$_N$)— (R$_N$ represents an alkyl group having 1 to 5 carbon atoms). The ring containing the sulfur atom in the skeleton thereof is preferably a 3 to 10-membered ring, and most preferably a 5 to 7-membered ring.

Specific examples of preferable component (B1) are shown below.

[Chemical Formula 51.]

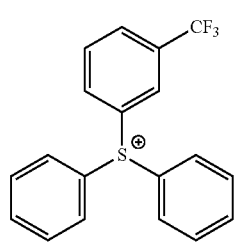 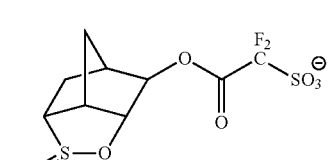

(B1-1)

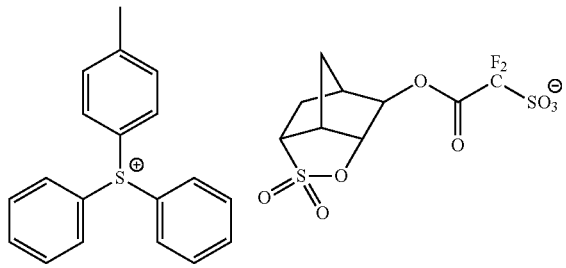

(B1-2)

(B1-3)

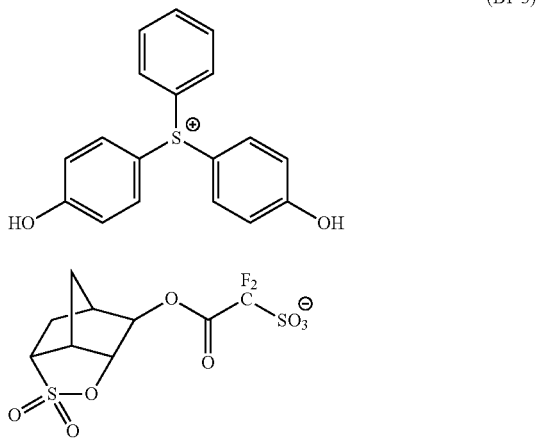

(B1-4)

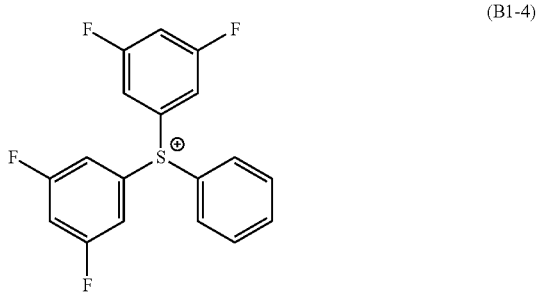

[Chemical Formula 52.]

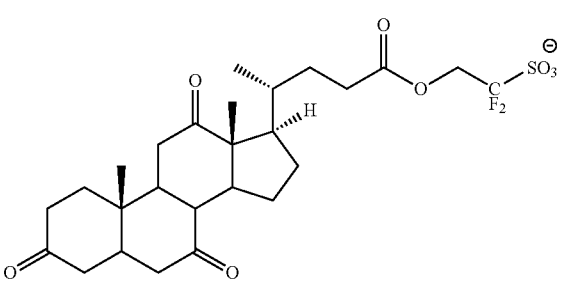

(B1-5)

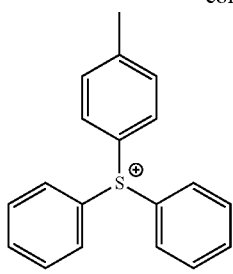

(B1-6)

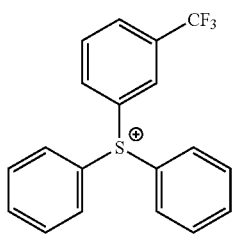

(B1-7)

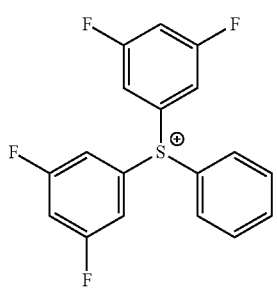

[Chemical Formula 53.]

(B-8)

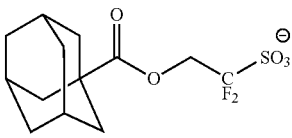

(B-9)

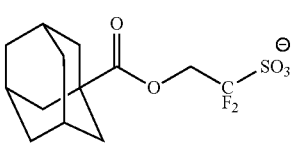

(B-10)

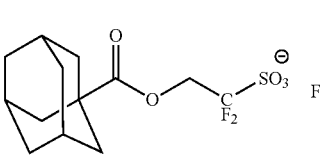

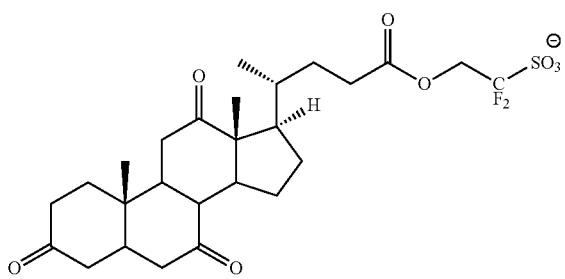

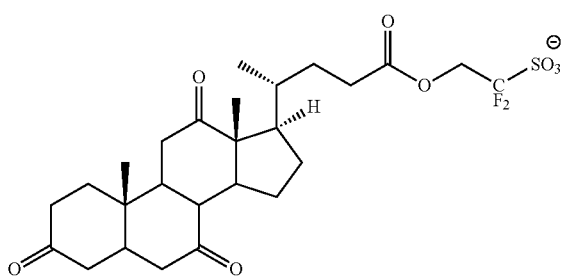

In the resist composition of the first aspect, as the component (B1), one kind of compound may be used, or two or more kinds of compounds may be used in combination.

In the resist composition of the first aspect, the amount of the component (B1) relative to 100 parts by weight of the component (A) is preferably within a range from 1 to 40 parts by weight, more preferably from 5 to 35 parts by weight, and still more preferably from 9 to 30 parts by weight.

When the amount of the component (B1) is at least as large as the lower limit of the above-mentioned range, in the formation of a resist pattern, various lithography properties such as sensitivity, resolution, LWR (line width roughness) and pattern shape are improved. On the other hand, when the amount of the component (B1) is no more than the upper limit of the above-mentioned range, when each of the components are dissolved in an organic solvent, a homogeneous solution may be more reliably obtained and the storage stability of the resist composition is improved.

Component (B2)

The resist composition of the first aspect may contain an acid generator other than the component (B1) (hereafter, referred to as "component (B2)"), as long as the effects of the present invention are not impaired.

As the component (B2), there is no particular limitation, and any of the known acid generators used in conventional chemically amplified resist compositions may be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzyl sulfonate acid generators; iminosulfonate acid generators; and disulfone acid generators.

As the onium salt acid generator, a compound represented by general formula (b-2) below (hereafter, sometimes referred to as "component (b-2)") or a compound represented by general formula (b-3) below (hereafter, sometimes referred to as "component (b-3)") may be mentioned.

[Chemical Formula 54.]

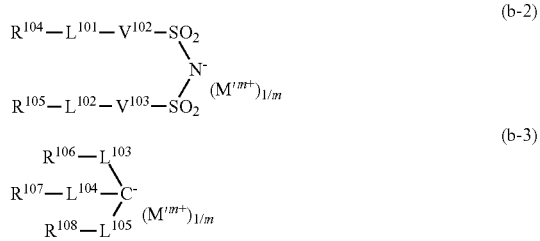

In the formulae, $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $V^{102}$ and $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; m represents an integer of 1 or more; and $M'^{m+}$ represents an onium cation having a valency of m.

{Anion Moiety}
Anion Moiety of Component (b-2)
In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b1).

In formula (b-2), $L^{101}$ and $L^{102}$ each independently represents a single bond or an oxygen atom.

Anion Moiety of Component (b-3)
In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b1).

In formula (b-3), $L^{103}$ to $L^{105}$ each independently represents a single bond, —CO— or —SO$_2$—.

{Cation Moiety}
In formulae (b-2) and (b-3), $M'^{m+}$ represents an onium cation having a valency of m, and is preferably a sulfonium cation or an iodonium cation. m represents an integer of 1 or more.

As examples of the cation moiety (($M'^{m+}$)$_{1/m}$, the onium cations described above for the cation moiety of the component (B1) may be mentioned. As the cation moiety (($M'^{m+}$)$_{1/m}$, a cation represented by the aforementioned general formula (ca-1) is preferable, and a cation represented by any of the aforementioned formulae (ca-1-1) to (ca-1-75) is more preferable.

In the resist composition of the first aspect, as the component (B2), one kind of compound may be used, or two or more kinds of compounds may be used in combination.

When the resist composition of the first aspect contains the component (B2), the amount of the component (B2) relative to 100 parts by weight of the component (A) is preferably within a range from less than 50 parts by weight, more preferably 1 to 20 parts by weight, and still more preferably 1 to 10 parts by weight.

When the amount of the component (B2) is within the above-mentioned range, formation of pattern satisfactorily occurs. Further, by virtue of the above-mentioned range, when each of the components are dissolved in an organic solvent, a homogeneous solution may be more reliably obtained and the storage stability of the resist composition becomes satisfactory.

<Component (D)>
The component (D) is an acid diffusion control agent which controls diffusion of acid generated from the resist composition upon exposure.

Component (D1)
In the resist composition of the present embodiment, the component (D) includes a photodecomposable base (D1) (component (D1)) which is decomposed upon exposure and then loses the ability of controlling of acid diffusion.

When a resist pattern is formed using a resist composition containing the component (D1), the contrast between exposed portions and unexposed portions of the resist film is further improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-

1) to (d1-3) cannot function as a quencher, whereas at unexposed portions, the components (d1-1) to (d1-3) functions as a quencher.

[Chemical Formula 55.]

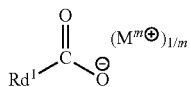 (d1-1)

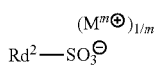 (d1-2)

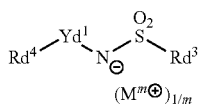 (d1-3)

In the formulae, $Rd^1$ to $Rd^4$ each independently represents a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}
Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$ in the aforementioned formula (b1).

Among these, as the group for $Rd^1$, an aromatic hydrocarbon group which may have a substituent, an aliphatic cyclic group which may have a substituent and a chain-like alkyl group which may have a substituent are preferable.

Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of the aforementioned formulae (y-al-1) to (y-al-5) is preferable as the substituent.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

[Chemical Formula 56.]

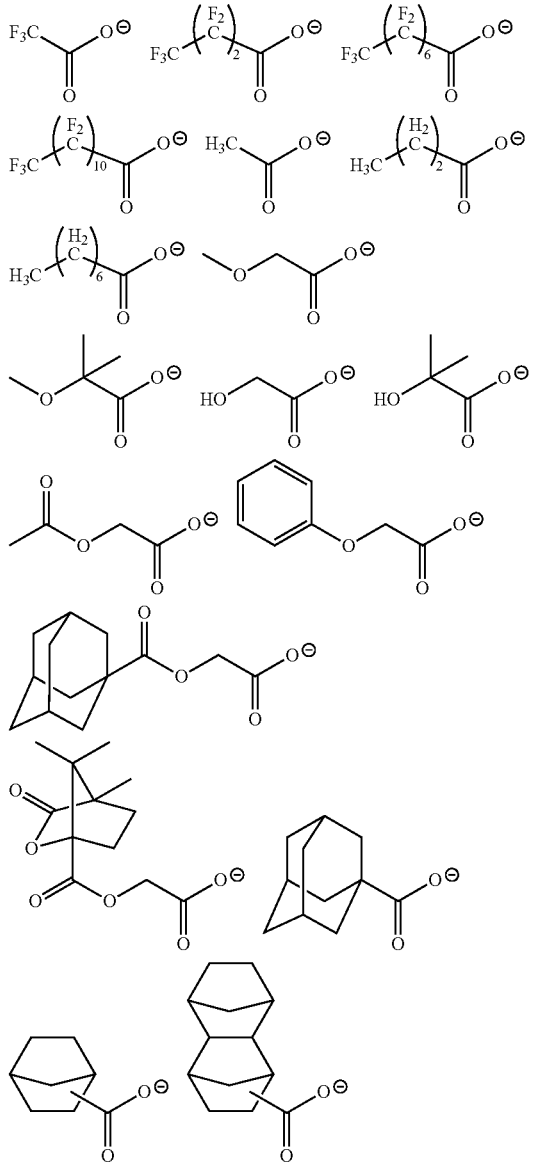

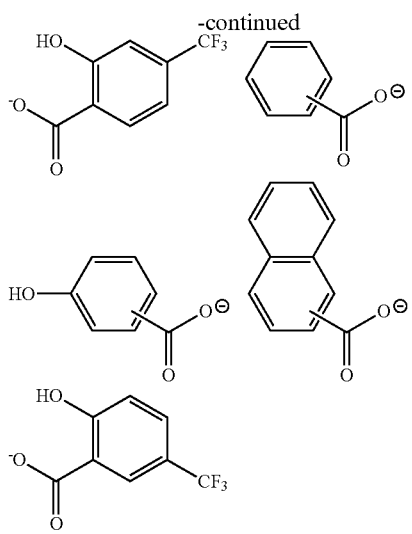

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-75) are still more preferable.

As the component (d1-1), one type of compound may be used, or two or more types of compounds may be used in combination.

{Component (d1-2)}

Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$ in the aforementioned formula (b1).

provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d1-1) can be mentioned.

Specific examples of preferable anion moieties for the component (d1-2) are shown below.

[Chemical Formula 57.]

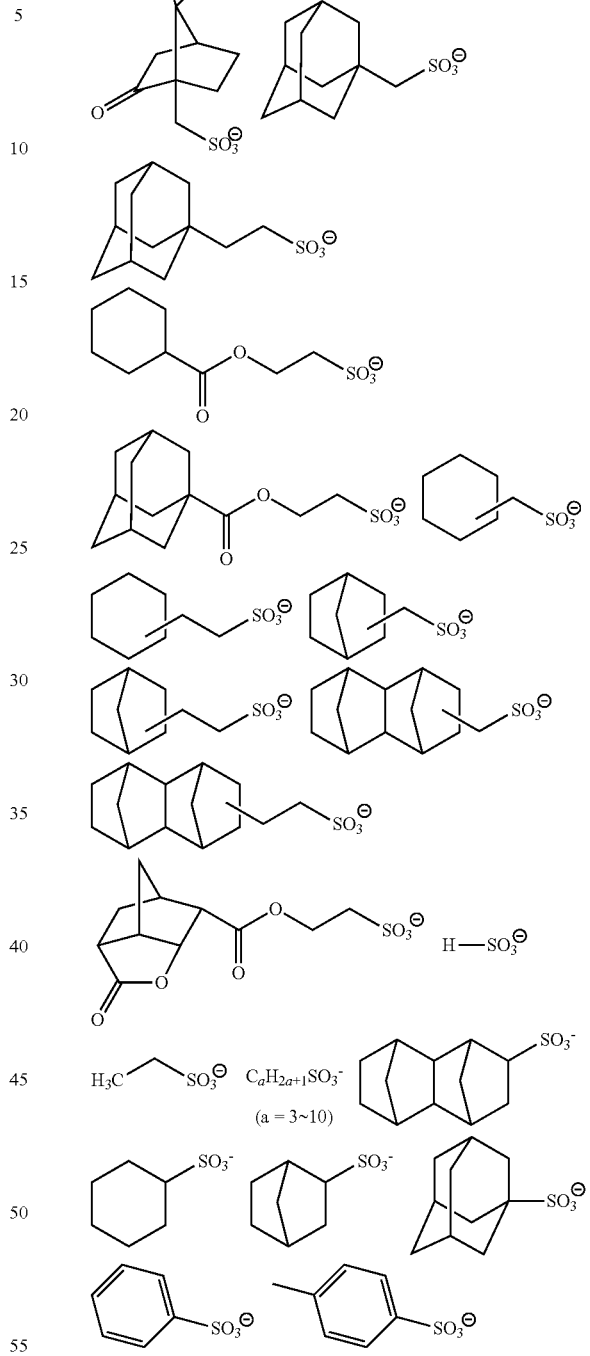

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$ in the aforementioned formula (b1), and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$ in the aforementioned formula (b1).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for in the aforementioned formula (b1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ in the aforementioned formula (b1) can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency, and sensitivity and lithography properties are improved.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As the divalent linking group, the same groups as those described above for the divalent linking group containing a hetero atom for $Ya^{x1}$ in the aforementioned general formula (a10-u1) may be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 58.]

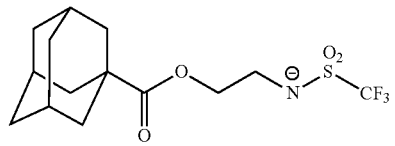

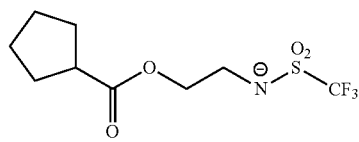

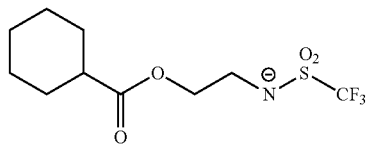

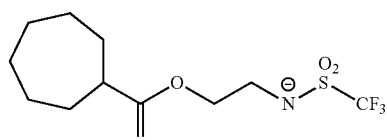

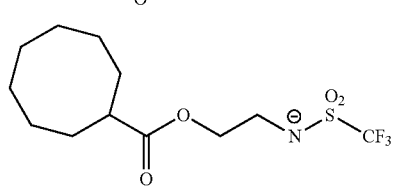

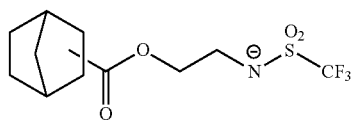

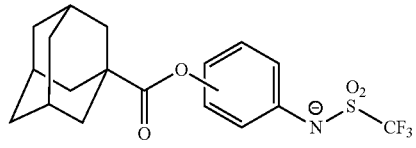

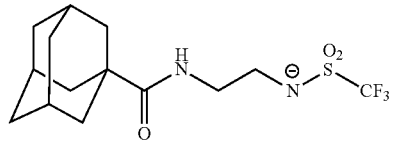

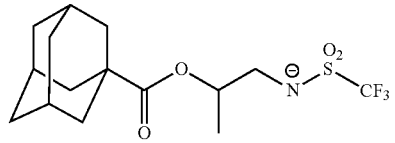

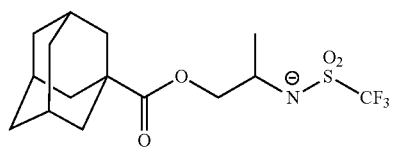

-continued

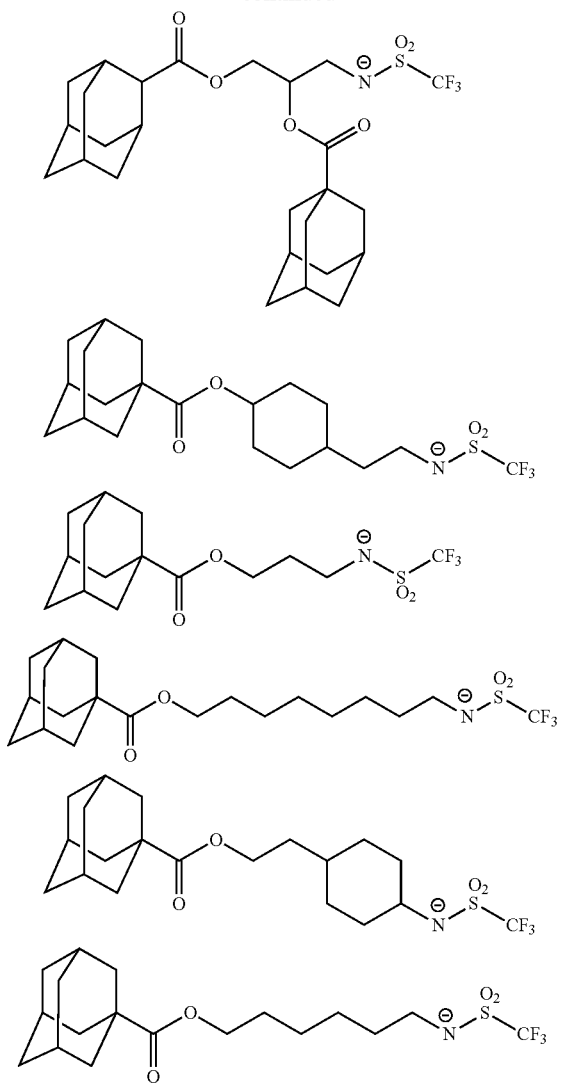

[Chemical Formula 59.]

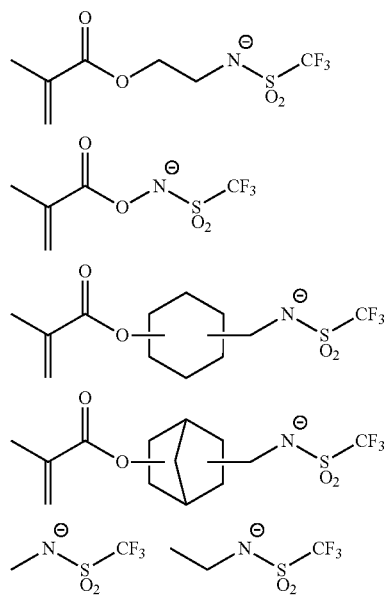

-continued

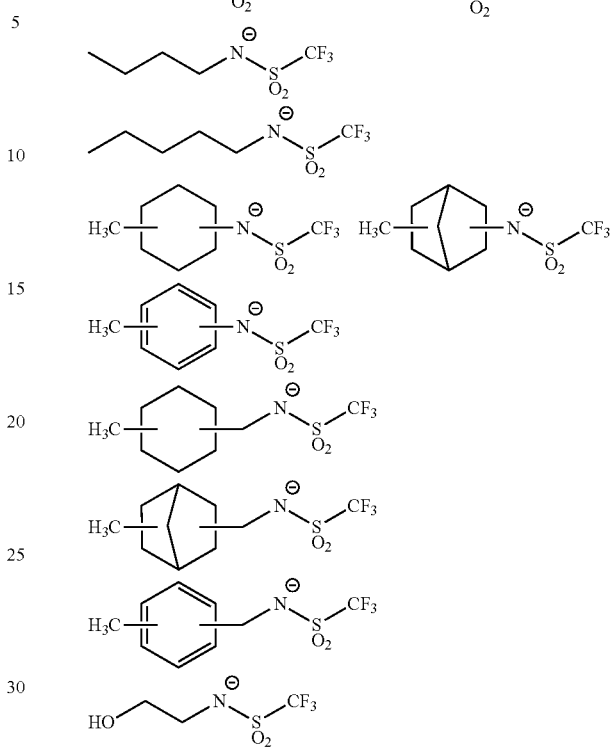

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

In the case where the resist composition of the first aspect contains the component (D1), the amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be more reliably obtained. On the other hand, when the amount of the component (D1) is no more than the upper limit of the above-mentioned range, satisfactory sensitivity may be maintained, and throughput may be improved.

Component (D2)

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine (triamylamine), tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo [2.2.2]octane.

Examples of other aliphatic amines include tris(2-methoxymethoxyethyl)amine, tris{2-(2-methoxyethoxy) ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-{2-(2-hydroxyethoxy)ethoxy}ethyl] amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one kind of compound may be used, or two or more kinds of compounds may be used in combination.

In the case where the resist composition contains the component (D2), the amount of the component (D2) relative to 100 parts by weight of the component (A) is preferably within a range from 0.01 to 5 parts by weight.

When the amount of the component (D2) is within the above-mentioned range, the shape of the resist pattern and the post exposure stability of the latent image formed by the pattern-wise exposure of the resist layer may be improved.

<Optional Components>

The resist composition of the first aspect may contain, in addition to the aforementioned components (A), (B) and (D), any other optional components.

Examples of the optional component include component (C), component (E), component (F) and component (S) described below.

<<Component (C)>>

The resist composition of the first aspect may include, in addition to the components (A), (B) and (D), a cross-linker component (hereafter, sometimes referred to as "component (C)").

By virtue of the resist composition containing the component (C), in the formation of a resist pattern, the contrast between the exposed portions and unexposed portions of the resist film may be enhanced, and various lithography properties such as resolution performance, reduction of LWR (line width roughness) and pattern shape may be improved.

There are no particular limitations on the component (C), which may be selected appropriately from the various cross-linkers used within conventional chemically amplified negative resist compositions.

Specific examples of the component (C) include cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 4,4'-biphenyldimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups; and compounds having an epoxy group.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, compounds that use glycoluril are referred to as glycoluril-based cross-linkers, and compounds that use a compound having an epoxy group are referred to as epoxy-based cross-linkers.

As the component (C), at least one type of cross-linker selected from the group consisting of melamine-based cross-linkers, urea-based cross-linkers, alkylene urea-based cross-linkers, glycoluril-based cross-linkers and epoxy-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino group with hydroxymethyl groups, and compounds obtained by reacting melamine with formaldehyde and a lower alcohol, thereby substituting the hydrogen atoms of the amino group with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino group with hydroxymethyl groups, and compounds obtained by reacting urea with formaldehyde and a lower alcohol, thereby substituting the hydrogen atoms of the amino group with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical Formula 60.]

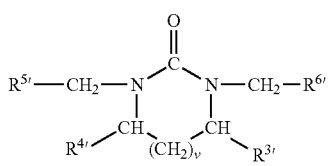

(C-1)

In the formula, $R^{5\prime}$ and $R^{6\prime}$ each independently represents a hydroxy group or a lower alkoxy group; $R^{3\prime}$ and $R^{4\prime}$ each independently represents a hydrogen atom, a hydroxy group or a lower alkoxy group; and v represents an integer of 0 to 2.

The lower alkoxy group for $R^{5\prime}$ and $R^{6\prime}$ may be either a linear or branched group, and is preferably an alkoxy group of 1 to 4 carbon atoms. $R^{5\prime}$ and $R^{6\prime}$ may be the same or different from each other, and preferably the same.

$R^{3\prime}$ and $R^{4\prime}$ may be either a linear or branched group, and is preferably an alkoxy group of 1 to 4 carbon atoms. $R^{3\prime}$ and $R^{4\prime}$ may be the same or different from each other, and preferably the same.

v represents an integer of 0 to 2, and preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

There are no particular restrictions on the epoxy-based cross-linkers, and any cross-linker having an epoxy group may be used. Of such cross-linkers, those having two or more epoxy groups are preferred. Including two or more epoxy groups improves the cross-linking reaction.

The number of epoxy groups is preferably at least two, more preferably from 2 to 4, and is most preferably 2.

Preferred examples of the epoxy-based cross-linkers are shown below.

[Chemical Formula 61.]

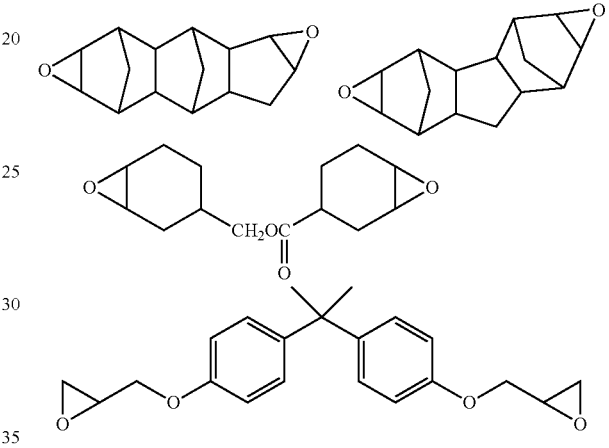

As the component (C), one type of cross-linker may be used alone, or two or more types may be used in combination.

When the resist composition of the first aspect contains the component (C), the amount of the component (C) relative to 100 parts by weight of the component (A) is preferably within a range from 1 to 50 parts by weight, more preferably from 3 to 30 parts by weight, still more preferably from 3 to 20 parts by weight, and most preferably 5 to 15 parts by weight.

When the amount of the component (C) is at least as large as the lower limit of the above-mentioned range, the formation of cross-linking may proceed satisfactorily. Further, a satisfactory resist pattern with minimal swelling may be obtained. On the other hand, when the amount of the component (C) is no more than the upper limit of the above-mentioned range, the storage stability of the resist composition may be improved, and deterioration over time in the sensitivity may be suppressed.

<<Component (E)>>

Furthermore, in the resist composition of the first embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

In the resist composition of the first aspect, as the component (E), one kind of compound may be used, or two or more kinds of compounds may be used in combination.

When the resist composition of the first aspect contains the component (E), the amount of the component (E) relative to 100 parts by weight of the component (A) is preferably in the range of 0.01 to 5 parts by weight.

<<Component (F)>>

The resist composition of the first aspect may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. The structural unit (f1) exhibits base dissociability. A component (F) containing a structural unit (f1) is decomposable in an alkali developing solution.

Preferable examples of the polymer include a polymer (homopolymer) consisting of a structural unit (f1) represented by formula (f1-1) shown below; a copolymer of the structural unit (f1) and a structural unit derived from acrylic acid or methacrylic acid; and a copolymer of the structural unit (f1) and a structural unit containing a lactone-containing cyclic group.

[Chemical Formula 62.]

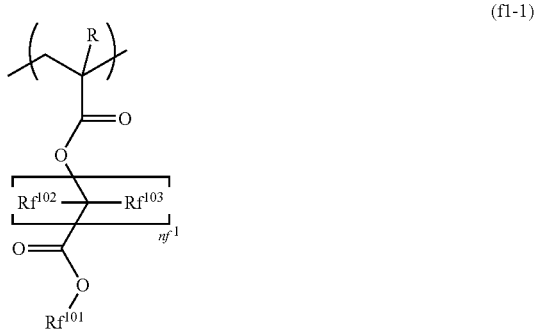

(f1-1)

In the formula, R represents a hydrogen atom, an alkyl group of 1 to 5 carbon atoms or a halogenated alkyl group of 1 to 5 carbon atoms; $Rf^{102}$ and $Rf^{103}$ each independently represents a hydrogen atom, a halogen atom, an alkyl group having 1 to 5 carbon atoms or a halogenated alkyl group having 1 to 5 carbon atoms; $Rf^{102}$ and $Rf^{103}$ may be the same or different from each other; $nf^1$ represents an integer of 1 to 5; $Rf^{101}$ represents an organic group containing a fluorine atom.

In formula (f1-1), the alkyl group having 1 to 5 carbon atoms which is bonded to the carbon atom on the α-position is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (f1-1), examples of the halogen atom for $Rf^{102}$ and $Rf^{103}$ include a fluorine atom, a chlorine atom, a bromine atom and an iodine atom, and a fluorine atom is particularly desirable.

Examples of the alkyl group of 1 to 5 carbon atoms for $Rf^{102}$ or $Rf^{103}$ include the same alkyl group of 1 to 5 carbon atoms as those described above for R, and a methyl group or an ethyl group is preferable.

Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable.

Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 6 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the Mw of the component (F) is no more than the upper limit of the above-mentioned range, the resist composition exhibits a satisfactory solubility in a resist solvent. On the other hand, when the Mw is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

In the resist composition of the first aspect, as the component (F), one kind of compound may be used, or two or more kinds of compounds may be used in combination.

When the resist composition of the first aspect contains the component (F), the amount of the component (F) relative to 100 parts by weight of the component (A) is preferably in the range of 0.5 to 10 parts by weight.

<<Component (S)>>

The resist composition of the first aspect may be prepared by dissolving the resist materials for the resist composition in an organic solvent (hereafter, referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the first aspect, as the component (S), one kind of solvent may be used, or two or more kinds of compounds may be used as a mixed solvent. Among these examples, PGMEA, PGME, γ-butyrolactone, EL and cyclohexanone are preferable.

The amount of the component (S) is not particularly limited, and is appropriately adjusted to a concentration which enables coating of a resist composition to a substrate. In general, the component (S) is used in an amount such that the solid content of the resist composition becomes within the range from 1 to 20% by weight, and preferably from 2 to 15% by weight.

If desired, other miscible additives can also be added to the resist composition of the first aspect. Examples of such miscible additives include additive resins for improving the performance of the resist film, dissolution inhibitors, plasticizers, stabilizers, colorants, halation prevention agents, and dyes.

(Method of Forming a Resist Pattern)

The method of forming a resist pattern according to the second aspect of the present invention includes: using a resist composition according to the first aspect to form a resist film on a substrate; exposing the resist film; and developing the exposed resist film to form a resist pattern.

The method for forming a resist pattern according to the present embodiment can be performed, for example, as follows.

Firstly, a resist composition of the first aspect is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing.

In this manner, a resist pattern can be formed.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present embodiment is effective to KrF excimer laser, ArF excimer laser, EB and EUV, and more effective to ArF excimer laser, EB and EUV, and most effective to EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate. Among these examples, as an ester solvent, butyl acetate is preferable.

Examples of nitrile solvents include acetonitrile, propionitrile, valeronitrile, butyronitrile and the like.

If desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

As the organic solvent, one kind of solvent may be used alone, or two or more kinds of solvents may be used in combination. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. Examples of the additive include surfactants. As the surfactant, the same surfactants as those described above can be mentioned, a non-ionic surfactant is preferable, and a non-ionic fluorine surfactant or a non-ionic silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

The resist composition of the first aspect described above includes a polymeric compound (component (A1)) having a structural unit derived from a compound represented by general formula (a0-1) (structural formula (a0)), an acid-generator component (component (B1)) represented by general formula (b1), and a photodecomposable base (component (D1)) which is decomposed upon exposure and then loses the ability of controlling of acid diffusion.

In the production of semiconductor elements and liquid crystal display elements, advances in lithography techniques have led to rapid progress in the field of pattern miniaturization, and a resist material exhibiting a high resolution performance is being demanded. In response to such demands, in a conventional chemically amplified resist composition containing a cross-linker component, the amount of the cross-linker component or the acid-generator component has been increased in order to improve the cross-linking efficiency at exposed portions of the resist film. However, when the amount of the cross-linker component or the acid generator component is increased, the solubility of the unexposed portions of the resist film is decreased. As a result, the developing contrast is deteriorated, and the resolution performance becomes unsatisfactory. Further, when excess amount of cross-linker component or acid-generator component is added, there was a problem that it becomes difficult to form a resist film.

In the resist composition of the first aspect, by introducing the structural unit (a0), cross-linking efficiency may be improved. In addition, by using a combination of the component (B1) and the component (D1), the diffusion length of the acid generated upon exposure may be controlled. By synergistic interaction of combining the polymeric compound having the structural unit (a0), the component (B1)

and the component (D1), it is presumed that the resolution performance is improved, particularly in lithography using electron beam or EUV.

Further, according to the resist composition of the first aspect, the amount of metal(s) contained in the resist composition may be decreased. As a result, the electric properties and the reliability of the ultimately produced semiconductor or liquid crystal display may be improved. In addition, high integration may be reliably achieved. Examples of such resist composition include the resist composition of the first aspect which does not contain a polymeric compounds having a structural unit derived from a metal complex.

(Third Aspect: Resist Composition)

The resist composition according to a third aspect of the present invention is a resist composition which generates acid upon exposure and exhibits changed solubility in a developing solution under action of acid.

As one embodiment of such resist composition, for example, a resist composition including a base component (A') (hereafter, sometimes referred to as "component (A')") which exhibits changed solubility in a developing solution under action of acid, and a fluorine additive component (F') (hereafter, sometimes referred to as "component (F')") which exhibits decomposability to an alkali developing solution.

In the resist composition according to the present embodiment, the component (A') includes a polymeric compound (A1') including a structural unit derived from a compound represented by general formula (a0-1), and the fluorine additive component (F') including a fluorine resin component (F1') (hereafter, referred to as "component (F1')") having a structural unit (f1') containing a base dissociable group.

When a resist film is formed using the resist composition according to the present embodiment, and the resist film is selectively exposed, acid is generated at exposed portions of the resist film, and the solubility of the component (A) in a developing solution is changed by the action of the acid. On the other hand, at unexposed portions of the resist film, the solubility of the component (A) in a developing solution is unchanged. As a result, difference is generated between the exposed portions of the resist film and the unexposed portions of the resist film in terms of solubility in a developing solution. Therefore, by alkali developing the resist film, the unexposed portions are dissolved and removed, thereby forming a negative-tone resist pattern.

In the present specification, a resist composition which forms a positive resist pattern by dissolving and removing the exposed portions of the resist film is called a positive resist composition, and a resist composition which forms a negative resist pattern by dissolving and removing the unexposed portions of the resist film is called a negative resist composition.

The resist composition of the present embodiment is preferable for an alkali developing process in which an alkali developing solution is used in the developing treatment in the formation of a resist pattern.

The resist composition of the present embodiment is capable of generating acid upon exposure. The acid may be generated from the component (A') upon exposure, or the acid may be generated from an additive component other than the component (A') upon exposure.

More specifically, in the present embodiment, the resist composition may be a resist composition (1) containing an acid generator component (B') which generates acid upon exposure (hereafter, referred to as "component (B')"; a resist composition (2) in which the component (A') is a component which generates acid upon exposure; or a resist composition (3) in which the component (A') is a component which generates acid upon exposure, and further containing an acid generator component (B').

That is, when the resist composition of the present invention is the aforementioned resist composition (2) or (3), the component (A') is a "base component which generates acid upon exposure and exhibits changed solubility in a developing solution under action of acid". In the case where the component (A') is a base component which generates acid upon exposure and exhibits changed solubility in a developing solution under action of acid, the component (A1') described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, any conventionally known structural unit may be used. The resist composition of the present embodiment is most preferably the aforementioned resist composition (1).

<Component (A')>

The component (A') is a base component which exhibits changed solubility in a developing solution under action of acid. The component (A') is the same as defined for the component (A) in the resist composition of the first aspect.

Component (A1')

The component (A1') is a polymeric compound having a structural unit derived from a compound represented by general formula (a0-1) (structural unit (a0)). The component (A1') is the same as defined for the component (A1) in the resist composition of the first aspect.

In the resist composition of the third aspect, as the component (A'), "a base component which exhibits changed solubility in a developing solution under action of acid" other than the component (A1') may be used in combination.

<Component (F')>

The component (F') is a fluorine additive component which exhibits decomposability to an alkali developing solution.

Component (F1')

In the resist composition of the third aspect, the component (F') includes a fluorine resin component (F1') (component (F1')) having a structural unit (f1) containing a base dissociable group.

When a resist pattern is formed using a resist composition containing the component (F1'), the contrast between exposed portions and unexposed portions of the resist film is further improved.

The component (F1') is preferably a copolymer having, in addition to the structural unit (f1'), a structural unit (f2') containing a lactone-containing cyclic group.

Alternatively, the component (F1') is preferably a copolymer having, in addition to the structural unit (f1'), a structural unit (f3') derived from an (α-substituted) acrylate ester.

Furthermore, the component (F1') may include a structural unit other than the structural units (f1'), (f2') and (f3').

<<Structural Unit (f1')>>

The structural unit (f1') is a structural unit having a base dissociable group.

In the present invention, the term "base dissociable group" refers to an organic group which can be dissociated from the structural unit (f1') by the action of a base. Examples of the base include alkali developing solutions generally used in the fields of lithography. That is, the "base dissociable group" refers to a group which is dissociated by the action of an alkali developing solution (for example, a 2.38% by weight aqueous solution of tetramethylammonium hydroxide (TMAH) at 23° C.).

A base dissociable group dissociates due to hydrolysis caused by the action of an alkali developing solution. Therefore, in the formation of a resist pattern, the base dissociable group contained in the structural unit (f1') is dissociated and a hydrophilic is formed, so as to enhance the hydrophilicity of the resist film surface, and enhance the solubility of the unexposed portions of the resist film in an alkali developing solution. As a result, the contrast between the exposed portions and unexposed portions of the resist film is improved.

Specific examples of the base dissociable group include those represented by general formulas (II-1) to (II-5) shown below.

The base dissociable group contained in the structural unit (f1') is preferably at least one base dissociable group selected from those represented by general formulas (II-1) to (II-5) shown below. In consideration of improvement in hydrophilicity during alkali developing, and ease in synthesis, a group represented by general formula (II-1), (II-4) or (II-5) shown below is most preferable.

[Chemical Formula 63.]

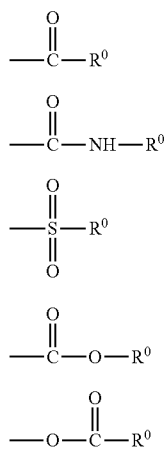

In the formulae, each $R^0$ independently represents an organic group which may have a fluorine atom.

In general formulae (II-1) to (II-5), each $R^0$ independently represents an organic group which may have a fluorine atom.

An "organic group" is a group containing at least one carbon atom.

The structure of $R^0$ may be linear, branched or cyclic, and is preferably linear or branched.

In $R^0$, the organic group preferably has 1 to 20 carbon atoms, more preferably 1 to 15 carbon atoms, still more preferably 1 to 10 carbon atoms, and most preferably 1 to 5 carbon atoms.

The fluorination ratio of $R^0$ is preferably 25% or more, more preferably 50% or more, and most preferably 60% or more.

The term "fluorination ratio" refers to the percentage (%) of the number of fluorine atoms based on the total number of hydrogen atoms and fluorine atoms contained within the organic group.

As a preferable example of $R^0$, a fluorinated hydrocarbon group which may or may not have a substituent such as a methyl group or an ethyl group can be given.

With respect to the fluorinated hydrocarbon group for $R^0$ which may have a substituent, the hydrocarbon group may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^0$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom. The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decyl group.

The unsubstituted branched alkyl group preferably has 3 to 10 carbon atoms, and more preferably 3 to 8. Among these examples, as the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecyl group and a tetracyclododecyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include an alkyl group of 1 to 5 carbon atoms.

As the fluorinated alkyl group for $R^0$, a linear or branched fluorinated alkyl group is preferable. In particular, a group represented by general formula (III-1) or (III-2) shown below is desirable, and a group represented by general formula (III-1) is most preferable.

[Chemical Formula 64.]

-continued

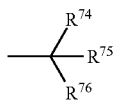
(III-2)

In formula (III-1), $R^{41'}$ represents an unsubstituted alkylene group of 1 to 9 carbon atoms; $R^{42'}$ represents a fluorinated alkylene group of 1 to 9 carbon atoms; provided that the total number of carbon atoms of $R^{41'}$ and $R^{42'}$ is no more than 10. In formula (III-2), each of $R^{74}$ to $R^{76}$ independently represents a linear alkyl group of 1 to 5 carbon atoms, with the provision that at least one of $R^{74}$ to $R^{76}$ represents an alkyl group having a fluorine atom.

In general formula (III-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched alkyl group of 1 to 5 carbon atoms is preferable. Preferable examples include a trifluoromethyl group (—$CF_3$), a tetrafluoroethyl group (—$C_2F_4H$), and —$C_2F_5$.

In general formula (III-2), as the alkyl group for $R^{74}$ to $R^{76}$, an ethyl group or a methyl group is preferable, and a methyl group is particularly desirable. At least one of the alkyl groups for $R^{74}$ to $R^{76}$ is a fluorinated alkyl group, and all of the alkyl groups for $R^{74}$ to $R^{76}$ may be fluorinated alkyl groups.

The component (F1') preferably contains, as the structural unit (f1'), a structural unit represented by general formula (f1'-1) shown below, or a structural unit represented by general formula (f1'-2) shown below.

[Chemical Formula 65.]

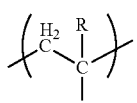
(f1'-1)

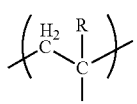
(f1'-2)

In the formula, each R independently represents a hydrogen atom, an alkyl group of 1 to 5 carbon atoms or a halogenated alkyl group of 1 to 5 carbon atoms; X represents a divalent linking group having no acid dissociable portion; $A_{aryl}$ represents a divalent aromatic cyclic group which may have a substituent; $X_{01}$ represents a single bond or a divalent linking group; and each $R^2$ independently represents an organic group having a fluorine atom.

In formulae (f1'-1) and (f1'-2), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and in terms of industrial availability, a hydrogen atom or a methyl group is more preferable, and a methyl group is still more preferable.

In formula (f1'-1), X represents a divalent linking group having no acid dissociable portion.

An "acid dissociable portion" refers to a portion within the organic group which is dissociated from the organic group by the action of acid generated upon exposure.

Examples of the divalent linking group having no acid dissociable portion for X include a divalent hydrocarbon group which may have a substituent, and a divalent group containing a hetero atom.

Hydrocarbon Group which may have a Substituent

With respect to X, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group.

An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Linear or Branched Aliphatic Hydrocarbon Group

The linear or branched aliphatic hydrocarbon group preferably has 1 to 10 carbon atoms, more preferably 1 to 8, still more preferably 1 to 5, and most preferably 1 to 3.

As a linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As a branched aliphatic hydrocarbon group, a branched alkylene group is preferable, and specific examples include alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$CH(CH_2CH_3)CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated lower alkyl group of 1 to 5 carbon atoms, and an oxygen atom (=O).

Aliphatic Hydrocarbon Group Containing a Ring in the Structure Thereof

As examples of the aliphatic hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Aromatic Hydrocarbon Group

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms (—$CH_2$—) constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

Among these examples, the aforementioned divalent aromatic hydrocarbon group is preferable, and an aromatic hydrocarbon group in which one hydrogen atom has been removed from a phenyl group, or an aromatic hydrocarbon group in which one hydrogen atom has been removed from a naphthyl group is particularly desirable.

The alkyl chain within the arylalkyl group preferably has 1 to 4 carbon atom, more preferably 1 or 2, and most preferably 1.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Among the above-mentioned examples, as the hydrocarbon group which may have a substituent, a linear, branched or cyclic aliphatic hydrocarbon group or a divalent aromatic hydrocarbon group is preferable, and a methylene group, and ethylene group, —$CH(CH_3)$—, a group in which one hydrogen atom has been removed from a tetracyclododecyl group, or an aromatic hydrocarbon group in which one hydrogen atom has been removed from a phenyl group is particularly desirable.

Among these examples, a methylene group, an ethylene group or —$CH(CH_3)$— is most preferable.

Divalent Linking Group Containing a Hetero Atom

A hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—, —C(=O)—O—, —O—C(=O)—, a carbonate bond (—O—C(=O)—O—), —NH—, —$NR^{04}$— (wherein $R^{04}$ represents an alkyl group), —NH—C(=O)—, =N—, and a combination of any of these "groups" with a divalent hydrocarbon group.

As examples of the divalent hydrocarbon group, the same groups as those described above for the hydrocarbon group which may have a substituent can be given, and a linear or branched aliphatic hydrocarbon group is preferable.

Among the above-mentioned examples, as the divalent linking group containing a hetero atom, a combination of any of the aforementioned "groups" with a divalent hydrocarbon group is preferable. More specifically, it is particularly desirable to use a combination of any of the aforementioned "groups" with the aforementioned aliphatic hydrocarbon group, or a combination of the aforementioned aliphatic hydrocarbon group, any of the aforementioned "groups" and the aforementioned aliphatic hydrocarbon group.

Among these examples, as X, a divalent hydrocarbon group which may have a substituent is preferable, and a linear, branched or cyclic aliphatic hydrocarbon group is more preferable.

In general formula (f1'-2), $A_{aryl}$ represents a divalent aromatic cyclic group which may have a substituent. A specific example of $A_{aryl}$ includes an aromatic hydrocarbon ring (which may have a substituent) having two hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of substituents for the aromatic cyclic group represented by $A_{aryl}$ include a halogen atom, an alkyl group, an alkoxy group, a halogenated alkyl group of 1 to 5 carbon atoms, and an oxygen atom (=O). Examples of the halogen atom include a fluorine atom, a chlorine atom, an iodine atom and a bromine atom. As the substituent for the aromatic cyclic group represented by $A_{aryl}$, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ represents an aromatic cyclic group having a substituent, the number of the substituent may be 1 or more, preferably 1 or 2, and more preferably 1.

In general formula (f1'-2), $X^{01}$ represents a single bond or a divalent linking group. Examples of divalent linking groups include an alkylene group of 1 to 10 carbon atoms, —O—, —C(=O)—, —C(=O)—O—, —O—C(=O)—, a carbonate bond (—O—C(=O)—O—), —NH—C(=O)—, and a combination of these groups. Of these, a combination of —O— with an alkylene group of 1 to 10 carbon atoms is particularly desirable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

In the formulae (f1'-1) and (f1'-2), $R^2$ represents an organic group having a fluorine atom.

Examples of R² include the fluorinated hydrocarbon group which may have a substituent for R⁰ in the aforementioned general formulae (II-1) to (II-5). As $R^2$, a fluorinated saturated hydrocarbon group (i.e., fluorinated alkyl group) is more preferable, a group represented by general formula (III-1) or (III-2) is still more preferable, and a group represented by general formula (III-1) is most preferable.

Among structural units represented by general formula (f1'-1), structural units represented by general formulas (f1'-11) to (f1'-15) shown below are preferable.

Among structural units represented by general formula (f1'-2), structural units represented by general formulas (f1'-21) to (f1'-27) shown below are preferable.

[Chemical Formula 66.]

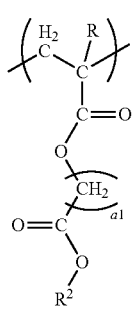

(f1'-11)

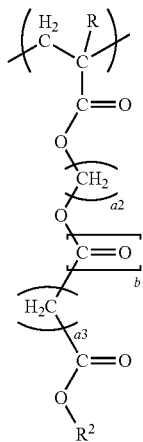

(f1'-12)

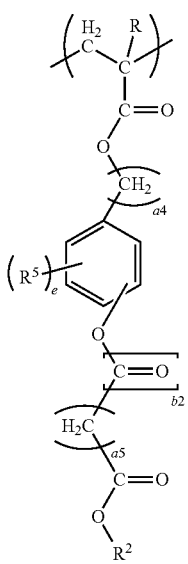

(f1'-13)

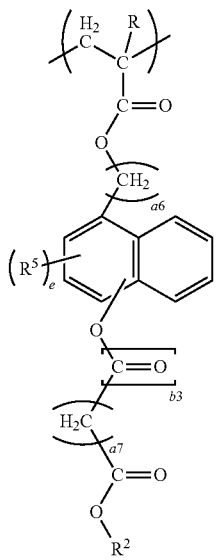

(f1'-14)

[Chemical Formula 67.]

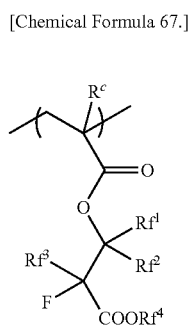

(f1'-15)

[Chemical Formula 68.]

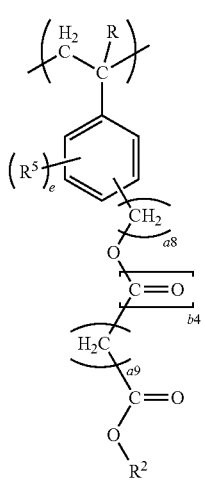

(f1'-21)

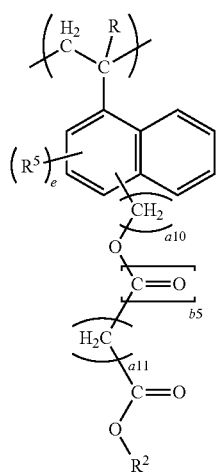
(f1'-22)

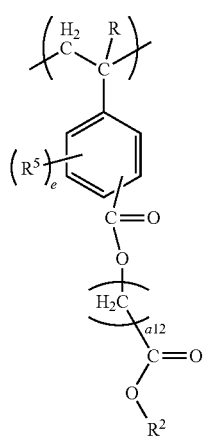
(f1'-23)

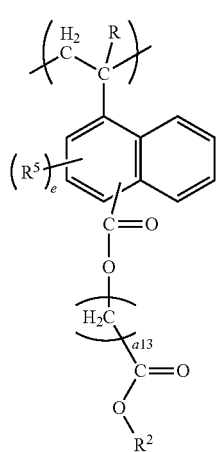
(f1'-24)

[Chemical Formula 69.]

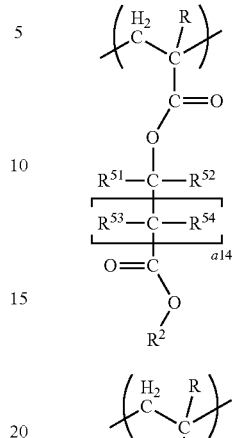
(f1'-25)

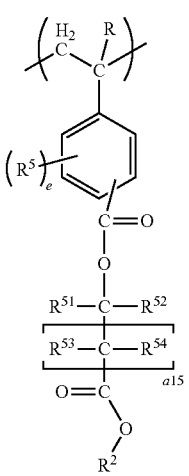
(f1'-26)

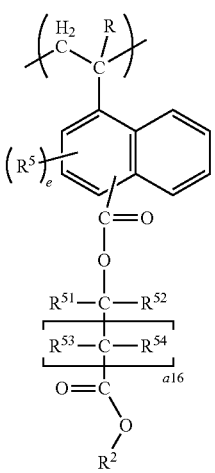
(f1'-27)

In general formulae (f1'-11) to (f1'-14), (f1'-21) to (f1'-24) and (f1'-25) to (f1'-27), R and $R^2$ are the same as defined for R and $R^2$ in the aforementioned general formulae (f1'-1) and (f1'-2).

$R^{51}$ and $R^{52}$ each independently represents an alkyl group of 1 to 10 carbon atoms.

$R^{53}$ and $R^{54}$ each independently represents a hydrogen atom or an alkyl group of 1 to 10 carbon atoms.

a1, a2, a3, a5, a7, a9, and a11 to a13 each independently represents an integer of 1 to 5.

a4, a6, a8 and a10 each independently represents an integer of 0 to 5.

a14 to a16 each independent represents an integer of 0 to 5.

b1 to b5 each independently represents 0 or 1.

$R^5$ represents a substituent.

e represents an integer of 0 to 2.

In formulae (f1'-11) to (f1'-14), (f1'-21) to (f1'-24) and (f1'-25) to (f1'-27), as R, a hydrogen atom or a methyl group is preferable.

In formula (f1'-11), a1 is preferably an integer of 1 to 3, and more preferably 1 or 2.

In general formula (f1'-12), it is preferable that each of a2 and a3 independently represent an integer of 1 to 3, more preferably 1 or 2.

In general formula (f1'-13), a4 is preferably an integer of 0 to 3, more preferably an integer of 0 to 2, and most preferably 0 or 1.

a5 is preferably an integer of 1 to 3, and more preferably 1 or 2.

Examples of the substituent represented by $R^5$ include a halogen atom, an alkyl group of 1 to 5 carbon atoms, an alkoxy group of 1 to 5 carbon atoms, a halogenated alkyl group of 1 to 5 carbon atoms and an oxygen atom (=O). Examples of the alkyl group of 1 to 5 carbon atoms include the same alkyl group of 1 to 5 carbon atoms as those described above for R. Examples of the halogen atom include a fluorine atom, a chlorine atom, an iodine atom and a bromine atom. Examples of the halogenated alkyl group of 1 to 5 carbon atoms include the same halogenated alkyl group of 1 to 5 carbon atoms as those described above for R.

e is preferably 0 or 1, and most preferably 0 from an industrial viewpoint.

b2 is preferably 0.

In general formula (f1'-14), a6 is preferably an integer of 0 to 3, more preferably an integer of 0 to 2, and most preferably 0 or 1.

a7 is preferably an integer of 1 to 3, and more preferably 1 or 2.

b3 is preferably 0.

$R^5$ and e are the same as defined above.

In general formula (f1'-21), a8 is preferably an integer of 0 to 3, more preferably an integer of 0 to 2, and most preferably 0 or 1.

a9 is preferably an integer of 1 to 3, and more preferably 1 or 2.

b4 is preferably 0.

$R^5$ and e are the same as defined above.

In general formula (f1'-22), a10 is preferably an integer of 0 to 3, more preferably an integer of 0 to 2, and most preferably 0 or 1.

a11 is preferably an integer of 1 to 3, and more preferably 1 or 2.

b5 is preferably 0.

$R^5$ and e are the same as defined above.

In formula (f1'-23), a12 is preferably an integer of 1 to 3, and more preferably 1 or 2. $R^5$ and e are the same as defined above.

In formula (f1'-24), a13 is preferably an integer of 1 to 3, and more preferably 1 or 2. $R^5$ and e are the same as defined above.

In general formulae (f1'-25) to (f1'-27), it is preferable that each of a14, a15 and a16 independently represent 0 to 3, more preferably 0 to 2, and most preferably 0 or 1.

It is preferable that each of $R^{51}$ and $R^{52}$ independently represents a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-amyl group, a cyclopentyl group, a cyclohexyl group, a cyclooctyl group, a norbornyl group, an isobornyl group, a tricyclodecyl group, an adamantyl group and a tetracyclododecyl group. Of these, an alkyl group of 1 to 6 carbon atoms is preferable, more preferably an alkyl group of 1 to 4 carbon atoms, and most preferably a methyl group or an ethyl group.

It is preferable that each of $R^{53}$ and $R^{54}$ independently represents a hydrogen atom, or a linear, branched or cyclic alkyl group of 1 to 10 carbon atoms. For $R^{53}$ and $R^{54}$, the linear, branched or cyclic alkyl group of 1 to 10 carbon atoms is the same as defined above for $R^{51}$ and $R^{52}$.

In general formulas (f1'-26) and (f1'-27), $R^5$ and e are the same as defined above.

In general formula (f1'-15), $R^C$ represents a hydrogen atom or a methyl group.

$Rf^1$ to $Rf^2$ each independently represents a hydrogen atom, an alkyl group of 1 to 4 carbon atoms or a fluorinated alkyl group of 1 to 4 carbon atoms.

The alkyl group of 1 to 4 carbon atoms for $Rf^1$ and $Rf^2$ may be linear, branched or cyclic, and a linear or branched alkyl group is preferable. Specific examples thereof include a methyl group and an ethyl group, and an ethyl group is particularly desirable.

The fluorinated alkyl group of 1 to 4 carbon atoms for $Rf^1$ and $Rf^2$ is an alkyl group of 1 to 4 carbon atoms in which part or all of the hydrogen atoms have been substituted with a fluorine atom. In the fluorinated alkyl group, the alkyl group prior to being substituted with a fluorine atom may be linear, branched or cyclic, and examples thereof include the same groups as those described above for the "alkyl group of 1 to 4 carbon atoms for $Rf^1$ and $Rf^2$"

Among these, as $Rf^1$ and $Rf^2$, a hydrogen atom or an alkyl group of 1 to 4 carbon atoms is preferable, and it is particularly desirable that one of $Rf^1$ and $Rf^2$ represents a hydrogen atom, and the other represents an alkyl group of 1 to 4 carbon atoms.

In general formula (f1'-15), $Rf^3$ represents a fluorine atom or a fluorinated alkyl group of 1 to 4 carbon atoms.

The fluorinated alkyl group of 1 to 4 carbon atoms represented by $Rf^3$ is the same as defined for the "fluorinated alkyl group of 1 to 4 carbon atoms for $Rf^1$ and $Rf^2$", preferably having 1 to 3 carbon atoms, and more preferably having 1 or 2 carbon atoms.

In the fluorinated alkyl group represented by $Rf^3$, the percentage of the number of fluorine atoms based on the total number of hydrogen atoms and fluorine atoms (fluorination ratio (%)) is preferably 30 to 100%, and more preferably 50 to 100%. The higher the fluorination ratio, the higher the hydrophobicity of the resist film.

In general formula (f1'-15), $Rf^4$ represents a linear or branched alkyl group of 1 to 4 carbon atoms or a linear fluorinated alkyl group of 1 to 4 carbon atoms, and a linear alkyl group of 1 to 4 carbon atoms or a linear fluorinated alkyl group of 1 to 4 carbon atoms is preferable.

Specific examples of the alkyl group for $Rf^4$ include a methyl group, an ethyl group, a propyl group, an isopropyl group, an n-butyl group, an isobutyl group and a tert-butyl group. Among these, a methyl group or an ethyl group is preferable, and a methyl group is particularly desirable.

Specific examples of preferable fluorinated alkyl group for $Rf^4$ include —$CH_2$—$CF_3$, —$CH_2$—$CF_2$—$CF_3$, and —$CH_2$—$CF_2$—$CF_2$—$CF_3$. Among these examples, —$CH_2$—$CF_3$ is most preferable.

Specific examples of structural units represented by general formulae (f1'-11) to (f1'-15) and (f1'-21) to (f1'-27) are shown below.

[Chemical Formula 70.]

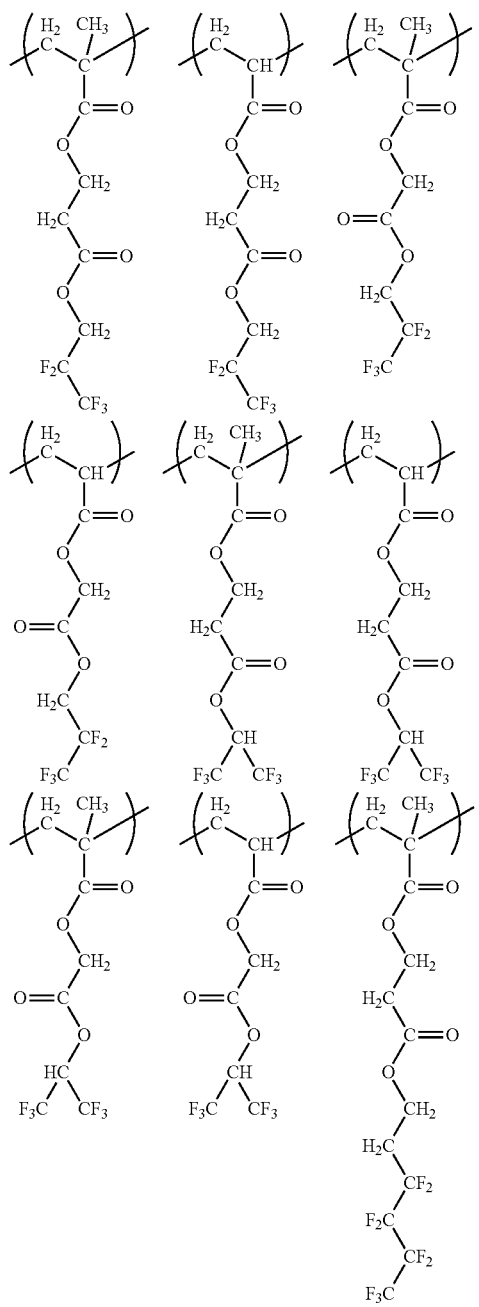

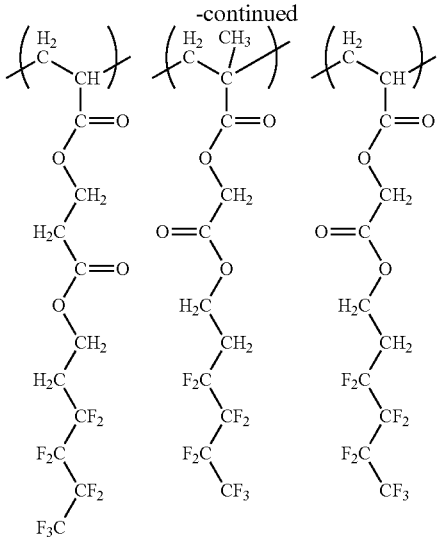

[Chemical Formula 71.]

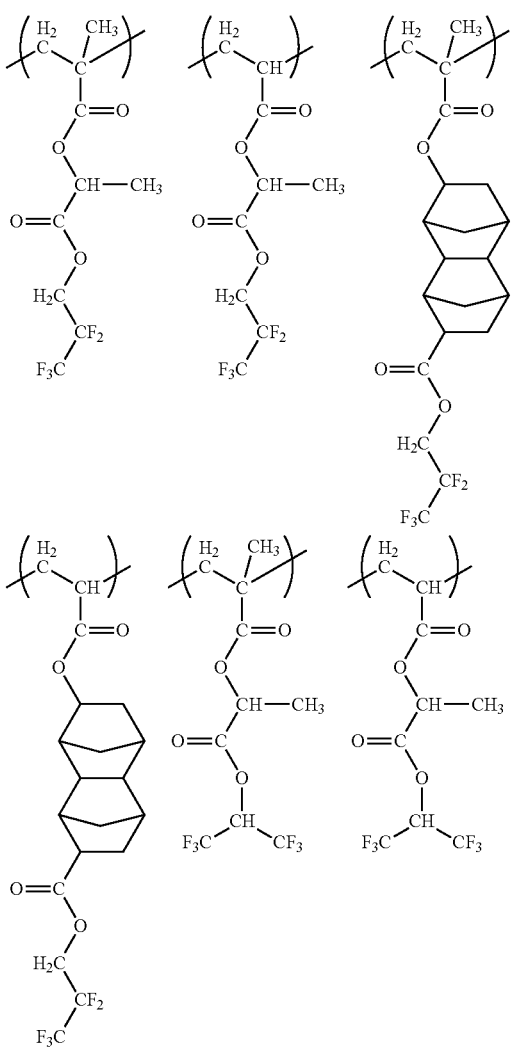

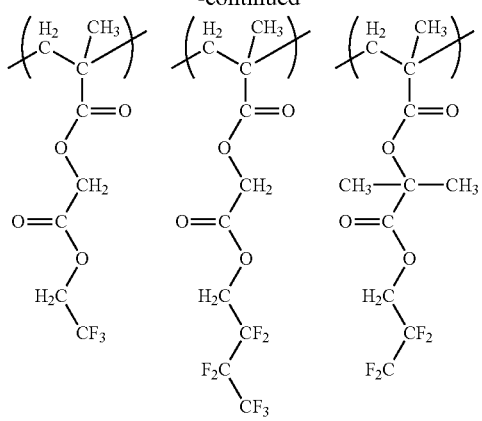
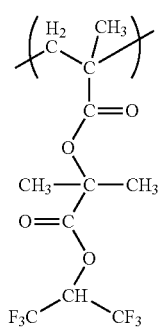
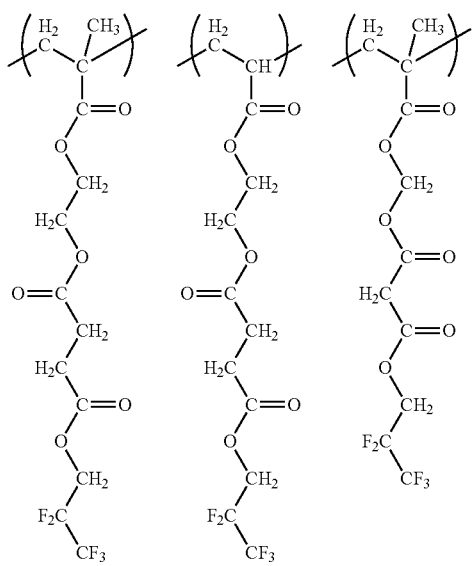
[Chemical Formula 72.]
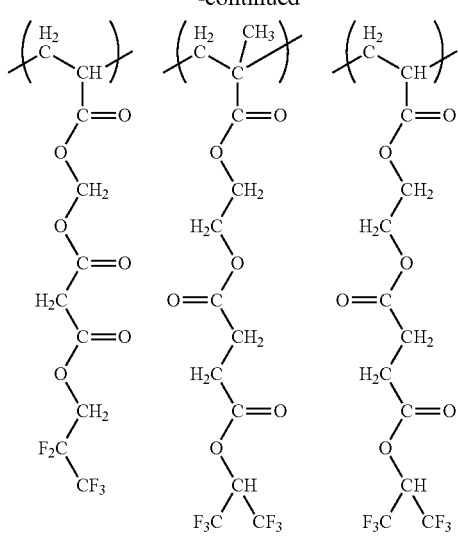
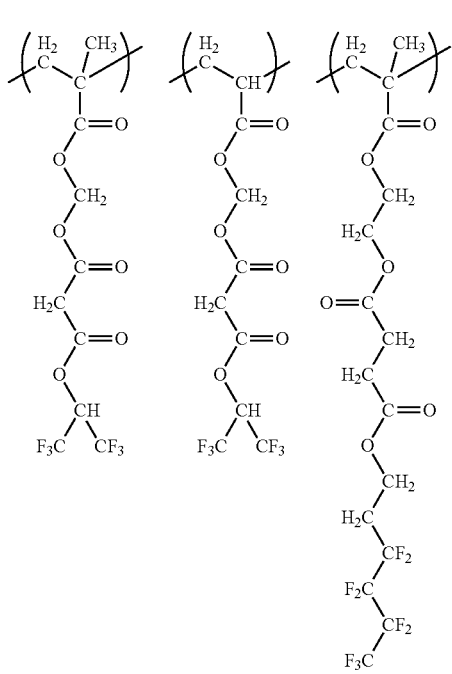

129
-continued
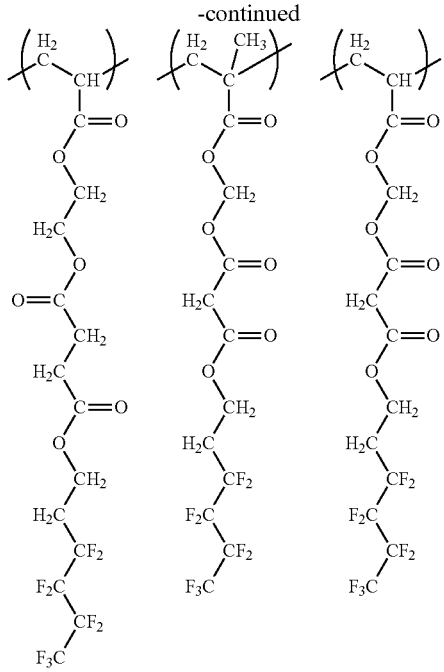
[Chemical Formula 73.]
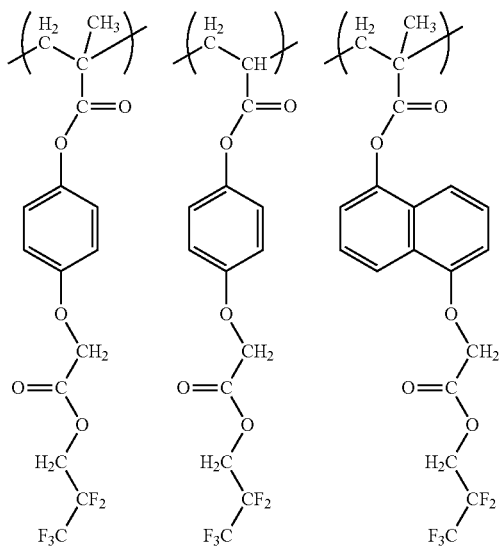
130
-continued
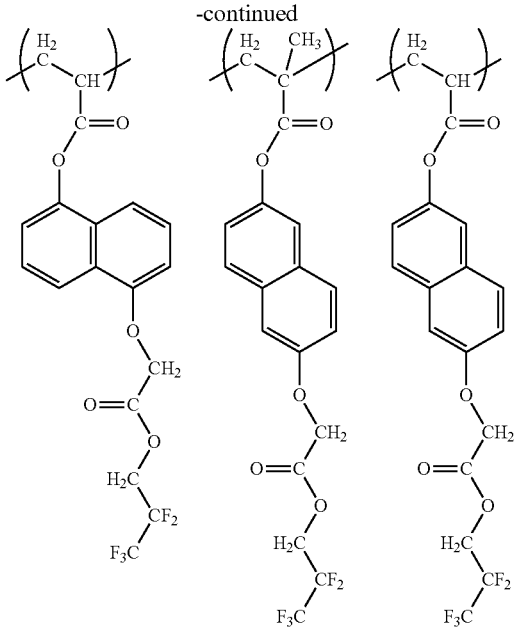
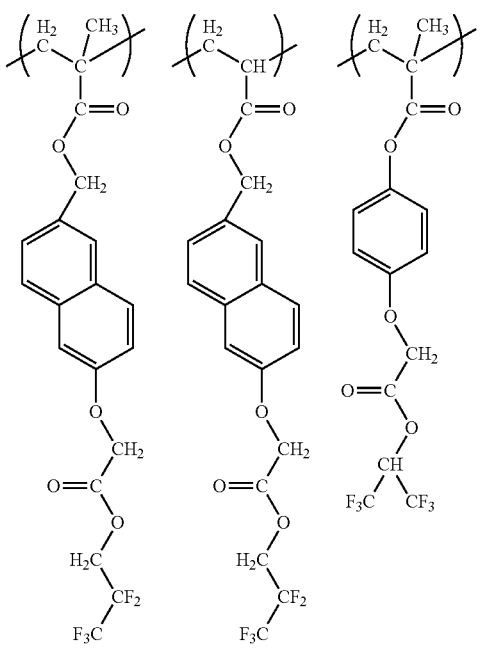

131
-continued
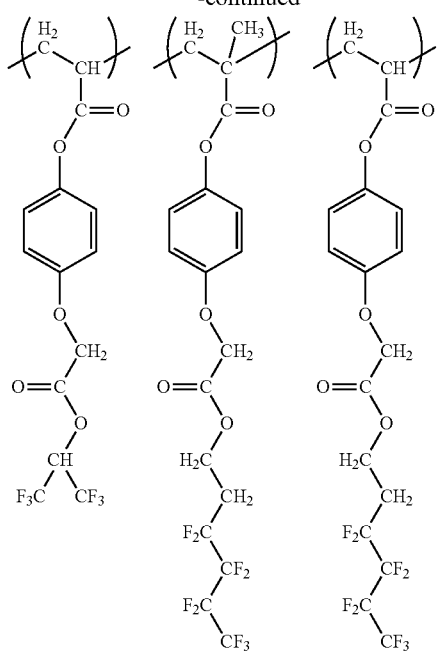
[Chemical Formula 74.]
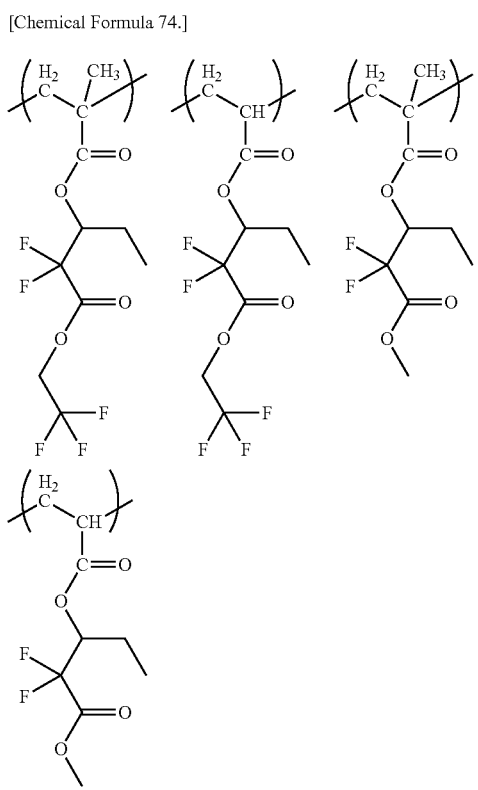
132
-continued
[Chemical Formula 75.]
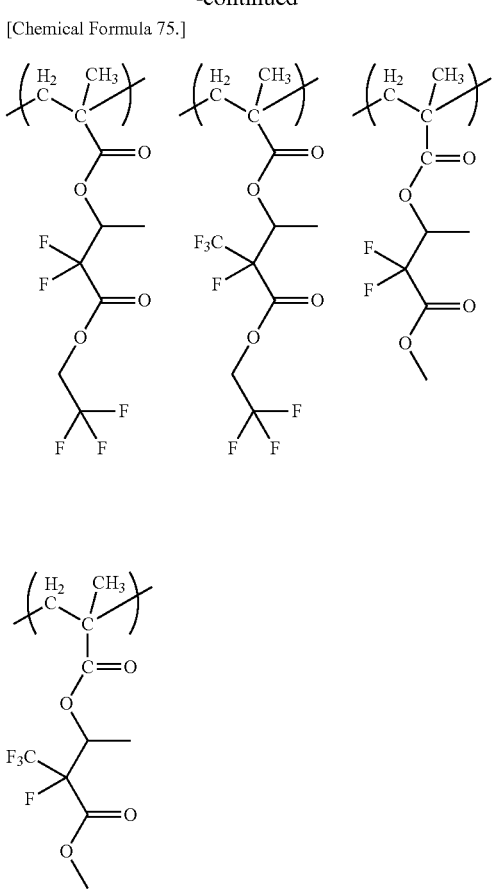
[Chemical Formula 76.]
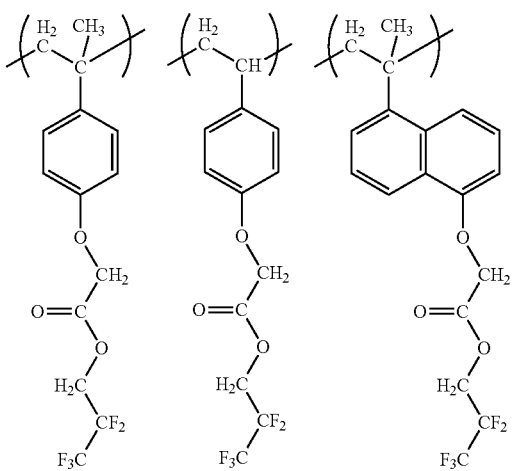

-continued

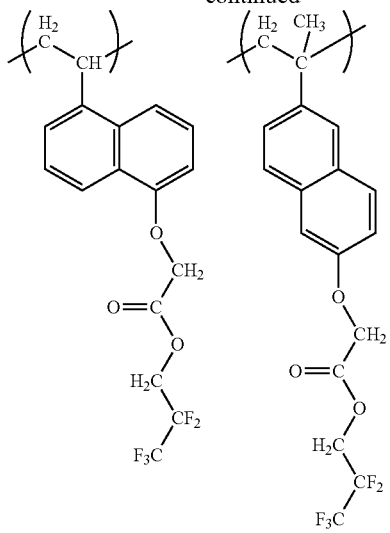
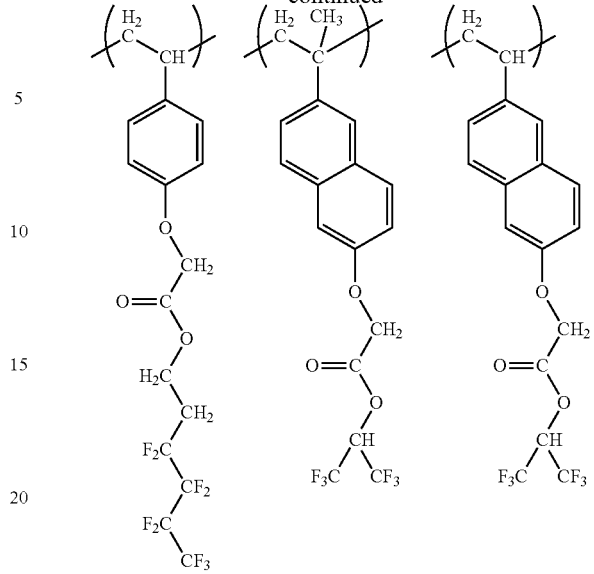

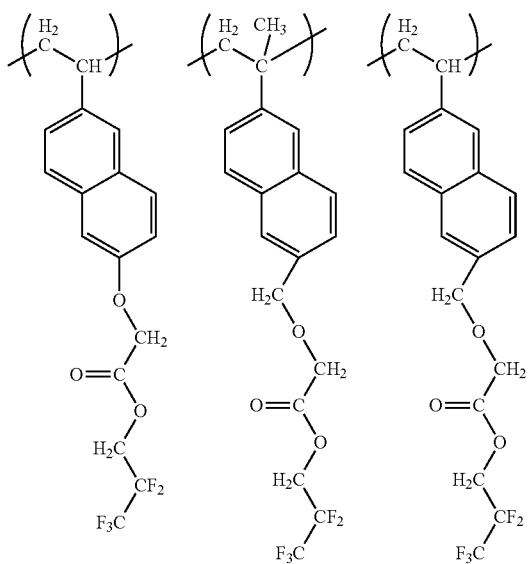

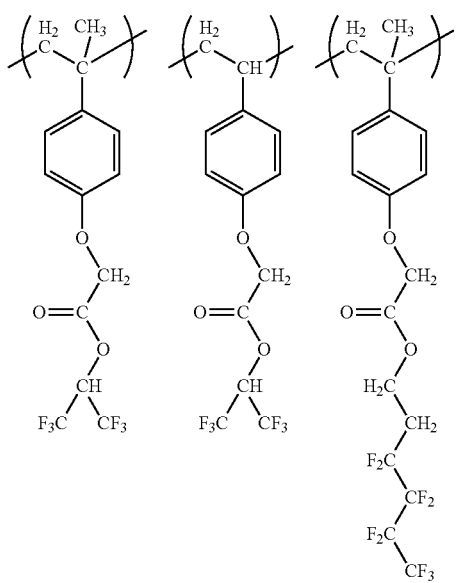

As the structural unit (f1'-1), at least one structural unit selected from the group consisting of structural units represented by the aforementioned general formulae (f1'-1-11) to (f1'-1-15) and (f1'-1-21) to (f1'-1-24) is preferable, more preferably at least one structural unit selected from the group consisting of structural units represented by the aforementioned general formulae (f1'-1-11) to (f1'-1-13), (f1'-1-15), (f1'-1-21) and (f1'-1-22), still more preferably at least one structural unit selected from the group consisting of structural units represented by the aforementioned general formulae (f1'-1-11), (f1'-1-15) and (f1'-1-22), and most preferably structural units represented by the aforementioned general formula (f1'-1-11).

In the component (F1'), as the structural unit (f1'), one kind of structural unit may be used alone, or two or more kinds of structural units may be used in combination.

In the component (F1'), the amount of the structural unit (f1') based on the combined total (100 mol %) of all structural units constituting the component (F1') is preferably 10 to 100 mol %, more preferably 30 to 90 mol %, and most preferably 55 to 85 mol %. When the amount of the structural unit (f1') is at least as large as the lower limit of the above-mentioned range, in the formation of a resist pattern, the hydrophilicity of the resist film surface is enhanced, and the solubility of the unexposed portions of the resist film in an alkali developing solution is enhanced. Further, generation of defects caused by substance adhered to the surface of the resist film may be reduced. On the other hand, when the amount of the structural unit (f1') is no more than the upper limit of the above-mentioned range, a good balance can be achieved with the other structural units.

<<Structural Unit (f2')>>

The component (F1') is preferably a copolymer having, in addition to the structural unit (f1'), a structural unit (f2') containing a lactone-containing cyclic group.

When the component (F1') is used for forming a resist film, the lactone-containing cyclic group within the structural unit (f2') is effective in improving the adhesion between the resist film and the substrate. Further, by virtue of including the structural unit (f2'), in an alkali developing process, during developing, the solubility of the resist film in an alkali developing is enhanced.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group for the structural unit (f2'), the same lactone-containing cyclic groups as those described above as examples of the cyclic hydrocarbon group for $R^{101}$ in the aforementioned formula (b1) may be mentioned.

As the structural unit (f2'), a structural unit derived from an acrylate ester which may have the hydrogen atom bonded to the carbon atom on the α-position substituted with a substituent is preferable.

The structural unit (f2') is preferably a structural unit represented by general formula (f2'-1) shown below.

[Chemical Formula 77.]

(f2'-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; R' represents a hydrogen atom or a methyl group; provided that, when $La^{21}$ represents —O—, $Ya^{21}$ does not represent —CO—; and $Rf^{21}$ represents a lactone-containing cyclic group.

In formula (f2'-1), R represents a hydrogen atom, an alkyl group of 1 to 5 carbon atoms or a halogenated alkyl group of 1 to 5 carbon atoms. As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable. As R, a hydrogen atom, an alkyl group of 1 to 5 carbon atoms or a fluorinated alkyl group of 1 to 5 carbon atoms is preferable, and in terms of industrial availability, a hydrogen atom or a methyl group is more preferable, and a methyl group is still more preferable.

In formula (f2'-1), $Ya^{21}$ represents a single bond or a divalent linking group.

As the divalent linking group for $Ya^{21}$, the same divalent linking groups (divalent hydrocarbon group which may have a substituent, divalent linking group containing a hetero atom) as those described above for $Ya^{x0}$ in the aforementioned structural unit (a0) may be mentioned. Among these examples, as $Ya^{21}$, a single bond, an ester bond [—C(=O)—O—], an ether bond (—O—), a linear or branched alkylene group, or a combination thereof is preferable.

In formula (f2'-1), $La^{21}$ represents —O—, —COO—, —CON(R')—, —OCO—, —CONHCO— or —CONHCS—. R' represents a hydrogen atom or a methyl group. When $La^{21}$ represents —O—, $Ya^{21}$ does not represent —CO—.

In formula (f2'-1), $Rf^{21}$ represents a lactone-containing cyclic group. Preferable examples of the lactone-containing cyclic group for $Rf^{21}$ include groups represented by the aforementioned general formulae (a2-r-1) to (a2-r-7). Among these examples, a group represented by the aforementioned general formula (a2-r-1), (a2-r-2) or (a2-r-6) is preferable, and a group represented by the aforementioned general formula (a2-r-1) is more preferable. Specifically, a group represented by any of chemical formulae (r-lc-1-1) to (r-lc-1-7), (r-lc-2-1) to (r-lc-2-18) or (r-lc-6-1) is still more preferable.

As the structural unit (f2') contained in the component (F1'), 1 kind of structural unit may be used, or 2 or more kinds may be used.

When the component (F1') includes the structural unit (f2'), the amount of the structural unit (f2') based on the combined total (100 mol %) of all structural units constituting the component (F1') is preferably 5 to 60 mol %, more preferably 10 to 50 mol %, and still more preferably 15 to 45 mol %.

When the amount of the structural unit (f2') is at least as large as the lower limit of the above-mentioned range, in an alkali developing process, the solubility of the resist film in an alkali developing solution may be reliably enhanced. Further, defects may be reduced. On the other hand, when the amount of the structural unit (f2') is no more than the upper limit of the above-mentioned range, a good balance can be achieved with the other structural units.

<<Structural Unit (f3')>>

The component (F1') is preferably a copolymer having, in addition to the structural unit (f1'), a structural unit (f3') derived from an (α-substituted) acrylate ester.

As the structural unit (f3'), a structural unit represented by general formula (f3'-1) shown below is preferable.

[Chemical Formula 78.]

(f3'-1)

In the formula, R represents a hydrogen atom, an alkyl group of 1 to 5 carbon atoms or a halogenated alkyl group of 1 to 5 carbon atoms.

In formula (f3'-1), R represents a hydrogen atom, an alkyl group of 1 to 5 carbon atoms or a halogenated alkyl group of 1 to 5 carbon atoms. As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable. As R, a hydrogen atom, an alkyl group of 1 to 5 carbon atoms or a fluorinated alkyl group of 1 to 5 carbon atoms is preferable, and in terms of industrial availability, a hydrogen atom or a methyl group is more preferable, and a methyl group is still more preferable.

As the structural unit (f3') contained in the component (F1'), 1 kind of structural unit may be used, or 2 or more kinds may be used.

When the component (F1') includes the structural unit (f3'), the amount of the structural unit (f3') based on the combined total (100 mol %) of all structural units constituting the component (F1') is preferably 5 to 60 mol %, more preferably 10 to 50 mol %, and still more preferably 15 to 45 mol %.

When the amount of the structural unit (f3') is at least as large as the lower limit of the above-mentioned range, in an alkali developing process, the solubility of the resist film in an alkali developing solution may be reliably enhanced. Further, generation of defects may be reduced. On the other hand, when the amount of the structural unit (f3') is no more than the upper limit of the above-mentioned range, a good balance can be achieved with the other structural units.

<<Other Structural Units>>

The component (F1') may include a structural unit other than the structural units (f1'), (f2') and (f3').

The other structural units are not particularly limited, as long as they do not fall under the definition of the above structural units, and a multitude of the conventionally known structural units usable in a resin for resist for ArF excimer lasers or KrF excimer lasers (and particularly for ArF excimer lasers) may be used.

Structural Unit (f4'):

The component (F1') may include, in addition to the structural unit (f1'), a structural unit (f4') derived from an (a-substituted) acrylate ester containing an acid dissociable group.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a polar group containing $-OH$ in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (F1') is increased. By the increase in the polarity, the solubility in an alkali developing solution changes and, the solubility in an alkali developing solution is relatively increased.

Preferable examples of the structural unit (f4') include at least one structural unit selected from the group consisting of structural units represented by general formula (f4'-1) or (f4'-2) shown below.

[Chemical Formula 79.]

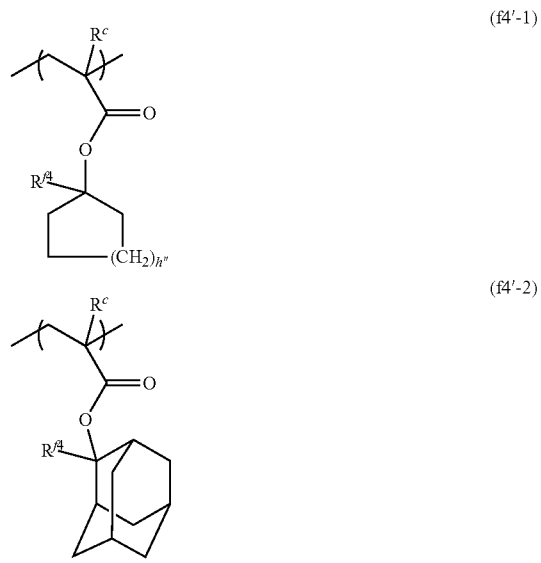

In the formulae, each $R^C$ independently represents a hydrogen atom or a methyl group; each $R^{f4}$ independently represents an alkyl group having 1 to 5 carbon atoms; and h" represents an integer of 1 to 4.

In general formulae (f4'-1) and (f4'-2), each $R^{f4}$ independently represents an alkyl group having 1 to 5 carbon atoms. Specific examples thereof include linear or branched alkyl groups such as a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is more preferable.

In formula (f4'-1), h" represents an integer of 1 to 4, preferably 1 or 2, and more preferably 1.

When the component (F1') includes the structural unit (f4'), the amount of the structural unit (f4') based on the combined total (100 mol %) of all structural units constituting the component (F1') is preferably 5 to 50 mol %, more preferably 5 to 40 mol %, and still more preferably 5 to 35 mol %.

When the amount of the structural unit (f4') is at least as large as the lower limit of the above-mentioned range, the solubility of the exposed portions of the resist film in an alkali developing solution may be enhanced. On the other hand, when the amount of the structural unit (f4') is no more than the upper limit of the above-mentioned range, a good balance can be achieved with the other structural units.

In the resist composition of the present embodiment, the component (F') contains a polymeric compound (F1') (component (F1')) having a structural unit (f1').

Preferable examples of the component (F1') include a polymer (homopolymer) consisting of the structural unit (f1'), a copolymer having a repeating structure of the structural units (f1') and (f2'), a copolymer having a repeating structure of the structural units (f1') and (f3'), and a copolymer having a repeating structure of the structural units (f1'), (f2') and (f3').

The component (F1') can be obtained, for example, by a conventional radical polymerization or the like of the monomers corresponding with the desired structural units, using a radical polymerization initiator such as azobisisobutyronitrile (AIBN) or dimethyl 2,2'-azobis(isobutyrate).

The weight average molecular weight (Mw) (the polystyrene equivalent value determined by gel permeation chromatography) of the component (F1') is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F1') is preferably 1.0 to 5.0, more preferably 1.0 to 3.0, and most preferably 1.2 to 2.5.

In the resist composition of the present embodiment, as the component (F1'), one kind of compound may be used, or two or more kinds of compounds may be used in combination.

In the resist composition of the present embodiment, as the component (F'), a fluorine additive component which does not fall under the definition of the component (F1') and exhibits decomposability to an alkali developing solution may be used in combination.

In the component (F'), the amount of the component (F1') based on the total weight of the component (F') is preferably 25% by weight or more, more preferably 50% by weight or more, still more preferably 75% by weight or more, and may be even 100% by weight. When the amount of the component (F1') is 25% by weight or more, in the formation of a resist pattern, the contrast between the exposed portions and unexposed portions of the resist film may be more reliably enhanced.

In the resist composition of the present embodiment, as the component (F'), one kind of compound may be used, or two or more kinds of compounds may be used in combination.

In the resist composition of the present embodiment, the amount of the component (F') relative to 100 parts by weight of the component (A') is preferably within a range from 0.5 to 10 parts by weight, more preferably from 0.5 to 8 parts by weight, and still more preferably from 1 to 5 parts by weight.

When the amount of the component (F') is at least as large as the lower limit of the above-mentioned range, the solubility of the unexposed portions of the resist film in an alkali developing solution may be more reliably enhanced, and the resolution performance is enhanced. Further, generation of defects can be suppressed. On the other hand, when the amount of the component (F') is no more than the upper limit of the above-mentioned range, lithography properties are improved.

<Optional Components>

The resist composition of the third aspect may contain, in addition to the aforementioned components (A') and (F'), any other optional components.

Examples of the optional component include components (B'), (D'), (C'), (E') and (S').

<<Component (B')>>

The resist composition of the present embodiment may include, in addition to the components (A') and (F'), an acid-generator component (hereafter, sometimes referred to as "component (B')").

As the component (B'), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, for example, the component (b-1), (b-2) or (b-3) in the resist composition of the first aspect may be used.

In the resist composition of the third aspect, as the component (B'), one kind of compound may be used, or two or more kinds of compounds may be used in combination.

In the resist composition of the third aspect, the amount of the component (B') relative to 100 parts by weight of the component (A') is preferably within a range from 1 to 40 parts by weight, more preferably from 5 to 35 parts by weight, and still more preferably from 9 to 30 parts by weight.

When the amount of the component (B') is at least as large as the lower limit of the above-mentioned range, in the formation of a resist pattern, various lithography properties such as sensitivity, resolution, LWR (line width roughness) and pattern shape are improved. On the other hand, when the amount of the component (B') is no more than the upper limit of the above-mentioned range, when each of the components are dissolved in an organic solvent, a homogeneous solution may be more reliably obtained and the storage stability of the resist composition is improved.

<<Component (D')>>

The resist composition of the third aspect may include, in addition to the components (A') and (F'), an acid diffusion control component (hereafter, sometimes referred to as "component (D')") which controls diffusion of acid generated upon exposure.

The component (D') is the same as defined for the component (D) in the resist composition of the first aspect, and examples thereof include the components (D1) and (D2).

In the resist composition of the third aspect, as the component (D1), one kind of the aforementioned components (d1-1) to (d1-3), or at least two kinds of the aforementioned components (d1-1) to (d1-3) may be used in combination.

In the case where the resist composition of the third aspect contains the component (D1), the amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be more reliably obtained. On the other hand, when the amount of the component (D1) is no more than the upper limit of the above-mentioned range, satisfactory sensitivity may be maintained, and throughput may be improved.

In the resist composition of the third aspect, as the component (D2), one kind of compound may be used, or two or more kinds of compounds may be used in combination.

In the case where the resist composition of the third aspect contains the component (D2), the amount of the component (D2) relative to 100 parts by weight of the component (A) is preferably within a range from 0.01 to 5 parts by weight.

When the amount of the component (D2) is within the above-mentioned range, the shape of the resist pattern and the post exposure stability of the latent image formed by the pattern-wise exposure of the resist layer may be improved.

<<Component (C')>>

The resist composition of the third aspect may include, in addition to the components (A') and (F'), a cross-linker component (hereafter, sometimes referred to as "component (C')").

By virtue of the resist composition containing the component (C'), in the formation of a resist pattern, the contrast between the exposed portions and unexposed portions of the resist film may be enhanced, and various lithography properties such as resolution performance, reduction of LWR (line width roughness) and pattern shape may be improved.

The component (C') is the same as defined for the component (C) in the resist composition of the first aspect.

As the component (C'), one kind of compound may be used, or two or more kinds of compounds may be used in combination.

When the resist composition of the third aspect contains the component (C'), the amount of the component (C') relative to 100 parts by weight of the component (A') is preferably within a range from 1 to 50 parts by weight, more preferably from 3 to 30 parts by weight, still more preferably from 3 to 20 parts by weight, and most preferably 5 to 15 parts by weight.

When the amount of the component (C') is at least as large as the lower limit of the above-mentioned range, the formation of cross-linking may proceed satisfactorily. Further, a satisfactory resist pattern with minimal swelling may be obtained. On the other hand, when the amount of the component (C) is no more than the upper limit of the above-mentioned range, the storage stability of the resist composition may be improved, and deterioration over time in the sensitivity may be suppressed.

<<Component (E')>>

Furthermore, in the resist composition of the third embodiment, for preventing any deterioration in sensitivity, and improving the resist pattern shape and the post exposure stability of the latent image formed by the pattern-wise exposure of the resist layer, at least one compound (E') (hereafter referred to as the component (E')) selected from the group consisting of an organic carboxylic acid, or a phosphorus oxo acid or derivative thereof may be added.

The component (E') is the same as defined for the component (E) in the resist composition of the first aspect.

In the resist composition of the third aspect, as the component (E'), one kind of compound may be used, or two or more kinds of compounds may be used in combination.

When the resist composition of the third aspect contains the component (E'), the amount of the component (E') relative to 100 parts by weight of the component (A') is preferably in the range of 0.01 to 5 parts by weight.

<<Component (S')>>

The resist composition of the third aspect may be prepared by dissolving the resist materials for the resist composition in an organic solvent (hereafter, referred to as "component (S')").

The component (S') is the same as defined for the component (S) in the resist composition of the first aspect.

The amount of the component (S') is not particularly limited, and is appropriately adjusted to a concentration which enables coating of a resist composition to a substrate. In general, the component (S') is used in an amount such that the solid content of the resist composition becomes within the range from 1 to 20% by weight, and preferably from 2 to 15% by weight.

If desired, other miscible additives can also be added to the resist composition of the third aspect. Examples of such miscible additives include additive resins for improving the performance of the resist film, dissolution inhibitors, plasticizers, stabilizers, colorants, halation prevention agents, and dyes.

(Method of Forming a Resist Pattern)

The method of forming a resist pattern according to the second aspect of the present invention includes: using a resist composition according to the third aspect to form a resist film on a substrate; exposing the resist film; and alkali developing the exposed resist film to form a resist pattern.

The method for forming a resist pattern according to the present embodiment may be performed, for example, in the same manner as in the method described above for the method of forming a resist pattern according to the second aspect.

The resist composition of the third aspect described above includes a polymeric compound (component (A1')) having a structural unit (structural unit (a0)) derived from a compound represented by general formula (a0-1), and a fluorine resin component (component (F1')) having a structural unit (f1') containing a base dissociable group.

In the production of semiconductor elements and liquid crystal display elements, advances in lithography techniques have led to rapid progress in the field of pattern miniaturization, and a resist material exhibiting a high resolution performance is being demanded. In response to such demands, in a conventional chemically amplified resist composition containing a cross-linker component, the amount of the cross-linker component or the acid-generator component has been increased in order to improve the cross-linking efficiency at exposed portions of the resist film. However, when the amount of the cross-linker component or the acid generator component is increased, the solubility of the unexposed portions of the resist film is decreased. As a result, the developing contrast is deteriorated, and the resolution performance becomes unsatisfactory. Further, when excess amount of cross-linker component or acid-generator component is added, there was a problem that it becomes difficult to form a resist film.

In the resist composition of the third aspect, by introducing the structural unit (a0), cross-linking efficiency may be improved. Further, in the alkali developing in the formation of a pattern, by virtue of introducing the structural unit (f1') containing a base dissociable group, the hydrophilicity of the resist film surface is enhanced. As a result, the solubility of the unexposed portions of the resist film in an alkali developing solution is enhanced, and the contrast between the exposed portions and unexposed portions of the resist film is further improved. By synergistic interaction of combining the polymeric compound having the structural unit (a0) and the component (F1') having the structural unit (f1'), it is presumed that the resolution performance is improved, particularly in lithography using electron beam or EUV.

Further, according to the resist composition of the third aspect, the amount of metal(s) contained in the resist composition may be decreased. As a result, the electric properties and the reliability of the ultimately produced semiconductor or liquid crystal display may be improved. In addition, high integration may be reliably achieved. Examples of such resist composition include the resist composition of the third aspect which does not contain a polymeric compounds having a structural unit derived from a metal complex.

EXAMPLES

As follows is a description of examples of the present invention, although the scope of the present invention is by no way limited by these examples.

In the following examples, a compound represented by a chemical formula (1) is denoted as "compound (1)", and the same applies for compounds represented by other chemical formulae.

<Production Example of Polymeric Compound>

Each of the polymeric compounds A1-1 to A1-35 and A2-1 used in the present examples was obtained by radical polymerization of monomers which derive the structural units shown below which constitute the polymeric compound, using the monomers with a predetermined molar ratio.

[Chemical Formula 80.]

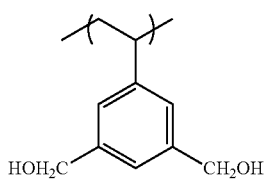
(a01)

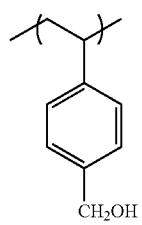
(a02)

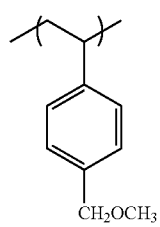
(a03)

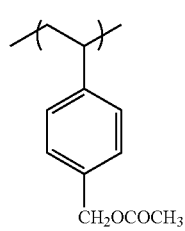

-continued

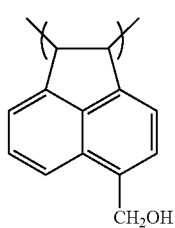
(a04)

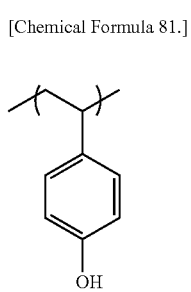
(a05)

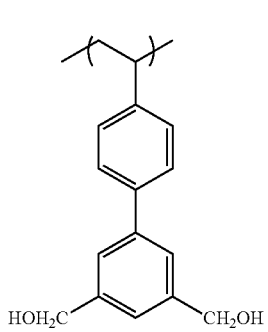
(a06)

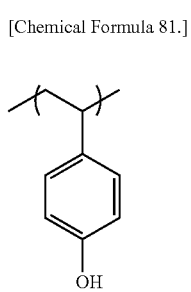
(a07)

[Chemical Formula 81.]

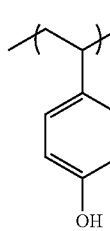
(a101)

-continued

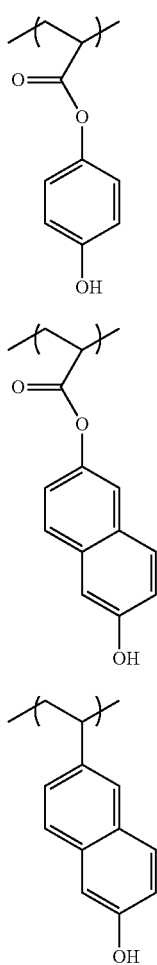

(a102)
(a103)
(a104)

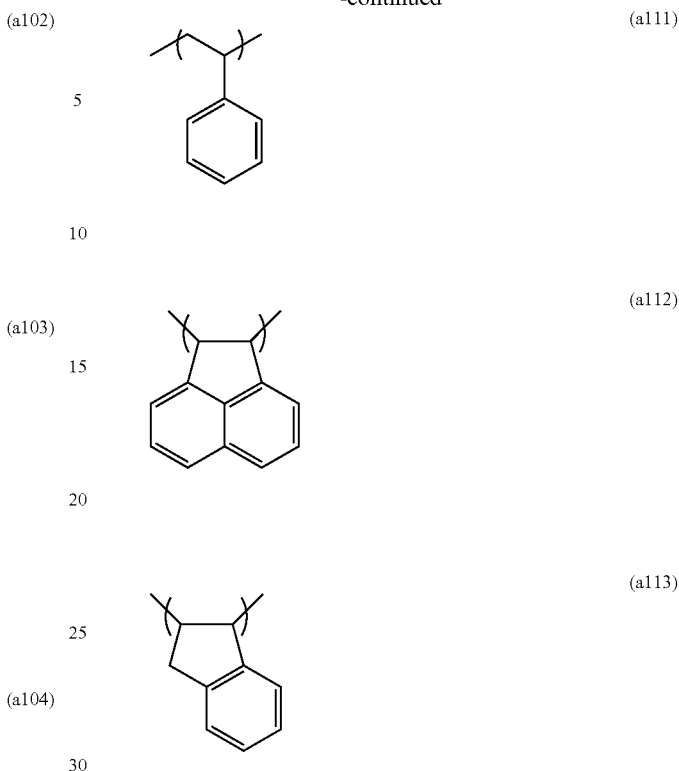

(a111)
(a112)
(a113)

With respect to the polymeric compounds A1-1 to A1-35 and A2-1, the compositional ratio of the polymers (the molar ratio of the respective structural units in the polymeric compound) as determined by $^{13}$C-NMR, the weight average molecular weight (Mw) and the polydispersity (Mw/Mn) determined by the polystyrene equivalent value as measured by GPC are also shown in Tables 1 and 2.

TABLE 1

| Polymeric compound | Copolymerization compositional ratio (Molar ratio of each structural unit in polymeric compound) | | | | | | | | | | | | | | Mw | Mw/Mn |
|---|---|---|---|---|---|---|---|---|---|---|---|---|---|---|---|---|
| | (a01) | (a02) | (a03) | (a04) | (a05) | (a06) | (a07) | (a101) | (a102) | (a103) | (a104) | (a111) | (a112) | (a113) | Mw | Mn |
| A1-1  | 20 |    |    |    |    |    |    | 60 |    |    |    | 20 |    |    | 4000 | 1.58 |
| A1-2  | 40 |    |    |    |    |    |    | 60 |    |    |    |    |    |    | 4000 | 1.58 |
| A1-3  | 20 |    |    |    |    |    |    | 80 |    |    |    |    |    |    | 4000 | 1.62 |
| A1-4  | 10 |    |    |    |    |    |    | 90 |    |    |    |    |    |    | 4000 | 1.66 |
| A1-5  |    | 20 |    |    |    |    |    | 60 |    |    |    | 20 |    |    | 4000 | 1.57 |
| A1-6  |    |    | 20 |    |    |    |    | 60 |    |    |    | 20 |    |    | 4000 | 1.54 |
| A1-7  |    |    |    | 20 |    |    |    | 60 |    |    |    | 20 |    |    | 4000 | 1.59 |
| A1-8  |    |    |    |    | 20 |    |    | 60 |    |    |    | 20 |    |    | 4000 | 1.68 |
| A1-9  |    |    |    |    |    | 20 |    | 60 |    |    |    | 20 |    |    | 4000 | 1.63 |
| A1-10 |    |    |    |    |    |    | 20 | 60 |    |    |    | 20 |    |    | 4000 | 1.68 |
| A1-11 | 20 |    |    |    |    |    |    |    | 60 |    |    | 20 |    |    | 4000 | 1.62 |
| A1-12 |    |    |    | 20 |    |    |    |    | 60 |    |    | 20 |    |    | 4000 | 1.64 |
| A1-13 |    |    |    |    | 20 |    |    |    | 60 |    |    | 20 |    |    | 4000 | 1.58 |
| A1-14 |    |    |    |    |    | 20 |    |    | 60 |    |    | 20 |    |    | 4000 | 1.55 |
| A1-15 |    |    |    |    |    |    | 20 |    | 60 |    |    | 20 |    |    | 4000 | 1.65 |
| A1-16 | 20 |    |    |    |    |    |    |    |    | 60 |    | 20 |    |    | 4000 | 1.84 |
| A1-17 | 20 |    |    |    |    |    |    |    |    |    | 60 | 20 |    |    | 4000 | 1.71 |
| A1-18 |    |    |    | 20 |    |    |    |    |    |    | 60 | 20 |    |    | 4000 | 1.64 |
| A1-19 |    |    |    |    | 20 |    |    |    |    |    | 60 | 20 |    |    | 4000 | 1.77 |
| A1-20 |    |    |    |    |    | 20 |    |    |    |    | 60 | 20 |    |    | 4000 | 1.74 |
| A1-21 |    |    |    |    |    |    | 20 |    |    |    | 60 | 20 |    |    | 4000 | 1.70 |

TABLE 2

| Polymeric compound | Copolymerization compositional ratio (Molar ratio of each structural unit in polymeric compound) | | | | | | | | | | | | | Mw | Mw/Mn |
|---|---|---|---|---|---|---|---|---|---|---|---|---|---|---|---|
| | (a01) | (a02) | (a03) | (a04) | (a05) | (a06) | (a07) | (a101) | (a102) | (a103) | (a104) | (a111) | (a112) | (a113) | | |
| A1-22 | 20 | | | | | | | 60 | | | | | 20 | | 4000 | 1.61 |
| A1-23 | 20 | | | | | | | 60 | | | | | | 20 | 4000 | 1.60 |
| A1-24 | 20 | | | | | | | 65 | | | | 15 | | | 4000 | 1.62 |
| A1-25 | 20 | | | | | | | 55 | | | | 25 | | | 4000 | 1.58 |
| A1-26 | 20 | 20 | | | | | | 60 | | | | | | | 4000 | 1.66 |
| A1-27 | 25 | | | | | | | 55 | | | | 20 | | | 4000 | 1.64 |
| A1-28 | 25 | | | | | | | 57.5 | | | | 17.5 | | | 4000 | 1.60 |
| A1-29 | 30 | | | | | | | 60 | | | | 10 | | | 4000 | 1.67 |
| A1-30 | 25 | | | | | | | 60 | | | | 15 | | | 4000 | 1.63 |
| A1-31 | 22.5 | | | | | | | 60 | | | | 17.5 | | | 4000 | 1.61 |
| A1-32 | 20 | | | | | | | 65 | | | | 15 | | | 4000 | 1.59 |
| A1-33 | 20 | | | | | | | 70 | | | | 10 | | | 4000 | 1.70 |
| A1-34 | 20 | | | | | | | 60 | | | | 20 | | | 2500 | 1.63 |
| A1-35 | 20 | | | | | | | 60 | | | | 20 | | | 8000 | 1.71 |
| A2-1 | | | | | | | | 80 | | | | 20 | | | 4000 | 1.66 |

<Production of Resist Composition (1)>

Examples 1 to 51, Comparative Examples 1 to 10

The components shown in Tables 3 to 6 were mixed together and dissolved to obtain each resist composition (solid content: 1.5 wt %).

TABLE 3

| | Component (A) | Component (B) | Component (D) | Component (Add) | Component (S) |
|---|---|---|---|---|---|
| Example 1 | (A)-1 [100] | (B)-1 [15] | (D)-1 [4.0] | — | (S)-1 [6665] |
| Example 2 | (A)-2 [100] | (B)-1 [15] | (D)-1 [4.0] | — | (S)-1 [6665] |
| Example 3 | (A)-3 [100] | (B)-1 [15] | (D)-1 [4.0] | — | (S)-1 [6665] |
| Example 4 | (A)-4 [100] | (B)-1 [15] | (D)-1 [4.0] | — | (S)-1 [6665] |
| Example 5 | (A)-5 [100] | (B)-1 [15] | (D)-1 [4.0] | — | (S)-1 [6665] |
| Example 6 | (A)-6 [100] | (B)-1 [15] | (D)-1 [4.0] | — | (S)-1 [6665] |
| Example 7 | (A)-7 [100] | (B)-1 [15] | (D)-1 [4.0] | — | (S)-1 [6665] |
| Example 8 | (A)-8 [100] | (B)-1 [15] | (D)-1 [4.0] | — | (S)-1 [6665] |
| Example 9 | (A)-9 [100] | (B)-1 [15] | (D)-1 [4.0] | — | (S)-1 [6665] |
| Example 10 | (A)-10 [100] | (B)-1 [15] | (D)-1 [4.0] | — | (S)-1 [6665] |
| Example 11 | (A)-11 [100] | (B)-1 [15] | (D)-1 [4.0] | — | (S)-1 [6665] |
| Example 12 | (A)-12 [100] | (B)-1 [15] | (D)-1 [4.0] | — | (S)-1 [6665] |
| Example 13 | (A)-13 [100] | (B)-1 [15] | (D)-1 [4.0] | — | (S)-1 [6665] |
| Example 14 | (A)-14 [100] | (B)-1 [15] | (D)-1 [4.0] | — | (S)-1 [6665] |
| Example 15 | (A)-15 [100] | (B)-1 [15] | (D)-1 [4.0] | — | (S)-1 [6665] |
| Example 16 | (A)-16 [100] | (B)-1 [15] | (D)-1 [4.0] | — | (S)-1 [6665] |
| Example 17 | (A)-17 [100] | (B)-1 [15] | (D)-1 [4.0] | — | (S)-1 [6665] |
| Example 18 | (A)-18 [100] | (B)-1 [15] | (D)-1 [4.0] | — | (S)-1 [6665] |
| Example 19 | (A)-19 [100] | (B)-1 [15] | (D)-1 [4.0] | — | (S)-1 [6665] |
| Example 20 | (A)-20 [100] | (B)-1 [15] | (D)-1 [4.0] | — | (S)-1 [6665] |
| Example 21 | (A)-21 [100] | (B)-1 [15] | (D)-1 [4.0] | — | (S)-1 [6665] |

TABLE 4

| | Component (A) | | Component (B) | Component (D) | Component (Add) | Component (S) |
|---|---|---|---|---|---|---|
| Example 22 | (A)-22 [100] | — | (B)-1 [15] | (D)-1 [4.0] | — | (S)-1 [6665] |
| Example 23 | (A)-23 [100] | — | (B)-1 [15] | (D)-1 [4.0] | — | (S)-1 [6665] |
| Example 24 | (A)-24 [50] | (A)-25 [50] | (B)-1 [15] | (D)-1 [4.0] | — | (S)-1 [6665] |
| Example 25 | (A)-25 [80] | (A)-36 [20] | (B)-1 [15] | (D)-1 [4.0] | — | (S)-1 [6665] |
| Example 26 | (A)-1 [50] | (A)-17 [50] | (B)-1 [15] | (D)-1 [4.0] | — | (S)-1 [6665] |
| Example 27 | (A)-1 [50] | (A)-23 [50] | (B)-1 [15] | (D)-1 [4.0] | — | (S)-1 [6665] |
| Example 28 | (A)-26 [100] | — | (B)-1 [15] | (D)-1 [4.0] | — | (S)-1 [6665] |
| Example 29 | (A)-27 [100] | — | (B)-1 [15] | (D)-1 [4.0] | — | (S)-1 [6665] |
| Example 30 | (A)-28 [100] | — | (B)-1 [15] | (D)-1 [4.0] | — | (S)-1 [6665] |
| Example 31 | (A)-29 [100] | — | (B)-1 [15] | (D)-1 [4.0] | — | (S)-1 [6665] |
| Example 32 | (A)-30 [100] | — | (B)-1 [15] | (D)-1 [4.0] | — | (S)-1 [6665] |
| Example 33 | (A)-31 [100] | — | (B)-1 [15] | (D)-1 [4.0] | — | (S)-1 [6665] |
| Example 34 | (A)-32 [100] | — | (B)-1 [15] | (D)-1 [4.0] | — | (S)-1 [6665] |
| Example 35 | (A)-33 [100] | — | (B)-1 [15] | (D)-1 [4.0] | — | (S)-1 [6665] |

TABLE 5

| | Component (A) | Component (B) | Component (D) | Component (Add) | Component (S) |
|---|---|---|---|---|---|
| Example 36 | (A)-1 [100] | (B)-2 [13] | (D)-2 [3.5] | — | (S)-1 [6665] |

TABLE 5-continued

| | Component (A) | Component (B) | Component (D) | Component (Add) | Component (S) |
|---|---|---|---|---|---|
| Example 37 | (A)-1 [100] | (B)-3 [13] | (D)-2 [3.5] | — | (S)-1 [6665] |
| Example 38 | (A)-1 [100] | (B)-4 [15] | (D)-3 [4.0] | — | (S)-1 [6665] |
| Example 39 | (A)-1 [100] | (B)-5 [20] | (D)-2 [3.5] | — | (S)-1 [6665] |
| Example 40 | (A)-1 [100] | (B)-6 [23] | (D)-1 [4.0] | — | (S)-1 [6665] |
| Example 41 | (A)-1 [100] | (B)-7 [23] | (D)-3 [4.0] | — | (S)-1 [6665] |
| Example 42 | (A)-1 [100] | (B)-8 [14] | (D)-1 [4.0] | — | (S)-1 [6665] |
| Example 43 | (A)-1 [100] | (B)-9 [14] | (D)-1 [4.0] | — | (S)-1 [6665] |
| Example 44 | (A)-1 [100] | (B)-10 [14] | (D)-3 [4.0] | — | (S)-1 [6665] |
| Example 45 | (A)-1 [100] | (B)-1 [15] | (D)-4 [4.5] | — | (S)-1 [6665] |
| Example 46 | (A)-34 [100] | (B)-1 [15] | (D)-1 [4.0] | — | (S)-1 [6665] |
| Example 47 | (A)-35 [100] | (B)-1 [15] | (D)-1 [4.0] | — | (S)-1 [6665] |
| Example 48 | (A)-1 [100] | (B)-1 [15] | (D)-1 [4.0] | (Add)-1 [8] | (S)-1 [6665] |
| Example 49 | (A)-1 [100] | (B)-1 [15] | (D)-1 [4.0] | (Add)-2 [10] | (S)-1 [6665] |
| Example 50 | (A)-1 [100] | (B)-1 [15] | (D)-1 [4.0] | (Add)-3 [15] | (S)-1 [6665] |
| Example 51 | (A)-1 [100] | (B)-1 [15] | (D)-1 [4.0] | (Add)-4 [10] | (S)-1 [6665] |

TABLE 6

| | Component (A) | Component (B) | Component (D) | Component (Add) | Component (S) |
|---|---|---|---|---|---|
| Comparative Example 1 | (A)-36 [100] | (B)-11 [11.5] | (D)-5 [3.0] | (Add)-1 [8] | (S)-1 [6665] |
| Comparative Example 2 | (A)-36 [100] | (B)-11 [11.5] | (D)-1 [4.0] | (Add)-1 [8] | (S)-1 [6665] |
| Comparative Example 3 | (A)-36 [100] | (B)-1 [15] | (D)-1 [4.0] | (Add)-1 [8] | (S)-1 [6665] |
| Comparative Example 4 | (A)-36 [100] | (B)-1 [15] | (D)-5 [3.0] | (Add)-1 [8] | (S)-1 [6665] |
| Comparative Example 5 | (A)-36 [100] | (B)-1 [15] | (D)-1 [4.0] | (Add)-2 [10] | (S)-1 [6665] |
| Comparative Example 6 | (A)-36 [100] | (B)-1 [15] | (D)-1 [4.0] | (Add)-3 [15] | (S)-1 [6665] |
| Comparative Example 7 | (A)-36 [100] | (B)-1 [15] | (D)-1 [4.0] | (Add)-5 [10] | (S)-1 [6665] |
| Comparative Example 8 | (A)-1 [100] | (B)-11 [11.5] | (D)-5 [3.0] | — | (S)-1 [6665] |
| Comparative Example 9 | (A)-1 [100] | (B)-11 [11.5] | (D)-1 [4.0] | — | (S)-1 [6665] |
| Comparative Example 10 | (A)-1 [100] | (B)-1 [15] | (D)-5 [3.0] | — | (S)-1 [6665] |

In Tables 3 to 6, the reference characters indicate the following. The values in brackets [ ] indicate the amount (in terms of parts by weight) of the component added.

(A)-1 to (A)-35: the aforementioned polymeric compounds A1-1 to A1-35.

(A)-36: the aforementioned polymeric compound A2-1.

(B)-1 to (B)-10: acid generators represented by chemical formulae (B1-1) to (B1-10) shown below.

[Chemical Formula 82.]

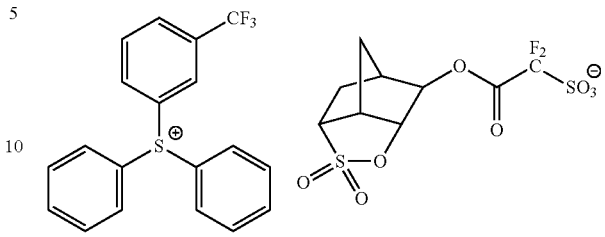

(B1-1)

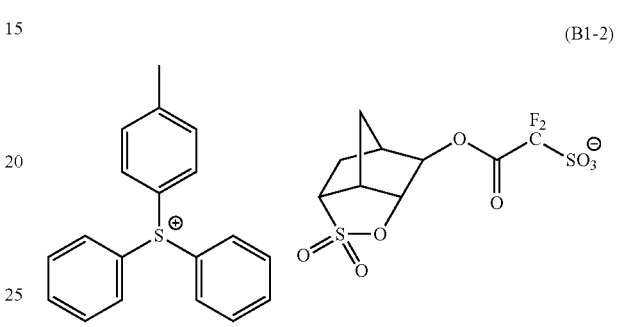

(B1-2)

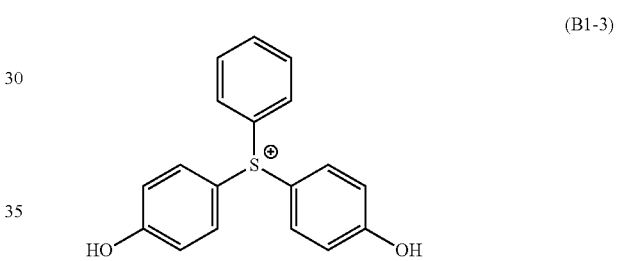

(B1-3)

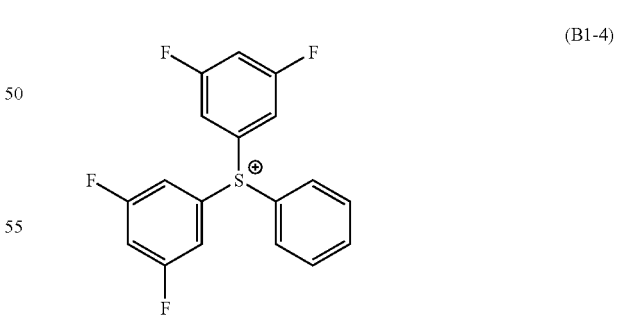

(B1-4)

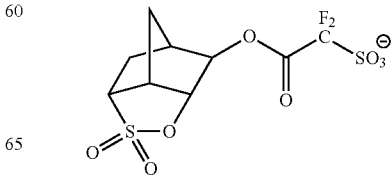

-continued
[Chemical Formula 83.]
(B1-5)
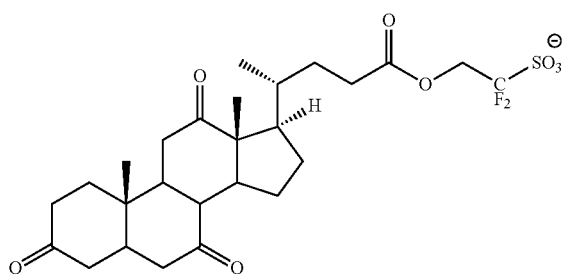
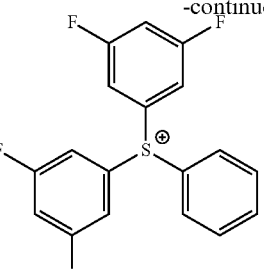
(B1-6)
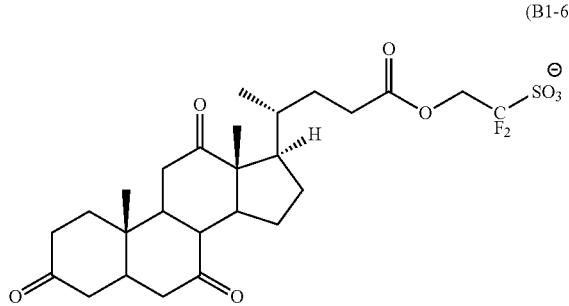
(B1-7)
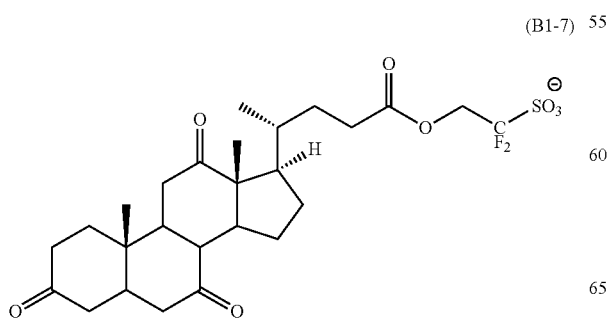
-continued
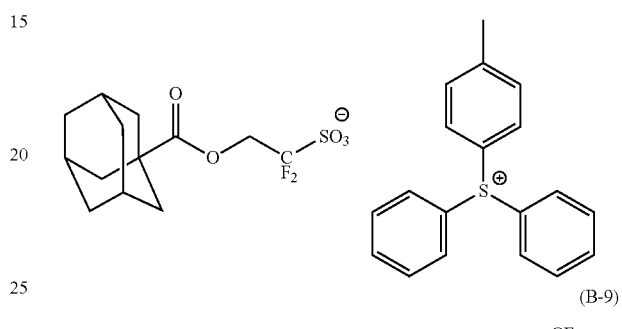
[Chemical Formula 84.]
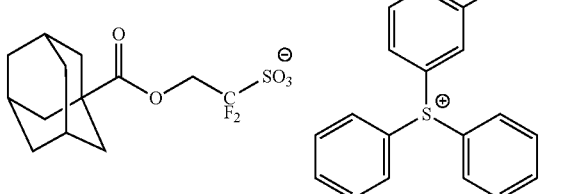
(B)-11: an acid generator represented by chemical formula (B2-1) shown below
[Chemical Formula 85.]
(B2-1)
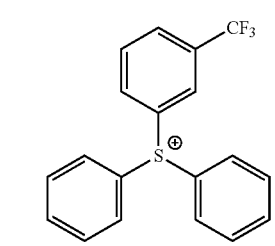
(D)-1 to (D)-4: photodegradable bases represented by chemical formulae (D1-1) to (D1-4) shown below.

[Chemical Formula 86.]

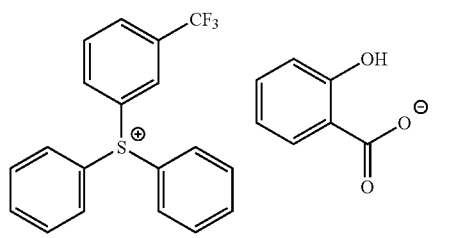
(D1-1)

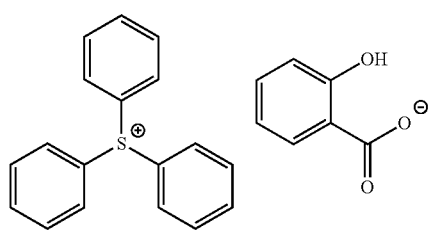
(D1-2)

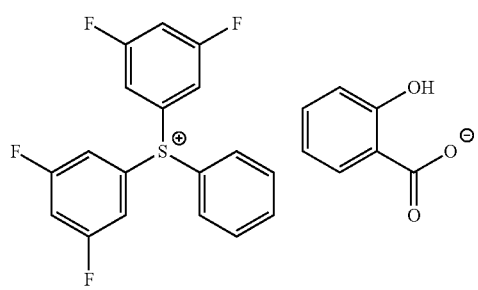
(D1-3)

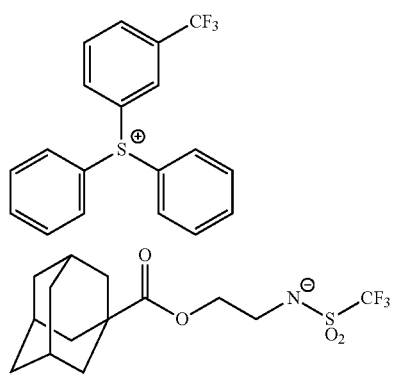
(D1-4)

(D)-5: trioctylamine (Add)-1 to (Add)-4: cross-linking agents represented by chemical formulae (Add-1) to (Add-4) shown below

[Chemical Formula 87.]

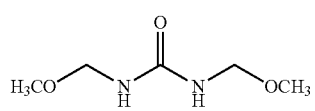
(Add-1)

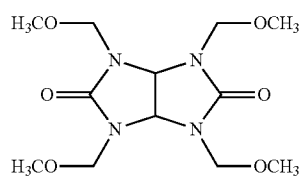
(Add-2)

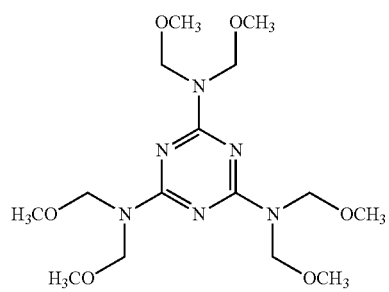
(Add-3)

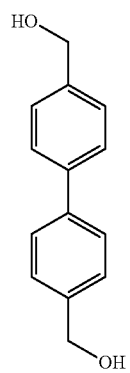
(Add-4)

(Add)-5: A fluorine-containing polymeric compound represented by chemical formula (F-1) shown below. The weight average molecular weight (Mw) and the dispersity (Mw/Mn) in terms of the polystyrene equivalent value measured by gel permeation chromatography (GPC) were 6,800 and 1.54, respectively. The composition of the copolymer (ratio (molar ratio) of the respective structural units within the structural formula) as determined by $^{13}$C-NMR was 1/m=69.1/30.9

[Chemical Formula 88.]

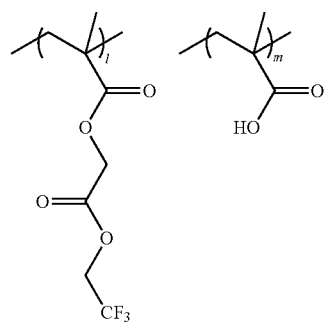
(F-1)

(S)-1: a mixed solvent of propylene glycol monomethyl ether acetate/propylene glycol monomethyl ether=20/80 (weight ratio).

<Formation of Resist Pattern (1)>

Each of the resist compositions of examples and comparative examples was applied to an 8-inch silicon substrate which had been treated with hexamethyldisilazane (HMDS) using a spinner, and was then prebaked (PAB) on a hot plate at 110° C. for 60 seconds and dried, thereby forming a resist film having a film thickness of 50 nm.

Subsequently, the resist film was subjected to drawing (exposure) using an electron beam lithography apparatus JEOL-JBX-9300FS (manufactured by JEOL Ltd.) at an acceleration voltage of 100 kV, targeting a 1:1 line and space pattern (hereafter, referred to as "LS pattern") having lines with a width of 50 to 26 nm. Then, a post exposure bake (PEB) treatment was conducted at 110° C. for 60 seconds.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Then, water rinsing was conducted for 15 seconds using pure water.

As a result, a 1:1 LS pattern having a line width of 50 to 26 nm was formed.

[Evaluation of Optimum Exposure Dose (Eop) (1)]

The optimum exposure dose Eop ($\mu C/cm^2$) with which the LS pattern was formed in the above formation of resist pattern (1) was determined. The results are indicated under "Eop($\mu C/cm^2$)" in Tables 7 to 10.

[Evaluation of Resolution (1)]

Using the resist compositions of Examples 1 to 51 and Comparative Examples 1 to 10, the critical resolution (nm) with the above Eop was determined using a scanning electron microscope (product name: S-9380, manufactured by Hitachi High-Technologies Corporation). Specifically, the exposure dose was gradually increased from the optimum exposure dose Eop, and the minimum size of the pattern which resolves without collapse (fall) was determined. The results are indicated under "Resolution performance (nm)" in Tables 7 to 10.

[Evaluation of Line Width Roughness (LWR) (1)]

With respect to the LS pattern formed in the above "formation of resist pattern (1)", 3σ was determined as a yardstick for indicating LWR. The results are indicated under "LWR (nm)" in Tables 7 to 10.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained.

[Evaluation of Resist Pattern Shape (1)]

The shape of the LS pattern formed in the above "formation of resist pattern (1)" was observed using a scanning electron microscope (product name: SU-8000, manufactured by Hitachi High-Technologies Corporation; acceleration voltage: 800V). The shape of the LS pattern was evaluated in accordance with the following criteria. The results are indicated under "Shape" in Tables 7 to 10.

(Criteria)

A: rectangular

B: top-spread shape or tapered

TABLE 7

| | PAB (° C.) | PEB (° C.) | Eop ($\mu C/cm^2$) | Resolution performance (nm) | LWR (nm) | Shape |
|---|---|---|---|---|---|---|
| Example 1 | 110 | 100 | 102 | 28 | 5.7 | A |
| Example 2 | 110 | 100 | 85 | 28 | 6.2 | A |
| Example 3 | 110 | 100 | 112 | 28 | 5.5 | A |
| Example 4 | 110 | 100 | 136 | 28 | 5.9 | A |
| Example 5 | 110 | 100 | 82 | 30 | 6.2 | A |
| Example 6 | 110 | 100 | 77 | 32 | 6.9 | A |
| Example 7 | 110 | 100 | 89 | 26 | 5.4 | A |
| Example 8 | 110 | 100 | 86 | 26 | 5.5 | A |
| Example 9 | 110 | 100 | 79 | 30 | 6.3 | A |
| Example 10 | 110 | 100 | 76 | 32 | 6.2 | A |
| Example 11 | 110 | 100 | 98 | 28 | 5.7 | A |
| Example 12 | 110 | 100 | 88 | 28 | 5.9 | A |
| Example 13 | 110 | 100 | 87 | 28 | 6.1 | A |
| Example 14 | 110 | 100 | 76 | 30 | 6.3 | A |
| Example 15 | 110 | 100 | 69 | 32 | 6.6 | A |
| Example 16 | 110 | 100 | 88 | 28 | 6.0 | A |
| Example 17 | 110 | 100 | 98 | 30 | 5.6 | A |
| Example 18 | 110 | 100 | 72 | 28 | 6.1 | A |
| Example 19 | 110 | 100 | 71 | 28 | 6.5 | A |
| Example 20 | 110 | 100 | 67 | 32 | 6.9 | A |
| Example 21 | 110 | 100 | 66 | 30 | 7.0 | A |

TABLE 8

| | PAB (° C.) | PEB (° C.) | Eop ($\mu C/cm^2$) | Resolution performance (nm) | LWR (nm) | Shape |
|---|---|---|---|---|---|---|
| Example 22 | 110 | 100 | 100 | 28 | 5.5 | A |
| Example 23 | 110 | 100 | 99 | 28 | 5.6 | A |
| Example 24 | 110 | 100 | 104 | 28 | 5.6 | A |
| Example 25 | 110 | 100 | 112 | 30 | 6.3 | A |
| Example 26 | 110 | 100 | 101 | 28 | 5.4 | A |
| Example 27 | 110 | 100 | 99 | 28 | 5.7 | A |
| Example 28 | 110 | 100 | 91 | 28 | 5.2 | A |
| Example 29 | 110 | 100 | 78 | 30 | 5.8 | A |
| Example 30 | 110 | 100 | 86 | 26 | 5.1 | A |
| Example 31 | 110 | 100 | 88 | 28 | 5.9 | A |
| Example 32 | 110 | 100 | 84 | 26 | 5.3 | A |
| Example 33 | 110 | 100 | 85 | 26 | 5.5 | A |
| Example 34 | 110 | 100 | 92 | 28 | 5.7 | A |
| Example 35 | 110 | 100 | 105 | 32 | 6.6 | A |

TABLE 9

| | PAB (° C.) | PEB (° C.) | Eop ($\mu C/cm^2$) | Resolution performance (nm) | LWR (nm) | Shape |
|---|---|---|---|---|---|---|
| Example 36 | 110 | 100 | 112 | 26 | 5.0 | A |
| Example 37 | 110 | 100 | 132 | 28 | 5.5 | A |
| Example 38 | 110 | 100 | 101 | 26 | 4.9 | A |
| Example 39 | 110 | 100 | 107 | 26 | 6.0 | A |
| Example 40 | 110 | 100 | 108 | 26 | 6.0 | A |
| Example 41 | 110 | 100 | 104 | 26 | 6.0 | A |
| Example 42 | 110 | 100 | 95 | 28 | 5.8 | A |
| Example 43 | 110 | 100 | 89 | 26 | 5.5 | A |
| Example 44 | 110 | 100 | 84 | 26 | 5.6 | A |
| Example 45 | 110 | 100 | 105 | 26 | 5.3 | A |
| Example 46 | 110 | 100 | 135 | 26 | 4.8 | A |
| Example 47 | 110 | 100 | 76 | 28 | 6.5 | A |
| Example 48 | 110 | 100 | 98 | 26 | 5.0 | A |
| Example 49 | 110 | 100 | 89 | 26 | 5.2 | A |
| Example 50 | 110 | 100 | 79 | 26 | 5.4 | A |
| Example 51 | 110 | 100 | 96 | 26 | 5.6 | A |

TABLE 10

|  | PAB (° C.) | PEB (° C.) | Eop (μC/cm²) | Resolution performance (nm) | LWR (nm) | Shape |
|---|---|---|---|---|---|---|
| Comparative Example 1 | 110 | 100 | 242 | 50 | — | B |
| Comparative Example 2 | 110 | 100 | 228 | 50 | — | B |
| Comparative Example 3 | 110 | 100 | 192 | 50 | — | B |
| Comparative Example 4 | 110 | 100 | 206 | 50 | — | B |
| Comparative Example 5 | 110 | 100 | 168 | 50 | — | B |
| Comparative Example 6 | 110 | 100 | 118 | 50 | — | B |
| Comparative Example 7 | 110 | 100 | 180 | 50 | — | B |
| Comparative Example 8 | 110 | 100 | 156 | 50 | 8.5 | A |
| Comparative Example 9 | 110 | 100 | 136 | 50 | 8.3 | A |
| Comparative Example 10 | 110 | 100 | 136 | 40 | 8.0 | A |

From the results shown in Tables 7 to 10, according to the resist composition of Examples 1 to 51 which applied the present invention, in the formation of a resist pattern, a resist pattern having a good shape can be formed with high resolution and reduced roughness.

<Production of Resist Composition (2)>

Examples 52 to 100, Comparative Examples 11 to 14

The components shown in Table 11 to 14 were mixed together and dissolved to obtain each resist composition (solid content: 1.5 wt %).

TABLE 11

|  | Component (A') | Component (F') | Component (B') | Component (D') | Component (S') |
|---|---|---|---|---|---|
| Example 52 | (A')-1 [100] | (F')-1 [1] | (B')-1 [15] | (D')-5 [3.0] | (S')-1 [6665] |
| Example 53 | (A')-1 [100] | (F')-1 [2] | (B')-1 [15] | (D')-5 [3.0] | (S')-1 [6665] |
| Example 54 | (A')-1 [100] | (F')-1 [3] | (B')-1 [15] | (D')-5 [3.0] | (S')-1 [6665] |
| Example 55 | (A')-1 [100] | (F')-2 [1] | (B')-1 [15] | (D')-5 [3.0] | (S')-1 [6665] |
| Example 56 | (A')-1 [100] | (F')-2 [2] | (B')-1 [15] | (D')-5 [3.0] | (S')-1 [6665] |
| Example 57 | (A')-1 [100] | (F')-2 [3] | (B')-1 [15] | (D')-5 [3.0] | (S')-1 [6665] |
| Example 58 | (A')-1 [100] | (F')-1 [2] | (B')-1 [15] | (D')-1 [4.0] | (S')-1 [6665] |
| Example 59 | (A')-2 [100] | (F')-1 [2] | (B')-1 [15] | (D')-1 [4.0] | (S')-1 [6665] |
| Example 60 | (A')-3 [100] | (F')-1 [2] | (B')-1 [15] | (D')-1 [4.0] | (S')-1 [6665] |
| Example 61 | (A')-4 [100] | (F')-1 [2] | (B')-1 [15] | (D')-1 [4.0] | (S')-1 [6665] |
| Example 62 | (A')-5 [100] | (F')-1 [2] | (B')-1 [15] | (D')-1 [4.0] | (S')-1 [6665] |
| Example 63 | (A')-6 [100] | (F')-1 [2] | (B')-1 [15] | (D')-1 [4.0] | (S')-1 [6665] |
| Example 64 | (A')-7 [100] | (F')-1 [2] | (B')-1 [15] | (D')-1 [4.0] | (S')-1 [6665] |
| Example 65 | (A')-8 [100] | (F')-1 [2] | (B')-1 [15] | (D')-1 [4.0] | (S')-1 [6665] |
| Example 66 | (A')-9 [100] | (F')-1 [2] | (B')-1 [15] | (D')-1 [4.0] | (S')-1 [6665] |

TABLE 11-continued

|  | Component (A') | Component (F') | Component (B') | Component (D') | Component (S') |
|---|---|---|---|---|---|
| Example 67 | (A')-10 [100] | (F')-1 [2] | (B')-1 [15] | (D')-1 [4.0] | (S')-1 [6665] |

TABLE 12

|  | Component (A') | Component (F') | Component (B') | Component (D') | Component (S') |
|---|---|---|---|---|---|
| Example 68 | (A')-11 [100] | (F')-1 [2] | (B')-1 [15] | (D')-1 [4.0] | (S')-1 [6665] |
| Example 69 | (A')-12 [100] | (F')-1 [2] | (B')-1 [15] | (D')-1 [4.0] | (S')-1 [6665] |
| Example 70 | (A')-13 [100] | (F')-1 [2] | (B')-1 [15] | (D')-1 [4.0] | (S')-1 [6665] |
| Example 71 | (A')-14 [100] | (F')-1 [2] | (B')-1 [15] | (D')-1 [4.0] | (S')-1 [6665] |
| Example 72 | (A')-15 [100] | (F')-1 [2] | (B')-1 [15] | (D')-1 [4.0] | (S')-1 [6665] |
| Example 73 | (A')-16 [100] | (F')-1 [2] | (B')-1 [15] | (D')-1 [4.0] | (S')-1 [6665] |
| Example 74 | (A')-17 [100] | (F')-1 [2] | (B')-1 [15] | (D')-1 [4.0] | (S')-1 [6665] |
| Example 75 | (A')-18 [100] | (F')-1 [2] | (B')-1 [15] | (D')-1 [4.0] | (S')-1 [6665] |
| Example 76 | (A')-19 [100] | (F')-1 [2] | (B')-1 [15] | (D')-1 [4.0] | (S')-1 [6665] |
| Example 77 | (A')-20 [100] | (F')-1 [2] | (B')-1 [15] | (D')-1 [4.0] | (S')-1 [6665] |
| Example 78 | (A')-21 [100] | (F')-1 [2] | (B')-1 [15] | (D')-1 [4.0] | (S')-1 [6665] |
| Example 79 | (A')-22 [100] | (F')-1 [2] | (B')-1 [15] | (D')-1 [4.0] | (S')-1 [6665] |
| Example 80 | (A')-23 [100] | (F')-1 [2] | (B')-1 [15] | (D')-1 [4.0] | (S')-1 [6665] |
| Example 81 | (A')-24 [100] | (F')-1 [2] | (B')-1 [15] | (D')-1 [4.0] | (S')-1 [6665] |
| Example 82 | (A')-27 [100] | (F')-1 [2] | (B')-1 [15] | (D')-1 [4.0] | (S')-1 [6665] |

TABLE 13

|  | Component (A') | Component (F') | Component (B') | Component (D') | Component (S') |
|---|---|---|---|---|---|
| Example 83 | (A')-28 [100] | (F')-1 [2] | (B')-1 [15] | (D')-1 [4.0] | (S')-1 [6665] |
| Example 84 | (A')-29 [100] | (F')-1 [2] | (B')-1 [15] | (D')-1 [4.0] | (S')-1 [6665] |
| Example 85 | (A')-30 [100] | (F')-1 [2] | (B')-1 [15] | (D')-1 [4.0] | (S')-1 [6665] |
| Example 86 | (A')-31 [100] | (F')-1 [2] | (B')-1 [15] | (D')-1 [4.0] | (S')-1 [6665] |
| Example 87 | (A')-32 [100] | (F')-1 [2] | (B')-1 [15] | (D')-1 [4.0] | (S')-1 [6665] |
| Example 88 | (A')-33 [100] | (F')-1 [2] | (B')-1 [15] | (D')-1 [4.0] | (S')-1 [6665] |
| Example 89 | (A')-1 [100] | (F')-1 [2] | (B')-2 [13] | (D')-2 [3.5] | (S')-1 [6665] |
| Example 90 | (A')-1 [100] | (F')-1 [2] | (B')-3 [13] | (D')-2 [3.5] | (S')-1 [6665] |
| Example 91 | (A')-1 [100] | (F')-1 [2] | (B')-4 [15] | (D')-3 [4.0] | (S')-1 [6665] |
| Example 92 | (A')-1 [100] | (F')-1 [2] | (B')-5 [20] | (D')-2 [3.5] | (S')-1 [6665] |
| Example 93 | (A')-1 [100] | (F')-1 [2] | (B')-6 [23] | (D')-1 [4.0] | (S')-1 [6665] |

TABLE 13-continued

|  | Component (A') | Component (F') | Component (B') | Component (D') | Component (S') |
|---|---|---|---|---|---|
| Example 94 | (A')-1 [100] | (F')-1 [2] | (B')-7 [23] | (D')-3 [4.0] | (S')-1 [6665] |
| Example 95 | (A')-1 [100] | (F')-1 [2] | (B')-8 [14] | (D')-1 [4.0] | (S')-1 [6665] |
| Example 96 | (A')-1 [100] | (F')-1 [2] | (B')-9 [14] | (D')-1 [4.0] | (S')-1 [6665] |
| Example 97 | (A')-1 [100] | (F')-1 [2] | (B')-10 [14] | (D')-3 [4.0] | (S')-1 [6665] |
| Example 98 | (A')-1 [100] | (F')-1 [2] | (B')-1 [15] | (D')-4 [4.5] | (S')-1 [6665] |
| Example 99 | (A')-34 [100] | (F')-1 [2] | (B')-1 [15] | (D')-1 [4.0] | (S')-1 [6665] |
| Example 100 | (A')-35 [100] | (F')-1 [2] | (B')-1 [15] | (D')-1 [4.0] | (S')-1 [6665] |

TABLE 14

|  | Component (A') | Component (F') | Component (B') | Component (D') | Component (Add) | Component (S') |
|---|---|---|---|---|---|---|
| Comparative Example 11 | (A')-36 [100] | — | (B')-1 [15] | (D')-5 [4.0] | (Add)-1 [8] | (S')-1 [6665] |
| Comparative Example 12 | (A')-36 [100] | (F')-1 [2] | (B')-1 [15] | (D')-5 [4.0] | (Add)-1 [8] | (S')-1 [6665] |
| Comparative Example 13 | (A')-36 [100] | (F')-2 [2] | (B')-1 [15] | (D')-5 [4.0] | (Add)-1 [15] | (S')-1 [6665] |
| Comparative Example 14 | (A')-1 [100] | — | (B')-1 [15] | (D')-5 [3.0] | — | (S')-1 [6665] |

In Tables 11 to 14, the reference characters indicate the following. The values in brackets [ ] indicate the amount (in terms of parts by weight) of the component added.

(A')-1 to (A')-24, (A')-26 to (A')-35: the aforementioned polymeric compounds A1-1 to A1-24, A1-26 to A1-35

(A')-36: the aforementioned polymeric compounds A2-1

(F')-1: fluorine-containing polymeric compound represented by chemical formula (F1'-1) below. The weight average molecular weight (Mw) and the dispersity (Mw/Mn) in terms of the polystyrene equivalent value measured by gel permeation chromatography (GPC) were 6,800 and 1.54, respectively. The composition of the copolymer (ratio (molar ratio) of the respective structural units within the structural formula) as determined by $^{13}$C-NMR was $1/m=69.1/30.9$.

(F')-2: fluorine-containing polymeric compound represented by chemical formula (F1'-2) below. The weight average molecular weight (Mw) and the dispersity (Mw/Mn) in terms of the polystyrene equivalent value measured by gel permeation chromatography (GPC) were 17,300 and 1.73, respectively. The composition of the copolymer (ratio (molar ratio) of the respective structural units within the structural formula) as determined by $^{13}$C-NMR was $1/m=82.0/18.0$.

[Chemical Formula 89.]

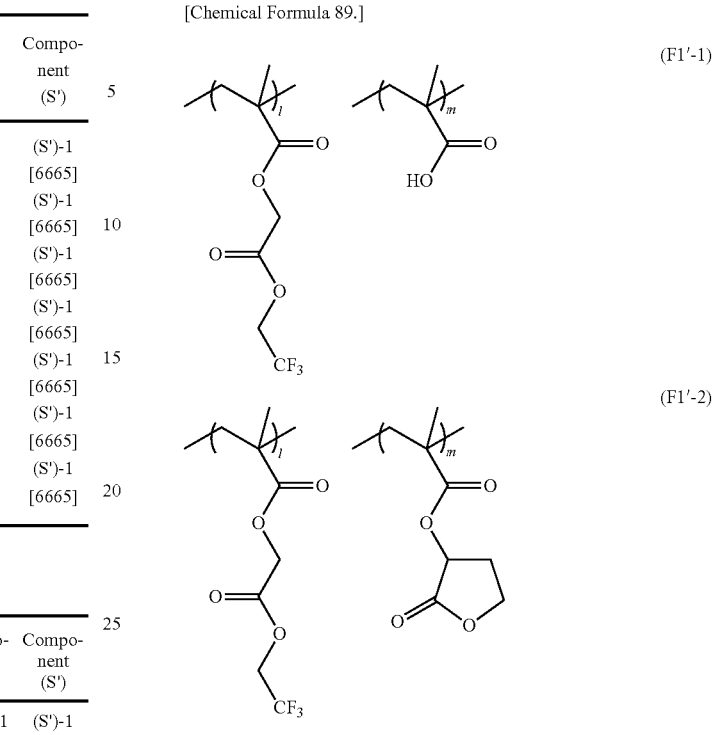

(B')-1 to (B')-10: acid generators represented by the aforementioned chemical formulae (B1-1) to (B1-10)

(D')-1 to (D')-4: photodegradable bases represented by the aforementioned chemical formulae (D1-1) to (D1-4)

(D')-5: trioctylamine (Add)-1: cross-linking agent represented by the aforementioned chemical formula (Add-1)

(S')-1: a mixed solvent of propylene glycol monomethyl ether acetate/propylene glycol monomethyl ether=20/80 (weight ratio).

<Formation of Resist Pattern (2)>

Resist patterns were formed in the same manner as in "<Formation of resist pattern (1)>", except that the resist compositions of Examples 52 to 100 and Comparative Examples 11 to 14 were used.

As a result, a 1:1 LS pattern having a line width of 50 to 26 nm was formed.

[Evaluation of Optimum Exposure Dose (Eop) (2)]

The optimum exposure dose Eop ($\mu C/cm^2$) with which the LS pattern was formed in the above formation of resist pattern (2) was determined. The results are indicated under "Eop($\mu C/cm^2$)" in Tables 15 to 18.

[Evaluation of Resolution (2)]

Using the resist compositions of Examples 52 to 100 and Comparative Examples 11 to 14, the critical resolution (nm) with the above Eop was determined using a scanning electron microscope (product name: S-9380, manufactured by Hitachi High-Technologies Corporation). Specifically, the exposure dose was gradually increased from the optimum exposure dose Eop, and the minimum size of the pattern which resolves without collapse (fall) was determined. The results are indicated under "Resolution performance (nm)" in Tables 15 to 18.

[Evaluation of Line Width Roughness (LWR) (2)]

With respect to the LS pattern formed in the above "formation of resist pattern (2)", 3σ was determined as a yardstick for indicating LWR. The results are indicated under "LWR (nm)" in Tables 15 to 18.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained.

[Evaluation of Resist Pattern Shape (2)]

The shape of the LS pattern formed in the above "formation of resist pattern (2)" was observed using a scanning electron microscope (product name: SU-8000, manufactured by Hitachi High-Technologies Corporation; acceleration voltage: 800V). The shape of the LS pattern was evaluated in accordance with the following criteria. The results are indicated under "Shape" in Tables 15 to 18.

(Criteria)
A: rectangular
B: top-spread shape or tapered

TABLE 15

|  | PAB (° C.) | PEB (° C.) | Eop (μC/cm$^2$) | Resolution performance (nm) | LWR (nm) | Shape |
|---|---|---|---|---|---|---|
| Example 52 | 110 | 100 | 128 | 35 | 7.4 | A |
| Example 53 | 110 | 100 | 128 | 32 | 7.1 | A |
| Example 54 | 110 | 100 | 126 | 32 | 6.9 | A |
| Example 55 | 110 | 100 | 129 | 35 | 7.6 | A |
| Example 56 | 110 | 100 | 128 | 32 | 7.3 | A |
| Example 57 | 110 | 100 | 127 | 32 | 7.0 | A |
| Example 58 | 110 | 100 | 108 | 26 | 4.4 | A |
| Example 59 | 110 | 100 | 85 | 28 | 5.0 | A |
| Example 60 | 110 | 100 | 108 | 26 | 4.9 | A |
| Example 61 | 110 | 100 | 133 | 28 | 5.1 | A |
| Example 62 | 110 | 100 | 80 | 28 | 5.3 | A |
| Example 63 | 110 | 100 | 75 | 30 | 5.6 | A |
| Example 64 | 110 | 100 | 83 | 26 | 4.8 | A |
| Example 65 | 110 | 100 | 85 | 26 | 4.9 | A |
| Example 66 | 110 | 100 | 76 | 28 | 5.2 | A |
| Example 67 | 110 | 100 | 74 | 30 | 5.5 | A |

TABLE 16

|  | PAB (° C.) | PEB (° C.) | Eop (μC/cm$^2$) | Resolution performance (nm) | LWR (nm) | Shape |
|---|---|---|---|---|---|---|
| Example 68 | 110 | 100 | 90 | 26 | 5.1 | A |
| Example 69 | 110 | 100 | 84 | 28 | 4.8 | A |
| Example 70 | 110 | 100 | 83 | 28 | 5.3 | A |
| Example 71 | 110 | 100 | 74 | 30 | 5.5 | A |
| Example 72 | 110 | 100 | 69 | 30 | 5.7 | A |
| Example 73 | 110 | 100 | 84 | 28 | 5.0 | A |
| Example 74 | 110 | 100 | 96 | 28 | 5.2 | A |
| Example 75 | 110 | 100 | 70 | 28 | 5.3 | A |
| Example 76 | 110 | 100 | 69 | 28 | 5.4 | A |
| Example 77 | 110 | 100 | 67 | 30 | 5.6 | A |
| Example 78 | 110 | 100 | 62 | 30 | 5.4 | A |
| Example 79 | 110 | 100 | 98 | 28 | 5.1 | A |
| Example 80 | 110 | 100 | 97 | 28 | 5.0 | A |
| Example 81 | 110 | 100 | 88 | 26 | 4.7 | A |
| Example 82 | 110 | 100 | 74 | 28 | 4.8 | A |

TABLE 17

|  | PAB (° C.) | PEB (° C.) | Eop (μC/cm$^2$) | Resolution performance (nm) | LWR (nm) | Shape |
|---|---|---|---|---|---|---|
| Example 83 | 110 | 100 | 81 | 26 | 4.3 | A |
| Example 84 | 110 | 100 | 85 | 26 | 4.9 | A |
| Example 85 | 110 | 100 | 83 | 26 | 4.7 | A |
| Example 86 | 110 | 100 | 81 | 26 | 4.6 | A |
| Example 87 | 110 | 100 | 88 | 26 | 4.8 | A |
| Example 88 | 110 | 100 | 99 | 28 | 5.0 | A |
| Example 89 | 110 | 100 | 108 | 26 | 4.5 | A |
| Example 90 | 110 | 100 | 128 | 28 | 4.7 | A |
| Example 91 | 110 | 100 | 99 | 26 | 4.3 | A |
| Example 92 | 110 | 100 | 105 | 26 | 4.8 | A |
| Example 93 | 110 | 100 | 106 | 26 | 4.5 | A |
| Example 94 | 110 | 100 | 103 | 26 | 5.0 | A |
| Example 95 | 110 | 100 | 92 | 28 | 4.9 | A |
| Example 96 | 110 | 100 | 87 | 26 | 4.8 | A |
| Example 97 | 110 | 100 | 80 | 26 | 4.6 | A |
| Example 98 | 110 | 100 | 100 | 26 | 4.7 | A |
| Example 99 | 110 | 100 | 132 | 26 | 4.3 | A |
| Example 100 | 110 | 100 | 75 | 26 | 5.3 | A |

TABLE 18

|  | PAB (° C.) | PEB (° C.) | Eop (μC/cm$^2$) | Resolution performance (nm) | LWR (nm) | Shape |
|---|---|---|---|---|---|---|
| Comparative Example 11 | 110 | 100 | 206 | 50 | — | B |
| Comparative Example 12 | 110 | 100 | 204 | 50 | — | B |
| Comparative Example 13 | 110 | 100 | 204 | 50 | — | B |
| Comparative Example 14 | 110 | 100 | 136 | 40 | 8.0 | A |

From the results shown in Tables 15 to 18, according to the resist composition of Examples 52 to 100 which applied the present invention, in the formation of a resist pattern, a resist pattern having a good shape can be formed with high resolution and reduced roughness.

What is claimed is:

1. A resist composition which generates acid upon exposure and exhibits changed solubility in a developing solution under action of acid, the resist composition comprising:
   a polymeric compound (A1) comprising a structural unit derived from a compound represented by general formula (a0-1) shown below,
   an acid generator (B1) represented by general formula (b1) shown below, and
   a photodecomposable base (D1) which is decomposed upon exposure and then loses the ability to control acid diffusion:

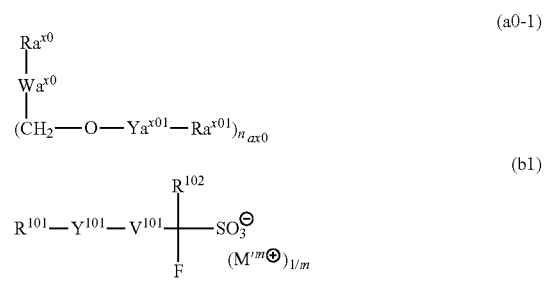

wherein $Ra^{x0}$ represents a polymerizable group-containing group; $Wa^{x0}$ represents an aromatic hydrocarbon group having a valency of $(n_{ax0}+1)$, provided that $Ra^{x0}$ and $Wa^{x0}$ may together form a condensed ring structure; $n_{ax0}$ represents an integer of 1 to 3; $Ya^{x01}$ represents a carbonyl group or a single bond; $Ra^{x01}$ represents a hydrogen atom or a hydrocarbon group which may have a substituent; $R^{101}$ represents a cyclic group which may have a substituent, a chain alkyl group which may have a substituent or a chain alkenyl group which may have a substituent; $R^{102}$ represents a fluorine atom or a fluorinated alkyl group having 1 to 5 carbon atoms; $Y^{101}$ represents a single bond or a divalent group containing an oxygen atom; $V^{101}$ represents an alkylene group, a fluorinated alkylene group or a single bond; m represents an integer of 1 or more, and $M^{m+}$ represents an onium cation having a valency of m.

2. The resist composition according to claim 1, wherein the photodecomposable base (D1) comprises at least one compound selected from the group consisting of a compound represented by general formula (d1-1) shown below, a compound represented by general formula (d1-2) shown below and a compound represented by general formula (d1-3) shown below:

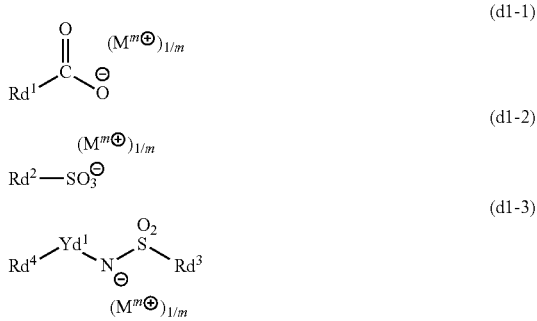

wherein $Rd^1$ to $Rd^4$ each independently represents a cyclic group which may have a substituent, a chain alkyl group which may have a substituent or a chain alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

3. The resist composition according to claim 1, wherein $M^{m+}$ in general formula (b1) is an onium cation represented by general formula (b1-ca-1) shown below:

wherein $R^{b11}$ represents an aryl group which has a fluorinated alkyl group or a fluorine atom as a substituent, an alkyl group which may have a fluorinated alkyl group or a fluorine atom as a substituent, or an alkenyl group which may have a fluorinated alkyl group or a fluorine atom as a substituent; $R^{b12}$ and $R^{b13}$ each independently represents an aryl group which may have a substituent, an alkyl group which may have a substituent, or an alkenyl group which may have a substituent, provided that $R^{b11}$ to $R^{b13}$ may be mutually bonded to form a ring with the sulfur atom.

4. The resist composition according to claim 1, wherein the polymeric compound (A1) further comprises a structural unit represented by general formula (a10-1) shown below:

wherein $Ra^{x1}$ represents a polymerizable group-containing group; $Wa^{x1}$ represents an aromatic hydrocarbon group having a valency of $(n_{ax1}+1)$, provided that $Ra^{x1}$ and $Wa^{x1}$ may together form a condensed ring structure; and $n_{ax1}$ represents an integer of 1 to 3.

5. The resist composition according to claim 2, wherein the polymeric compound (A1) further comprises a structural unit represented by general formula (a10-1) shown below:

wherein $Ra^{x1}$ represents a polymerizable group-containing group; $Wa^{x1}$ represents an aromatic hydrocarbon group having a valency of $(n_{ax1}+1)$, provided that $Ra^{x1}$ and $Wa^{x1}$ may together form a condensed ring structure; and $n_{ax1}$ represents an integer of 1 to 3.

6. The resist composition according to claim 3, wherein the polymeric compound (A1) further comprises a structural unit represented by general formula (a10-1) shown below:

wherein $Ra^{x1}$ represents a polymerizable group-containing group; $Wa^{x1}$ represents an aromatic hydrocarbon group having a valency of $(n_{ax1}+1)$, provided that $Ra^{x1}$ and $Wa^{x1}$ may together form a condensed ring structure; and $n_{ax1}$ represents an integer of 1 to 3.

7. A method of forming a resist pattern, comprising:
   forming a resist film with the resist composition according to claim 1;
   exposing the resist film; and
   developing the exposed resist film to form a resist pattern.

8. A resist composition which generates acid upon exposure and exhibits changed solubility in a developing solution under action of acid, the resist composition comprising:
   a base component (A') which exhibits changed solubility in a developing solution under action of acid; and
   a fluorine additive component (F') which exhibits decomposability to an alkali developing solution,
   wherein the base component (A') comprises a polymeric compound (A1') comprising a structural unit derived from a compound represented by general formula (a0-1) shown below, and the fluorine additive component (F') comprises a fluorine resin component (F1') comprising a structural unit (f1') containing a base dissociable group:

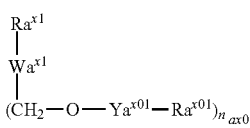

(a0-1)

wherein $Ra^{x0}$ represents a polymerizable group-containing group; $Wa^{x0}$ represents an aromatic hydrocarbon group having a valency of ($n_{ax0}+1$), provided that $Ra^{x0}$ and $Wa^{x0}$ may together form a condensed ring structure; $n_{ax0}$ represents an integer of 1 to 3; $Ya^{x01}$ represents a carbonyl group or a single bond; and $Ra^{x01}$ represents a hydrogen atom or a hydrocarbon group which may have a substituent.

9. The resist composition according to claim 8, wherein the structural unit (f1') is a structural unit represented by general formula (f1'-1) shown below or a structural unit represented by general formula (f1'-2) shown below:

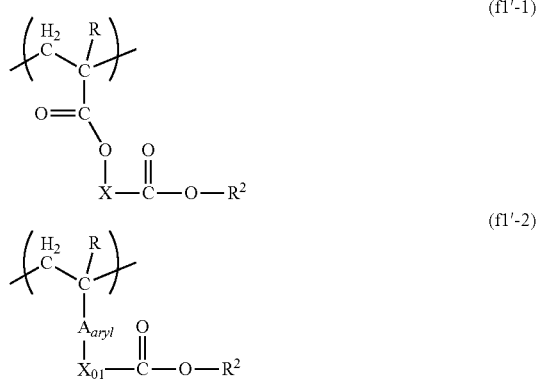

(f1'-1)

(f1'-2)

wherein each R independently represents a hydrogen atom, an alkyl group of 1 to 5 carbon atoms or a halogenated alkyl group of 1 to 5 carbon atoms; X represents a divalent linking group having no acid dissociable portion; $A_{aryl}$ represents a divalent aromatic cyclic group which may have a substituent; $X_{01}$ represents a single bond or a divalent linking group; and each $R^2$ independently represents an organic group having a fluorine atom.

10. The resist composition according to claim 8, wherein the amount of the fluorine resin component (F1') relative to 100 parts by weight of the component (A') is 0.5 to 10 parts by weight.

11. The resist composition according to claim 8, further comprising a photodecomposable base (D1) which is decomposed upon exposure and then loses the ability of controlling of acid diffusion.

12. The resist composition according to claim 8, wherein the polymeric compound (A1') further comprises a structural unit represented by general formula (a10-1) shown below:

(a10-1)

wherein $Ra^{x1}$ represents a polymerizable group-containing group; $Wa^{x1}$ represents an aromatic hydrocarbon group having a valency of ($n_{ax1}+1$), provided that $Ra^{x1}$ and $Wa^{x1}$ may together form a condensed ring structure; and $n_{ax1}$ represents an integer of 1 to 3.

13. The resist composition according to claim 9, wherein the polymeric compound (A1') further comprises a structural unit represented by general formula (a10-1) shown below:

(a10-1)

wherein $Ra^{x1}$ represents a polymerizable group-containing group; $Wa^{x1}$ represents an aromatic hydrocarbon group having a valency of ($n_{ax1}+1$), provided that $Ra^{x1}$ and $Wa_{x1}$ may together form a condensed ring structure; and $n_{ax1}$ represents an integer of 1 to 3.

14. The resist composition according to claim 10, wherein the polymeric compound (A1') further comprises a structural unit represented by general formula (a10-1) shown below:

(a10-1)

wherein $Ra^{x1}$ represents a polymerizable group-containing group; $Wa^{x1}$ represents an aromatic hydrocarbon group having a valency of ($n_{ax1}+1$), provided that $Ra^{x1}$ and $Wa^{x1}$ may together form a condensed ring structure; and $n_{ax1}$ represents an integer of 1 to 3.

15. The resist composition according to claim 11, wherein the polymeric compound (A1') further comprises a structural unit represented by general formula (a10-1) shown below:

(a10-1)

wherein $Ra^{x1}$ represents a polymerizable group-containing group; $Wa^{x1}$ represents an aromatic hydrocarbon group having a valency of ($n_{ax1}+1$), provided that $Ra^{x1}$ and $Wa_{x1}$ may together form a condensed ring structure; and $n_{ax1}$ represents an integer of 1 to 3.

16. A method of forming a resist pattern, comprising:
   forming a resist film with the resist composition according to claim 8;
   exposing the resist film; and
   alkali developing the exposed resist film to form a resist pattern.

* * * * *

UNITED STATES PATENT AND TRADEMARK OFFICE
CERTIFICATE OF CORRECTION

PATENT NO. : 10,606,174 B2
APPLICATION NO. : 15/877764
DATED : March 31, 2020
INVENTOR(S) : Masahito Yahagi, Hiroto Yamazaki and Kenta Suzuki It is certified that error appears in the above-identified patent and that said Letters Patent is hereby corrected as shown below:

In the Specification

In Column 3, Line 38, delete "M'$^{m-}$" and insert --M'$^{m+}$--.

In Column 6, Line 61, delete "a an" and insert --an--.

In Column 40, Line 52, delete "azobisisoutyrate" and insert --azobisisobutyrate--.

In Column 42, Lines 24-25, delete "tetracyclodpdecane," and insert --tetracyclododecane,--.

In Column 62, Line 36, delete "((M'$^{m-}$)$_{1/m}$)" and insert --((M'$^{m+}$)$_{1/m}$)--.

In Column 83, Line 6, delete "dihphenyliodonium" and insert --diphenyliodonium--.

In Column 88, Line 2, delete "(B-8)" and insert --(B1-8)--.

In Column 88, Line 16, delete "(B-9)" and insert --(B1-9)--.

In Column 88, Line 25, delete "(B-10)" and insert --(B1-10)--.

In Column 89, Line 4, delete "nitrobenzyl sulfonate" and insert --nitrobenzylsulfonate--.

In Column 94, Line 40, delete "H – SO$_3^{\ominus}$" and insert --H$_3$C – SO$_3^{\ominus}$--.

In Column 95, Line 34, delete "for" and insert --for R$^{101}$--.

In Column 111, Line 67, delete "(hereafter," and insert --hereafter,--.

Signed and Sealed this
Seventh Day of July, 2020

Andrei Iancu
*Director of the United States Patent and Trademark Office*

CERTIFICATE OF CORRECTION (continued)
U.S. Pat. No. 10,606,174 B2

In the Claims

In Column 163, Line 12, Claim 1, delete "M'$^{m+}$represents" and insert --M'$^{m+}$ represents--.

In Column 163, Line 45, Claim 2, delete "M$^{m+}$independently" and insert --M$^{m+}$ independently--.

In Column 163, Line 48, Claim 3, delete "M'$^{m+}$in" and insert --M'$^{m+}$ in--.

In Column 165, Lines 4-8, Claim 8, delete "$\left(CH_2-O-Ya^{x01}-Ra^{x01}\right)_{n_{ax0}}^{\substack{Ra^{x1}\\|\\Wa^{x1}\\|}}$"

and insert --$\left(CH_2-O-Ya^{x01}-Ra^{x01}\right)_{n_{ax0}}^{\substack{Ra^{x0}\\|\\Wa^{x0}\\|}}$--.

In Column 166, Line 20, Claim 13, delete "Wa$_{x1}$" and insert --Wa$^{x1}$--.

In Column 166, Line 54, Claim 15, delete "Wa$_{x1}$" and insert --Wa$^{x1}$--.